United States Patent
Sasaki et al.

(10) Patent No.: US 8,912,042 B2
(45) Date of Patent: Dec. 16, 2014

(54) MANUFACTURING METHOD FOR LAYERED CHIP PACKAGES

(71) Applicants: Yoshitaka Sasaki, Santa Clara, CA (US); Hiroyuki Ito, Milpitas, CA (US); Atsushi Iijima, Hong Kong (CN); Ryuji Fujii, Hong Kong (CN)

(72) Inventors: Yoshitaka Sasaki, Santa Clara, CA (US); Hiroyuki Ito, Milpitas, CA (US); Atsushi Iijima, Hong Kong (CN); Ryuji Fujii, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 267 days.

(21) Appl. No.: 13/621,540

(22) Filed: Sep. 17, 2012

(65) Prior Publication Data
US 2014/0080259 A1    Mar. 20, 2014

(51) Int. Cl.
*H01L 21/00* (2006.01)
*H01L 21/46* (2006.01)
*H01L 21/44* (2006.01)

(52) U.S. Cl.
USPC ........... 438/109; 438/113; 438/118; 438/458; 438/614

(58) Field of Classification Search
None
See application file for complete search history.

(56) References Cited

U.S. PATENT DOCUMENTS

| | | | |
|---|---|---|---|
| 5,953,588 A | 9/1999 | Camien et al. | |
| 7,127,807 B2 | 10/2006 | Yamaguchi et al. | |
| 7,902,677 B1 | 3/2011 | Sasaki et al. | |
| 8,203,215 B2 | 6/2012 | Sasaki et al. | |
| 8,298,862 B2 * | 10/2012 | Sasaki et al. | 438/109 |
| 2007/0035037 A1 | 2/2007 | Kim | |
| 2011/0189822 A1* | 8/2011 | Sasaki et al. | 438/113 |
| 2014/0015131 A1* | 1/2014 | Meyer et al. | 257/738 |
| 2014/0080259 A1* | 3/2014 | Sasaki et al. | 438/109 |

FOREIGN PATENT DOCUMENTS

JP    A-2004-281633    10/2004

OTHER PUBLICATIONS

U.S. Office Action in U.S. Appl. No. 13/422,723 mailed Sep. 13, 2013.
Gann, "Neo-Stacking Technology," *HDI Magazine*, Dec. 1999.
U.S. Appl. No. 13/422,723, filed Mar. 16, 2012 in the name of Sasaki et al.

* cited by examiner

*Primary Examiner* — Charles Garber
*Assistant Examiner* — Ron Pompey
(74) *Attorney, Agent, or Firm* — Oliff PLC

(57) ABSTRACT

In a manufacturing method for layered chip packages, a layered substructure with at least one additional package joined thereto is used to produce a plurality of layered chip packages. The layered substructure includes a plurality of main bodies to be separated from each other later. Each main body includes: a main part having top and bottom surfaces and including a plurality of layer portions stacked on each other; and a plurality of main terminals disposed on at least one of the top and bottom surfaces of the main part. The additional package includes an additional semiconductor chip and at least one additional terminal that is electrically connected to the additional semiconductor chip and in contact with at least one of the plurality of main terminals.

7 Claims, 39 Drawing Sheets

MANUFACTURING METHOD FOR LAYERED CHIP PACKAGES

BACKGROUND OF THE INVENTION

1. Field of the Invention

The present invention relates to a manufacturing method for layered chip packages each of which includes a plurality of stacked semiconductor chips.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

The yield of chips from a wafer that is to be cut later into a plurality of chips, i.e., the ratio of the number of conforming chips to the total number of chips in the wafer, is generally 90% to 99%. A layered chip package includes a plurality of chips. Therefore, the possibility that all the chips included in a layered chip package are conforming is lower than the yield of the chips. As the number of chips included in a layered chip package increases, the possibility that all the chips included in the layered chip package are conforming decreases.

A case will now be contemplated where a memory device such as a flash memory is constructed using a layered chip package. Generally, in a memory device such as a flash memory, a redundancy technique to replace a defective column of memory cells with a redundant column of memory cells is used so that the memory device can operate normally even when some memory cells are defective. Also in a memory device constructed using a layered chip package, if some of a plurality of memory cells included in a chip are defective, the redundancy technique can be used to allow the memory device to operate normally while allowing the use of the chip including the defective memory cells. Suppose, however, that a chip including a control circuit and a plurality of memory cells becomes defective due to, for example, a wiring failure in the control circuit, and even the redundancy technique cannot allow the chip to operate normally. In such a case, the defective chip is no longer usable. One possible solution to this case is to replace the defective chip with a conforming chip. However, this increases the manufacturing cost of the layered chip package.

U.S. Pat. No. 8,203,215 B2 discloses the technology to configure a main package by stacking a plurality of layer portions that include respective semiconductor chips and to disable defective semiconductor chips by intentionally omitting electrical connection of the defective semiconductor chips to wiring. Further, U.S. Pat. No. 8,203,215 B2 discloses the technology to construct a composite layered chip package by stacking together a main package and an additional portion where the main package includes a defective semiconductor chip. The additional portion includes a conforming semiconductor chip to substitute for the defective semiconductor chip.

This technology provides a composite layered chip package that is capable of providing, even if a defective semiconductor chip is included therein, the same functions as those for the case where no defective semiconductor chip is included. This technology, however, has room for improvement in terms of simplification of the manufacturing process and in terms of manufacturing cost.

OBJECT AND SUMMARY OF THE INVENTION

It is an object of the present invention to provide a manufacturing method for a plurality of layered chip packages that makes it possible to manufacture easily and at low cost a plurality of layered chip packages each of which includes a plurality of stacked semiconductor chips and is capable of providing, even if a defective semiconductor chip is included therein, the same functions as those for the case where no defective semiconductor chip is included.

The present invention is directed to a manufacturing method for a plurality of layered chip packages. Each of the plurality of layered chip packages manufactured by the manufacturing method of the present invention includes a main package. At least one of the plurality of layered chip packages is a composite layered chip package, the composite layered chip package further including an additional package stacked on the main package.

The main package includes a main body and wiring. The main body includes: a main part having a top surface and a bottom surface and including a plurality of layer portions stacked on each other; and a plurality of main terminals disposed on at least one of the top surface and the bottom surface of the main part. The wiring is electrically connected to the plurality of main terminals. Each of the plurality of layer portions includes a semiconductor chip.

The plurality of layer portions of the main part include at least one first-type layer portion. The main body of the main package in the composite layered chip package is a specific main body. In the specific main body, the plurality of layer portions of the main part further include at least one second-type layer portion. The semiconductor chip of the first-type layer portion is non-malfunctioning and electrically connected to the wiring. The semiconductor chip of the second-type layer portion is malfunctioning and not electrically connected to the wiring.

The additional package includes: an additional semiconductor chip to substitute for the semiconductor chip of the second-type layer portion; and a plurality of additional terminals. At least one of the plurality of additional terminals is electrically connected to the additional semiconductor chip and in contact with at least one of the plurality of main terminals.

The manufacturing method for the layered chip packages of the present invention includes the steps of fabricating a layered substructure by stacking a plurality of substructures each of which includes a plurality of preliminary layer portions that are arrayed, each of the plurality of preliminary layer portions being intended to become any one of the layer portions included in the main part, the plurality of substructures being intended to be cut later at positions of boundaries between every adjacent ones of the preliminary layer portions; joining at least one additional package to the layered substructure; and producing the plurality of layered chip packages from the layered substructure with the at least one additional package joined thereto.

The layered substructure includes a plurality of main bodies that are to be separated from each other later. At least one of the plurality of main bodies included in the layered substructure is the specific main body. In the step of joining at least one additional package to the layered substructure, the at least one additional package is joined to the at least one specific main body included in the layered substructure. The step of producing the plurality of layered chip packages includes the step of separating the plurality of main bodies from each other by cutting the layered substructure with the at least one additional package joined thereto.

In the manufacturing method for the layered chip packages of the present invention, the step of fabricating the layered substructure may include the step of identifying the position of the at least one specific main body included in the layered substructure. In this case, the step of fabricating the layered substructure may include, as a series of steps for fabricating each of the substructures, the steps of: fabricating a pre-substructure wafer that is to become the substructure, the pre-substructure wafer including a plurality of pre-semiconductor-chip portions that are arrayed, the plurality of pre-semiconductor-chip portions being intended to become individual semiconductor chips; and distinguishing the plurality of pre-semiconductor-chip portions included in the pre-substructure wafer into non-malfunctioning pre-semiconductor-chip portions and malfunctioning pre-semiconductor-chip portions. In the step of identifying, the position of the at least one specific main body may be identified by using distinction results obtained in the step of distinguishing.

Each of the plurality of layer portions may further include electrodes electrically connected to the wiring. The step of fabricating the layered substructure may further include, as the series of steps for fabricating each of the substructures, the step of forming the electrodes so that the electrodes are in contact with and electrically connected to the non-malfunctioning pre-semiconductor-chip portions and are not in contact with the malfunctioning pre-semiconductor-chip portions, by using the distinction results obtained in the step of distinguishing.

In the step of identifying, the position of the at least one second-type layer portion in the specific main body may be identified by using the distinction results obtained in the step of distinguishing. In this case, the plurality of main terminals may include a plurality of first terminals associated with semiconductor chips of different layer portions. The additional package may be positionable in any of a plurality of positional relationships with the specific main body. The at least one of the plurality of additional terminals may include at least one second terminal electrically connected to the additional semiconductor chip. The plurality of first terminals and the at least one second terminal may be shaped and positioned such that at least one pair of first and second terminals in which the first and second terminals are in contact with each other is formed in each of the plurality of positional relationships. In this case, a combination of the first and second terminals making up the at least one pair of first and second terminals is different among the plurality of positional relationships. The additional package may be positioned in one of the plurality of positional relationships that is selected in accordance with which position in the specific main body the semiconductor chip of the second-type layer portion to be substituted with the additional semiconductor chip is located at.

In the manufacturing method for the layered chip packages of the present invention, the main body may have a top surface, a bottom surface, and four side surfaces. The wiring may include a plurality of conductive paths disposed on at least one of the side surfaces of the main body. In this case, the step of producing the plurality of layered chip packages may include the step of forming the wiring on each of the plurality of main bodies.

According to the manufacturing method for the layered chip packages of the present invention, the layered substructure with at least one additional package joined thereto is used to produce a plurality of layered chip packages. The present invention thus makes it possible to manufacture layered chip packages easily and at low cost, each of the layered chip packages including a plurality of stacked semiconductor chips and being capable of providing, even if a defective semiconductor chip is included therein, the same functions as those for the case where no defective semiconductor chip is included.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. A manufacturing method according to a first embodiment of the invention is a method for manufacturing a plurality of layered chip packages. Each of the plurality of layered chip packages manufactured by the manufacturing method according to the present embodiment includes a main package. At least one of the plurality of layered chip packages is a composite layered chip package which further includes an additional package stacked on the main package.

Figure 1:
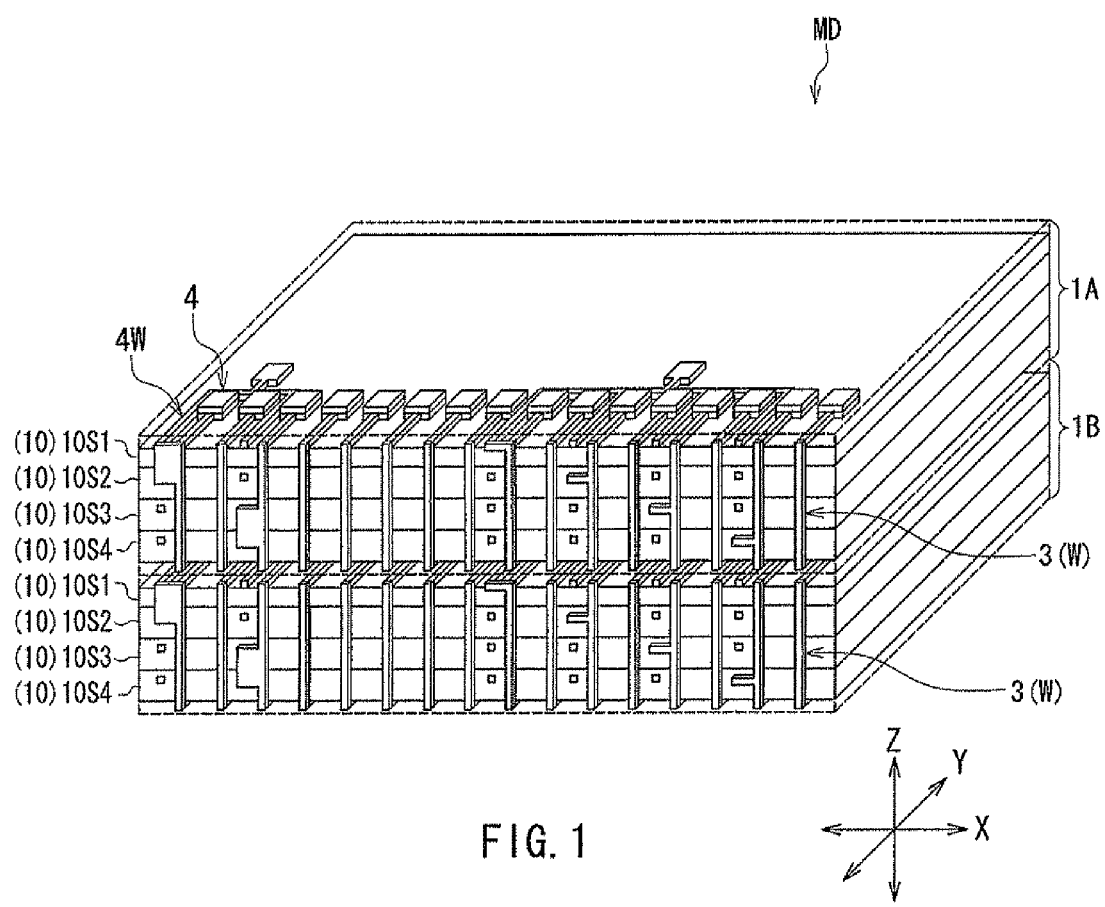
FIG. 1 is a perspective view of a module including two main packages of a first embodiment of the invention.
Figure 2:
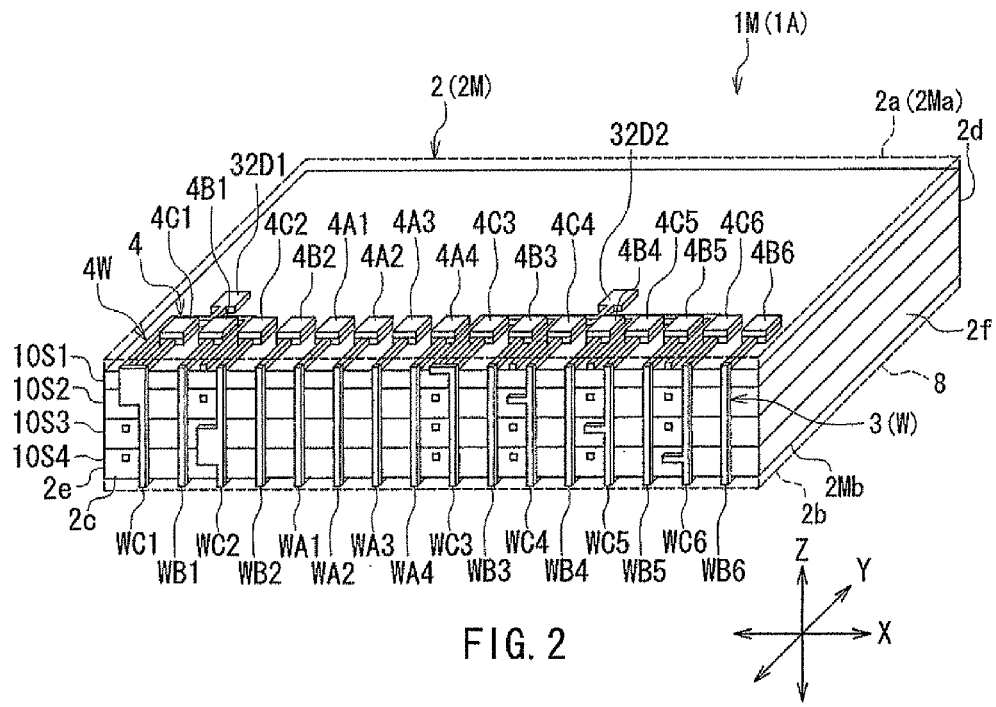
FIG. 2 is a perspective view of a main package of the first embodiment of the invention.
Figure 3:
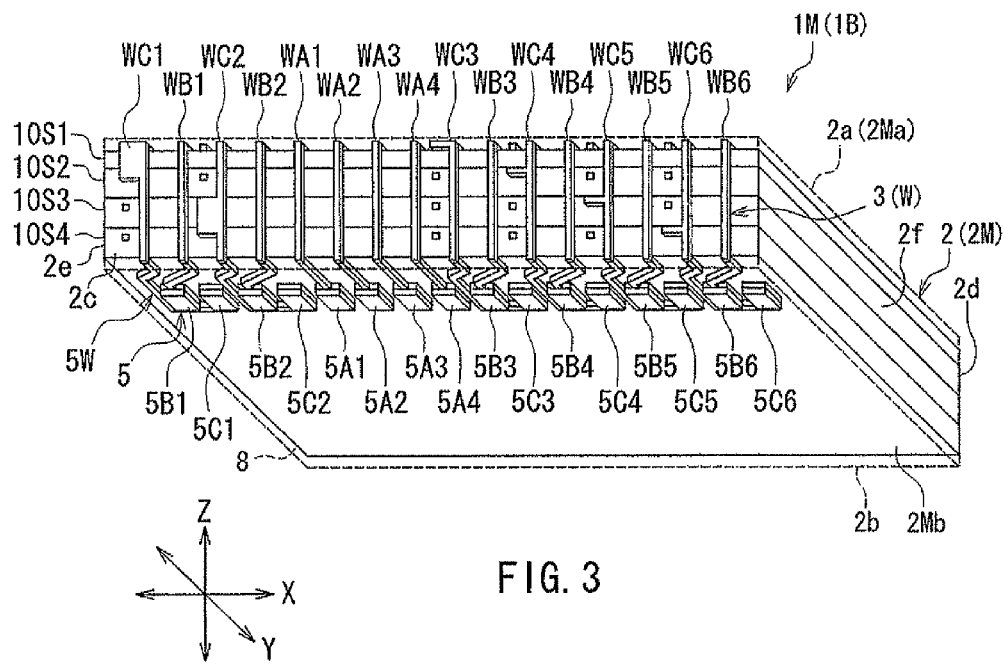
FIG. 3 is a perspective view showing the main package of FIG. 2 as viewed from below.
Figure 4:
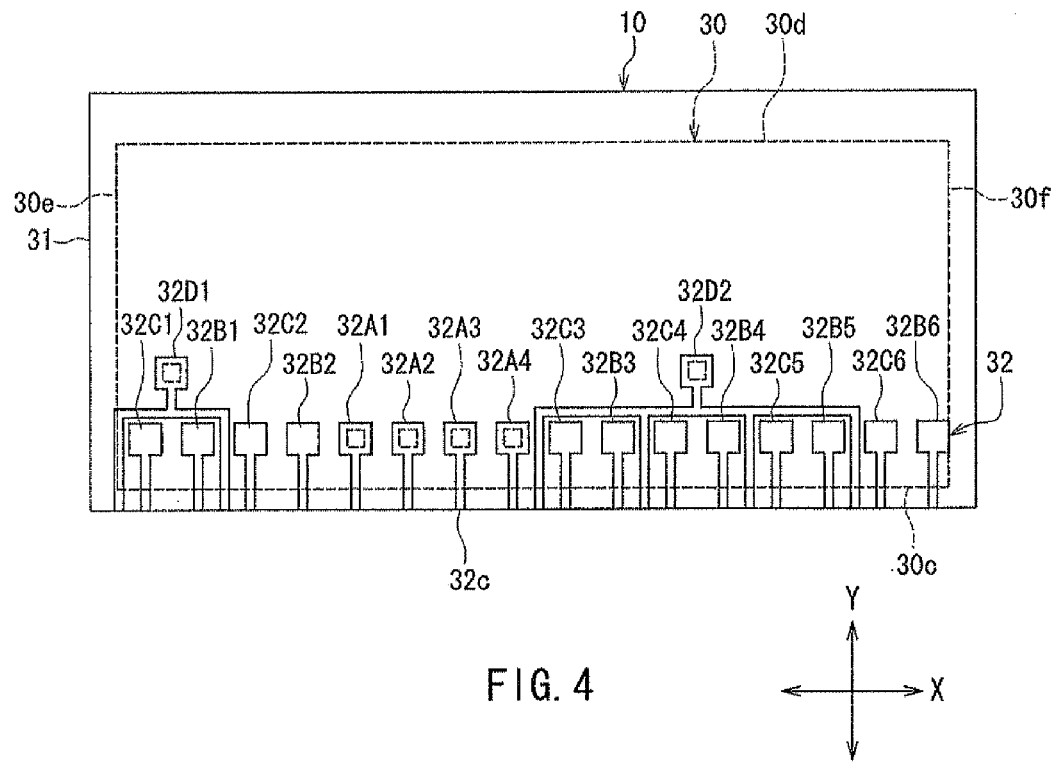
FIG. 4 is a plan view showing a layer portion included in the main package of FIG. 2.
Figure 5:
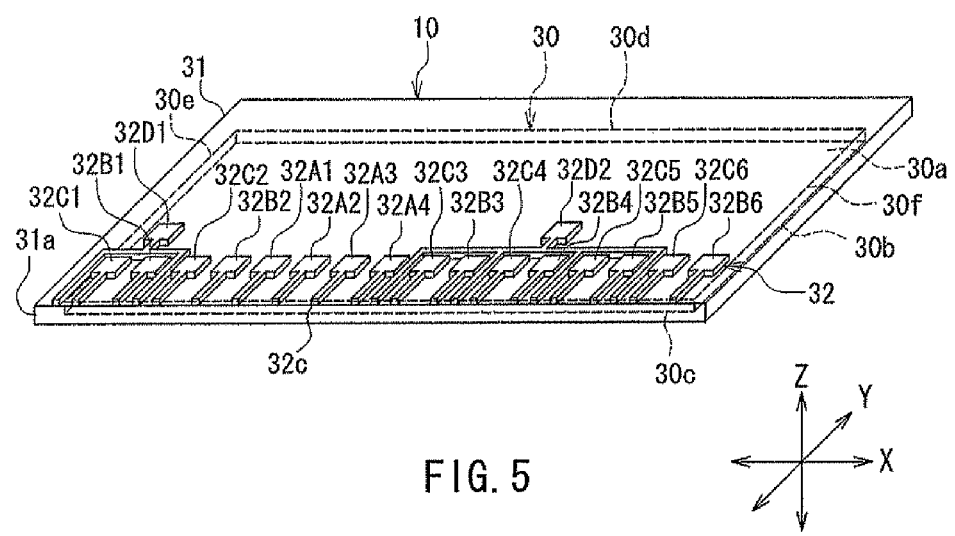
FIG. 5 is a perspective view of the layer portion shown in FIG. 4.
Figure 6:
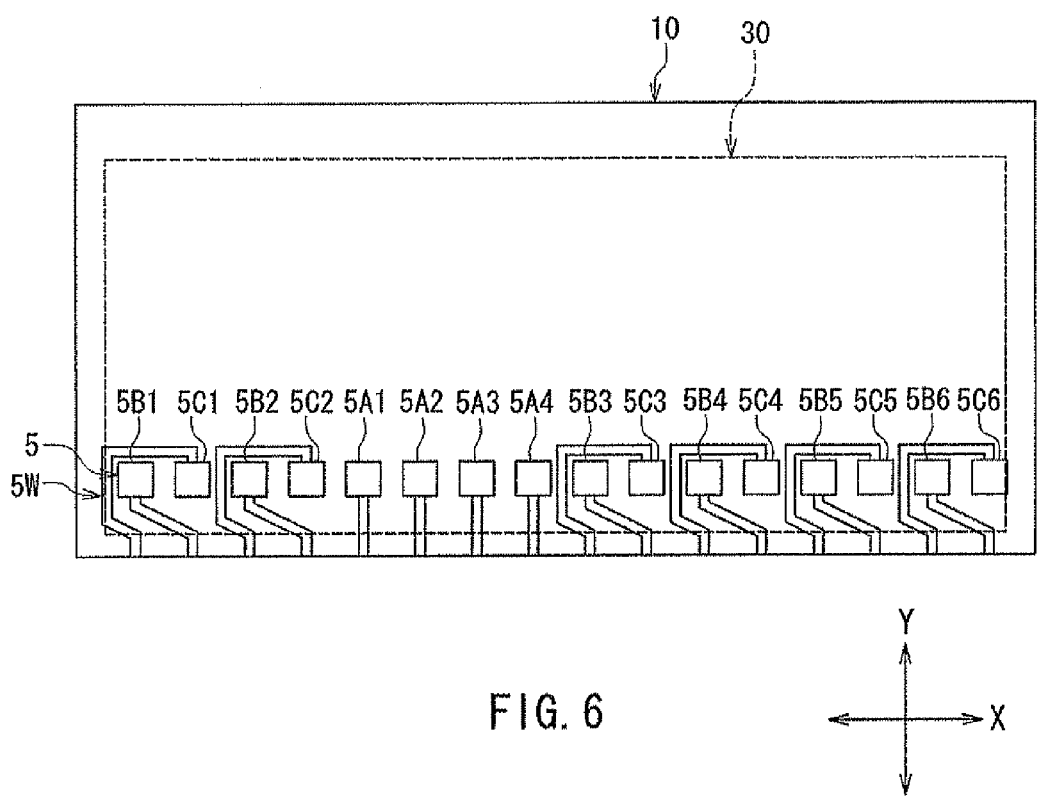
FIG. 6 is a plan view showing a plurality of bottom terminals and bottom wiring of the main package of FIG. 2 as viewed from above.

First, reference is made to FIG. 1 to FIG. 6 to describe the configuration of the main package of the present embodiment. FIG. 1 is a perspective view of a module including two main packages of the present embodiment. FIG. 2 is a perspective view of a main package of the present embodiment. FIG. 3 is a perspective view showing the main package of FIG. 2 as viewed from below. FIG. 4 is a plan view showing a layer portion included in the main package of FIG. 2. FIG. 5 is a perspective view of the layer portion shown in FIG. 4. FIG. 6 is a plan view showing a plurality of bottom terminals and bottom wiring of the main package of FIG. 2 as viewed from above.

The module MD shown in FIG. 1 includes two main packages 1A and 1B that are stacked and electrically connected to each other. The main package 1A is placed on top of the main package 1B. In the following description, either main package will be represented by reference symbol 1M.

As shown in FIG. 2 and FIG. 3, the main package 1M includes a main body 2 having a top surface 2a, a bottom surface 2b, and four side surfaces 2c, 2d, 2e and 2f. The main body 2 has a rectangular periphery as viewed in a direction perpendicular to the top surface 2a (the Z direction). The side surfaces 2c and 2d are mutually opposite to each other. The side surfaces 2e and 2f are mutually opposite to each other. The main package 1M further includes wiring 3 including a plurality of conductive paths W disposed on at least one of the four side surfaces of the main body 2. The conductive paths W are formed of conductive layers. In the example shown in FIG. 2 and FIG. 3, the plurality of conductive paths W are disposed only on the side surface 2c. The main body 2 includes a main part 2M. The main part 2M has a top surface 2Ma and a bottom surface 2Mb and includes a plurality of layer portions 10 stacked on each other. The plurality of conductive paths W pass through all the plurality of layer portions 10.

The main body 2 further includes a plurality of top terminals 4 disposed on the top surface 2Ma of the main part 2M and a plurality of bottom terminals 5 disposed on the bottom surface 2Mb of the main part 2M. The wiring 3 (the plurality conductive paths W) is electrically connected to the plurality of top terminals 4 and the plurality of bottom terminals 5. The plurality of top terminals 4 and the plurality of bottom terminals 5 correspond to the plurality of main terminals of the present invention.

The main body 2 further includes top wiring 4W, bottom wiring 5W, and an insulating layer 8. The top wiring 4W is disposed on the top surface 2Ma of the main part 2M and electrically connects the plurality of top terminals 4 to the plurality of conductive paths W. The bottom wiring 5W is disposed on the bottom surface 2Mb of the main part 2M and electrically connects the plurality of bottom terminals 5 to the plurality of conductive paths W. The insulating layer 8 is disposed around the plurality of bottom terminals 5 on the bottom surface 2Mb of the main part 2M and covers the bottom wiring 5W. In FIG. 2 and FIG. 3, the insulating layer 8 is shown by broken lines.

Here, as shown in FIG. 1 to FIG. 4, X, Y, and Z directions will be defined as follows. The X direction is parallel to the top surface 2a and the side surfaces 2c and 2d of the main body 2. The Y direction is parallel to the top surface 2a and the side surfaces 2e and 2f of the main body 2. The Z direction is perpendicular to the top surface 2a of the main body 2. The X, Y, and Z directions are orthogonal to each other.

The plurality of bottom terminals 5 are positioned to overlap the plurality of top terminals 4 as viewed in the direction perpendicular to the top surface 2a of the main body 2 (the Z direction). Accordingly, when two main packages 1M are vertically arranged, the plurality of bottom terminals 5 of the upper main package 1M are opposed to the plurality of top terminals 4 of the lower main package 1M. In the present embodiment, when two main packages 1M are stacked on each other, the plurality of bottom terminals 5 of the upper main package 1M are joined to and electrically connected to the plurality of top terminals 4 of the lower main package 1M.

At least either the terminals 4 or the terminals 5 may each include a solder layer made of a solder material, the solder layer being exposed in the surface of each of the terminals 4 or each of the terminals 5. In such a case, the solder layers are heated to melt and then solidified, whereby the plurality of bottom terminals 5 of the upper one of two vertically adjacent main packages 1M are joined to and electrically connected to the plurality of top terminals 4 of the lower one.

The plurality of layer portions 10 are stacked between the top surface 2Ma and the bottom surface 2Mb of the main part 2M. Every two vertically adjacent layer portions 10 are joined to each other with an adhesive, for example. As one example, FIG. 2 and FIG. 3 show a case where the main part 2M includes four layer portions 10. However, the number of the layer portions 10 to be included in the main part 2M is not limited to four, and may be any plural number. Hereinafter, the four layer portions 10 included in the main package 1M shown in FIG. 2 and FIG. 3 will be referred to as a first layer portion 10S1, a second layer portion 10S2, a third layer portion 10S3, and a fourth layer portion 10S4 in the order from top to bottom.

A description will now be given of the layer portions 10 with reference to FIG. 4 and FIG. 5. Each of the layer portions 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other. The side surfaces 30c, 30d, 30e, and 30f face toward the side surfaces 2e, 2d, 2e, and 2f of the main body 2, respectively.

Each of the layer portions 10 further includes an insulating portion 31 and a plurality of electrodes 32. The insulating portion 31 covers at least one of the four side surfaces of the semiconductor chip 30. The plurality of electrodes 32 are electrically connected to the wiring 3, i.e., the plurality of conductive paths W. The insulating portion 31 has at least one end face 31a that is located in the at least one of the side surfaces of the main body 2 on which the plurality of conductive paths W are disposed. In the example shown in FIG. 4 and FIG. 5, the insulating portion 31 covers all of the four side surfaces of the semiconductor chip 30, and has four end faces 31a located in the four side surfaces of the main body 2. The electrodes 32 have their respective end faces 32c that are located in the at least one of the side surfaces of the main body 2 on which the plurality of conductive paths W are disposed. The conductive paths W are electrically connected to the end faces 32c.

In at least one of the plurality of layer portions 10 in a single main package 1M, the semiconductor chip 30 is electrically connected to two or more of the plurality of conductive paths W via two or more of the plurality of electrodes 32.

A detailed description will now be given of the plurality of terminals 4 and 5, the plurality of conductive paths W, and the plurality of electrodes 32 of the present embodiment. In the present embodiment, the plurality of bottom terminals 5 are electrically connected to corresponding ones of the plurality of top terminals 4 via the conductive paths W to constitute a plurality of pairs of top and bottom terminals 4 and 5. The top terminal 4 and the bottom terminal 5 in each of the plurality of pairs are electrically connected to each other. The plurality of pairs include a plurality of non-overlapping terminal pairs. Each of the non-overlapping terminal pairs consists of any one of the top terminals 4 and any one of the bottom terminals 5, the top and bottom terminals 4 and 5 in each of the non-overlapping terminal pairs being electrically connected to each other and being positioned not to overlap each other as viewed in the direction perpendicular to the top surface 2a of the main body 2 (the Z direction). The plurality of pairs further include a plurality of overlapping terminal pairs. Each of the overlapping terminal pairs consists of any one of the top terminals 4 and any one of the bottom terminals 5, the top and bottom terminals 4 and 5 in each of the overlapping terminal pairs being electrically connected to each other and being positioned to overlap each other as viewed in the direction perpendicular to the top surface 2a of the main body 2 (the Z direction).

In the example shown in FIG. 2 and FIG. 3, the plurality of top terminals 4 include first-type terminals 4A1, 4A2, 4A3, and 4A4, second-type terminals 4B1, 4B2, 4B3, 4B4, 4B5, and 4B6, and third-type terminals 4C1, 4C2, 4C3, 4C4, 4C5, and 4C6. Similarly, the plurality of bottom terminals 5 include first-type terminals 5A1, 5A2, 5A3, and 5A4, second-type terminals 5B1, 5B2, 5B3, 5B4, 5B5, and 5B6, and third-type terminals 5C1, 5C2, 5C3, 5C4, 5C5, and 5C6. The terminals 5A1 to 5A4 are paired with the terminals 4A1 to 4A4, respectively. The terminals 5B1 to 5B6 are paired with the terminals 4B1 to 4B6, respectively. The terminals 5C1 to 5C6 are paired with the terminals 4C1 to 4C6, respectively.

In each of the pairs of terminals (4A1, 5A1), (4A2, 5A2), (4A3, 5A3), and (4A4, 5A4), the top terminal 4 and the bottom terminal 5 are electrically connected to each other, and are positioned to overlap each other as viewed in the direction perpendicular to the top surface 2a of the main body 2 (the Z direction). These pairs are thus the overlapping terminal pairs.

In each of the pairs of terminals (4B1, 5B1), (4B2, 5B2), (4B3, 5B3), (4B4, 5B4), (4B5, 5B5), (4B6, 5B6), (4C1, 5C1), (4C2, 5C2), (4C3, 5C3), (4C4, 5C4), (4C5, 5C5), and (4C6, 5C6), the top terminal 4 and the bottom terminal 5 are electrically connected to each other, and are positioned not to overlap each other as viewed in the direction perpendicular to the top surface 2a of the main body 2 (the Z direction). These pairs are thus the non-overlapping terminal pairs.

The terminals 5B1, 5B2, 5B3, 5B4, 5B5, 5B6, 5C1, 5C2, 5C3, 5C4, 5C5, and 5C6 are positioned to overlap the terminals 4C1, 4C2, 4C3, 4C4, 4C5, 4C6, 4B1, 4B2, 4B3, 4B4, 4B5, and 4B6, respectively, as viewed in the direction perpendicular to the top surface 2a of the main body 2 (the Z direction).

The plurality of conductive paths W include first-type conductive paths WA1, WA2, WA3, and WA4, second-type conductive paths WB1, WB2, WB3, WB4, WB5, and WB6, and third-type conductive paths WC1, WC2, WC3, WC4, WC5, and WC6. The first-type conductive paths WA1, WA2, WA3, and WA4 electrically connect the top terminal 4 and the bottom terminal 5 in the overlapping terminal pairs (4A1, 5A1), (4A2, 5A2), (4A3, 5A3), and (4A4, 5A4), respectively. The plurality of first-type conductive paths WA1 to WA4 are used for a purpose common to all the layer portions 10 in the main part 2M.

The second-type conductive paths WB1, WB2, WB3, WB4, WB5, and WB6 electrically connect the top terminal 4 and the bottom terminal 5 in the non-overlapping terminal pairs (4B1, 5B1), (4B2, 5B2), (4B3, 5B3), (4B4, 5B4), (4B5, 5B5), and (4B6, 5B6), respectively. The second-type conductive paths WB1 to WB6 are electrically connected to none of the semiconductor chips 30 included in the plurality of layer portions 10 in the main part 2M. The second-type conductive paths WB1 to WB6 will also be referred to as bypass conductive paths.

The third-type conductive paths WC1, WC2, WC3, WC4, WC5, and WC6 electrically connect the top terminal 4 and the bottom terminal 5 in the non-overlapping terminal pairs (4C1, 5C1), (4C2, 5C2), (4C3, 5C3), (4C4, 5C4), (4C5, 5C5), and (4C6, 5C6), respectively. The third-type conductive paths WC1 to WC6 are used for electrical connection to the semiconductor chip 30 of at least one of the plurality of layer portions 10 in the main part 2M.

On the top surface 2Ma of the main part 2M, as shown in FIG. 2, the terminals 4A1 to 4A4, 4B1 to 4B6, and 4C1 to 4C6 are electrically connected to their respective closest conductive paths WA1 to WA4, WB1 to WB6, and WC1 to WC6. On the bottom surface 2Mb of the main part 2M, as shown in FIG. 3, the terminals 5A1 to 5A4 are electrically connected to their respective closest conductive paths WA1 to WA4. Meanwhile, the terminals 5B1 to 5B6 and 5C1 to 5C6 are respectively electrically connected to the conductive paths WB1 to WB6 and WC1 to WC6 which are adjacent to their respective closest conductive paths.

As shown in FIG. 4 and FIG. 5, the plurality of electrodes 32 include the following first- to fourth-type electrodes. The first-type electrodes 32A1, 32A2, 32A3, and 32A4 are located at positions corresponding to those of the terminals 4A1, 4A2, 4A3, and 4A4, respectively, as viewed in the direction perpendicular to the top surface 2a of the main body 2 (the Z direction). The first-type electrodes 32A1, 32A2, 32A3, and 32A4 are electrically connected to the first-type conductive paths WA1, WA2, WA3, and WA4, respectively. In at least one of the plurality of layer portions 10 in the main part 2M, the first-type electrodes 32A1 to 32A4 are in contact with and electrically connected to the semiconductor chip 30. In FIG. 4, the dashed squares in the electrodes 32A1 to 32A4 represent the areas where the electrodes 32A1 to 32A4 make contact with the semiconductor chip 30.

The second-type electrodes 32B1, 32B2, 32B3, 32B4, 32B5, and 32B6 are located at positions corresponding to those of the terminals 4B1, 4B2, 4B3, 4B4, 4B5, and 4B6, respectively, as viewed in the direction perpendicular to the top surface 2a of the main body 2 (the Z direction). The second-type electrodes 32B1, 32B2, 32B3, 32B4, 32B5, and 32B6 are electrically connected to the second-type conductive paths WB1, WB2, WB3, WB4, WB5, and WB6, respectively.

The third-type electrodes 32C1, 32C2, 32C3, 32C4, 32C5, and 32C6 are located at positions corresponding to those of the terminals 4C1, 4C2, 4C3, 4C4, 4C5, and 4C6, respectively, as viewed in the direction perpendicular to the top surface 2a of the main body 2 (the Z direction). The third-type electrodes 32C1, 32C2, 32C3, 32C4, 32C5, and 32C6 are electrically connected to the third-type conductive paths WC1, WC2, WC3, WC4, WC5, and WC6, respectively. None of the second-type and third-type electrodes 32B1 to 32B6 and 32C1 to 32C6 are in contact with the semiconductor chip 30.

The fourth-type electrodes 32D1 and 32D2 are electrodes with which different signals are associated from one layer portion 10 to another. The fourth-type electrode 32D1 has two branched parts. The two branched parts have two end faces located in the side surface 2c of the main body 2. The two end faces are located near the end faces of the two electrodes 32C1 and 32C2, respectively. The fourth-type electrode 32D2 has four branched parts. The four branched parts have four end faces located in the side surface 2c of the main body 2. The four end faces are located near the end faces of the four electrodes 32C3, 32C4, 32C5, and 32C6, respectively. In at least one of the plurality of layer portions 10 in the main part 2M, the fourth-type electrodes 32D1 and 32D2 are in contact with and electrically connected to the semiconductor chip 30. In FIG. 4, the dashed squares in the electrodes 32D1 and 32D2 represent the areas where the electrodes 32D1 and 32D2 make contact with the semiconductor chip 30.

The electrodes 32A1 to 32A4, 32D1, and 32D2 among the plurality of electrodes 32 are used for electrical connection to the semiconductor chip 30. None of the other electrodes 32B1 to 32B6 and 32C1 to 32C6 are used for electrical connection to the semiconductor chip 30.

In the layer portions 10S1 and 10S2, the conductive path WC1 is broadened in part, so that the conductive path WC1 makes contact with the end face of one of the branched parts of the electrode 32D1. The electrode 32D1 of each of the layer portions 10S1 and 10S2 is thereby electrically connected to the conductive path WC1. In the layer portion 10S1, the conductive path WC3 is broadened in part, so that the conductive path WC3 makes contact with the end face of one of the branched parts of the electrode 32D2. The electrode 32D2 of the layer portion 10S1 is thereby electrically connected to the conductive path WC3. In the layer portion 10S2, the conductive path WC4 is broadened in part, so that the conductive path WC4 makes contact with the end face of one of the branched parts of the electrode 32D2. The electrode 32D2 of the layer portion 10S2 is thereby electrically connected to the conductive path WC4.

In the layer portions 10S3 and 10S4, the conductive path WC2 is broadened in part, so that the conductive path WC2 makes contact with the end face of one of the branched parts of the electrode 32D1. The electrode 32D1 of each of the layer portions 10S3 and 10S4 is thereby electrically connected to the conductive path WC2. In the layer portion 10S3, the conductive path WC5 is broadened in part, so that the conductive path WC5 makes contact with the end face of one of the branched parts of the electrode 32D2. The electrode 32D2 of the layer portion 10S3 is thereby electrically connected to the conductive path WC5. In the layer portion 10S4, the conductive path WOG is broadened in part, so that the conductive path WC6 makes contact with the end face of one of the branched parts of the electrode 32D2. The electrode 32D2 of the layer portion 10S4 is thereby electrically connected to the conductive path WC6.

In each of the layer portions 10 except the uppermost layer portion 10 in the main part 2M, the insulating portion 31 also covers the first surface 30a of the semiconductor chip 30 and the plurality of electrodes 32. In the uppermost layer portion 10 in the main part 2M, the insulating portion 31 does not cover parts of the plurality of electrodes 32 except the electrodes 32D1 and 32D2, but covers the first surface 30a of the semiconductor chip 30 and the remaining parts of the electrodes 32. The parts of the electrodes 32 not covered by the insulating portion 31 constitute conductor pads. Conductor layers are formed on the conductor pads. The conductor pads and conductor layers constitute the top terminals 4. In the present embodiment, the plurality of top terminals 4 are thus formed by using the plurality of electrodes 32, except the electrodes 32D1 and 32D2, of the uppermost layer portion 10 of the main part 2M. The parts of the plurality of electrodes 32 of the uppermost layer portion 10 of the main part 2M covered by the insulating portion 31 constitute the top wiring 4W. In FIG. 1 to FIG. 3, part of the insulating portion 31 of the uppermost layer portion 10 is shown by broken lines.

The plurality of layer portions 10 in the main package 1M include at least one first-type layer portion. The plurality of layer portions 10 in the main package 1M may further include at least one second-type layer portion. The semiconductor chip 30 of the first-type layer portion is non-malfunctioning, whereas the semiconductor chip 30 of the second-type layer portion is malfunctioning. Hereinafter, a non-malfunctioning semiconductor chip 30 will be referred to as a conforming semiconductor chip 30, and a malfunctioning semiconductor chip 30 will be referred to as a defective semiconductor chip 30. Hereinafter, the first-type layer portion will be designated by reference symbol 10A and the second-type layer portion will be designated by reference symbol 10B when the first-type layer portion and the second-type layer portion are to be distinguished from each other.

In the first-type layer portion 10A, the semiconductor chip 30 is electrically connected to the wiring 3. In the second-type layer portion 10B, the semiconductor chip 30 is not electrically connected to the wiring 3. More specifically, in the first-type layer portion 10A, the electrodes 32A1 to 32A4, 32D1, and 32D2 are in contact with and electrically connected to the semiconductor chip 30. Consequently, in the first-type layer portion 10A, the semiconductor chip 30 is electrically connected to the conductive paths WA1 to WA4, either one of the conductive paths WC1 and WC2, and any one of the conductive paths WC3 to WC6. In the second-type layer portion 10B, none of the electrodes 32A1 to 32A4, 32D1, and 32D2 are in contact with the semiconductor chip 30. Consequently, in the second-type layer portion 10B, the semiconductor chip 30 is electrically connected to none of the conductive paths W.

Where the main package 1M includes no second-type layer portion 10B, the main package 1M constitutes a layered chip package. Where the main package 1M includes at least one second-type layer portion 10B, at least one additional package to be described later is added to the main package 1M to construct a composite layered chip package 1. Hereinafter, the main body 2 of the main package 1M in the composite layered chip package 1 will be referred to as a specific main body, and designated by reference symbol 2S. In the specific main body 2S, the plurality of layer portions 10 of the main part 2M include at least one first-type layer portion 10A and at least one second-type layer portion 10B.

The semiconductor chip 30 may be a memory chip that constitutes a memory such as a flash memory, DRAM, SRAM, MRAM, PROM, or FeRAM. Here, the semiconductor chip 30 includes a plurality of memory cells. In such a case, it is possible to provide a memory device of large capacity by using the module MD which includes a plurality of semiconductor chips 30. The number of the semiconductor chips 30 to be included in the module MD can be changed to easily provide a memory device of various capacities such as 64 GB (gigabytes), 128 GB, and 256 GB.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be ones used for implementing other devices such as CPUs, sensors, and driving circuits for sensors.

The main package 1M includes a plurality of pairs of top and bottom terminals 4 and 5 in each of which the top terminal 4 and the bottom terminal 5 are electrically connected to each other by the respective conductive paths W. The plurality of pairs include the plurality of non-overlapping terminal pairs. Consequently, according to the present embodiment, when a plurality of main packages 1M having the same configuration are stacked on each other and electrically connected to each other, some of a plurality of signals associated with the semiconductor chips 30 that fall on the same layers in the respective plurality of main packages 1M can be easily made different from one main package 1M to another. Thus, according to the present embodiment, while a plurality of main packages 1M having the same configuration are stacked on each other, the plurality of main packages 1M are allowed to have functions different from each other.

Figure 19:
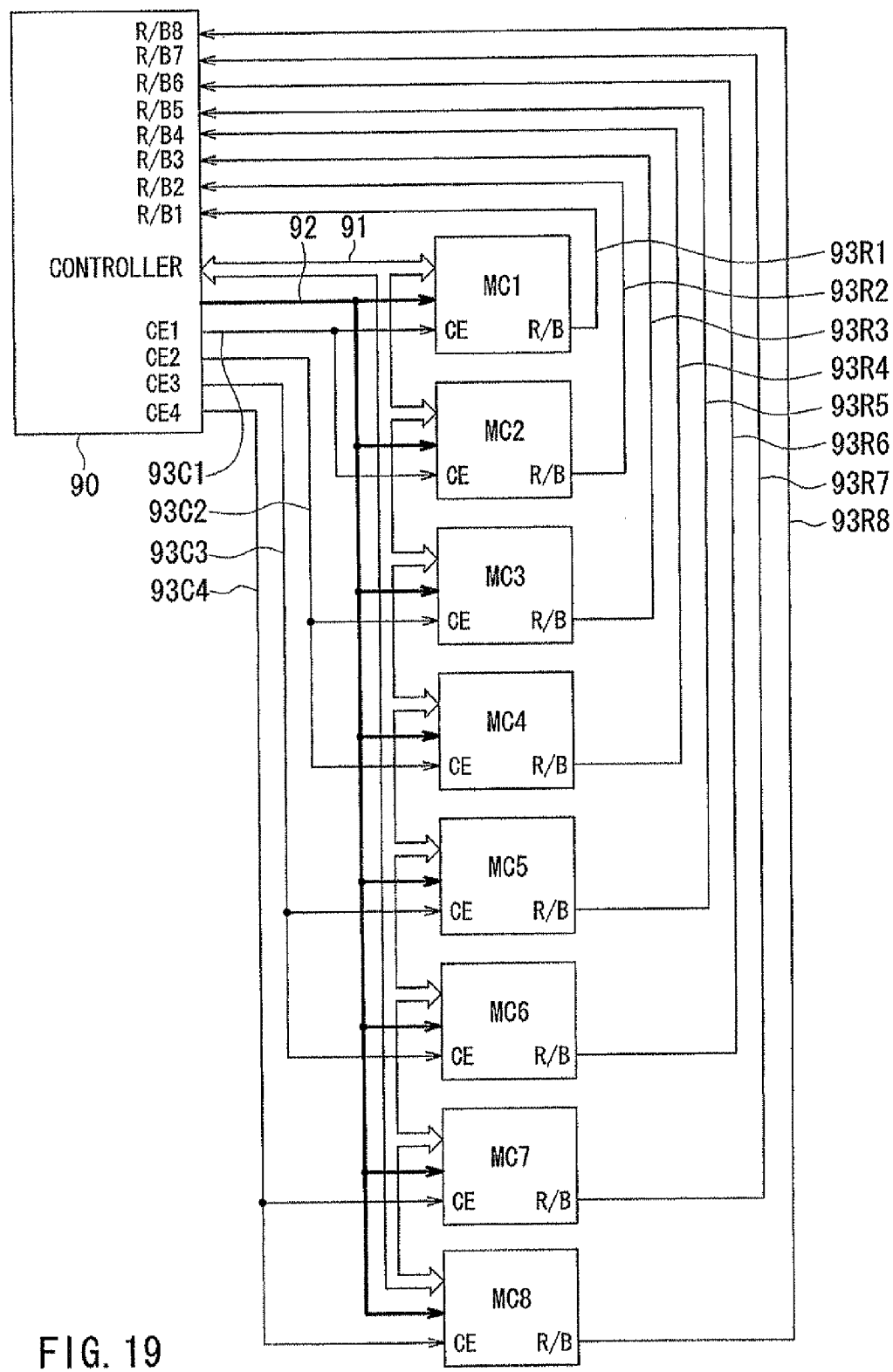
FIG. 19 is a block diagram showing the configuration of a memory device that uses the module of the first embodiment of the invention.

The main package 1M and the module MD will now be described in more detail with reference to a case where the module MD shown in FIG. 1 is used to construct a memory device. FIG. 19 is a block diagram showing the configuration of the memory device that uses the module MD. The memory device includes eight memory chips MC1, MC2, MC3, MC4, MC5, MC6, MC7, and MC8, and a controller 90 which controls these memory chips.

The memory chips MC1, MC2, MC3, MC4, MC5, MC6, MC7, and MC8 are the respective semiconductor chips 30 in the layer portions 10S1, 10S2, 10S3, and 10S4 of the main package 1A and the layer portions 10S1, 10S2, 10S3, and 10S4 of the main package 1B, which are shown in FIG. 1. Each of the memory chips includes a plurality of memory cells and a peripheral circuit such as an address decoder. The controller 90 is provided independent of the module MD, and is electrically connected to the plurality of top terminals 4 of the main package 1A or the plurality of bottom terminals 5 of the main package 1B.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad R/B for outputting a ready/busy signal. The chip enable signal is a signal for controlling whether to select or deselect the memory chip. The ready/busy signal is a signal for indicating the operating state of the memory chip.

The memory device shown in FIG. 19 further includes signal lines 93C1, 93C2, 93C3, and 93C4. The signal line 93C1 electrically connects the controller 90 to the electrode pads CE of the memory chips MC1 and MC2, and transmits a chip enable signal CE1. The signal line 93C2 electrically connects the controller 90 to the electrode pads CE of the memory chips MC3 and MC4, and transmits a chip enable signal CE2. The signal line 93C3 electrically connects the controller 90 to the electrode pads CE of the memory chips MC5 and MC6, and transmits a chip enable signal CE3. The signal line 93C4 electrically connects the controller 90 to the electrode pads CE of the memory chips MC7 and MC8, and transmits a chip enable signal CE4. Thus, in the example shown in FIG. 19, the signal line 93C1 is used by the memory chips MC1 and MC2 in common, the signal line 93C2 is used by the memory chips MC3 and MC4 in common, the signal line 93C3 is used by the memory chips MC5 and MC6 in common, and the signal line 93C4 is used by the memory chips MC7 and MC8 in common. Nevertheless, eight signal lines for transmitting respective different chip enable signals to the memory chips may be provided in place of the signal lines 93C1, 93C2, 93C3, and 93C4.

The memory device shown in FIG. 19 further includes signal lines 93R1, 93R2, 93R3, 93R4, 93R5, 93R6, 93R7, and 93R8. One end of each of the signal lines 93R1 to 93R8 is electrically connected to the controller 90. The other ends of the signal lines 93R1 to 93R8 are electrically connected to the electrode pads R/B of the memory chips MC1 to MC8, respectively. The signal lines 93R1 to 93R8 transmit ready/busy signals R/B1 to R/B8, respectively.

The relationship of the plurality of conductive paths W in the main packages 1A and 1B with the plurality of signal lines shown in FIG. 19 will now be described, assuming that the main package 1M shown in FIG. 2 is the upper main package 1A of FIG. 1 and the main package 1M shown in FIG. 3 is the lower main package 1B of FIG. 1.

The terminals 4A1 to 4A4 of the main package 1A are electrically connected to the terminals 5A1 to 5A4 of the main package 1A via the conductive paths WA1 to WA4 of the main package 1A. The terminals 5A1 to 5A4 of the main package 1A are electrically connected to the terminals 4A1 to 4A4 of the main package 1B. The terminals 4A1 to 4A4 of the main package 1B are electrically connected to the terminals 5A1 to 5A4 of the main package 1B via the conductive paths WA1 to WA4 of the main package 1B. As a result, there are formed a plurality of electrical paths from the terminals 4A1-4A4 of the main package 1A to the terminals 5A1-5A4 of the main package 1B. The plurality of electrical paths constitute parts of the data bus 91 and the one or more common lines 92.

The terminal 4C1 of the main package 1A is electrically connected to the terminal 5C1 of the main package 1A via the conductive path WC1 of the main package 1A. The terminal 5C1 of the main package 1A is electrically connected to the terminal 4B1 of the main package 1B. The terminal 4B1 of the main package 1B is electrically connected to the terminal 5B1 of the main package 1B via the conductive path WB1 of the main package 1B. As a result, an electrical path is formed through the terminal 4C1 of the main package 1A, the conductive path WC1 of the main package 1A, the terminal 5C1 of the main package 1A, the terminal 4B1 of the main package 1B, the conductive path WB1 of the main package 1B, and the terminal 5B1 of the main package 1B. This electrical path constitutes part of the signal line 93C1 shown in FIG. 19. The chip enable signal CE1 is supplied to the electrical path via the terminal 4C1 of the main package 1A or the terminal 5B1 of the main package 1B. Such an electrical path is electrically connected only to the memory chips MC1 and MC2, that is, the semiconductor chips 30 of the layer portions 10S1 and 10S2 in the main package 1A, among the semiconductor chips 30 of all of the layer portions 10 in the main packages 1A and 1B. The reason is that, in the main package 1A, the electrical path runs through the conductive path WC1 which is electrically connected to the semiconductor chips 30 of the layer portions 10S1 and 10S2, while in the main package 1B, the electrical path runs through the bypass conductive path WB1. The electrical path can thus supply the chip enable signal CE1 to only the memory chips MC1 and MC2 among the memory chips MC1 to MC8.

Similarly, an electrical path is formed through the terminal 4C2 of the main package 1A, the conductive path WC2 of the main package 1A, the terminal 5C2 of the main package 1A, the terminal 4B2 of the main package 1B, the conductive path WB2 of the main package 1B, and the terminal 5B2 of the main package 1B. This electrical path constitutes part of the signal line 93C2 shown in FIG. 19. The chip enable signal CE2 is supplied to the electrical path via the terminal 4C2 of the main package 1A or the terminal 5B2 of the main package 1B. Such an electrical path is electrically connected only to the memory chips MC3 and MC4, that is, the semiconductor chips 30 of the layer portions 10S3 and 10S4 in the main package 1A, among the semiconductor chips 30 of all of the layer portions 10 in the main packages 1A and 1B. The electrical path can thus supply the chip enable signal CE2 to only the memory chips MC3 and MC4 among the memory chips MC1 to MC8.

An electrical path is formed through the terminal 4B1 of the main package 1A, the conductive path WB1 of the main package 1A, the terminal 5B1 of the main package 1A, the terminal 4C1 of the main package 1B, the conductive path WC1 of the main package 1B, and the terminal 5C1 of the main package 1B. This electrical path constitutes part of the signal line 93C3 shown in FIG. 19. The chip enable signal CE3 is supplied to the electrical path via the terminal 4B1 of the main package 1A or the terminal 5C1 of the main package 1B. Such an electrical path is electrically connected only to the memory chips MC5 and MC6, that is, the semiconductor chips 30 of the layer portions 10S1 and 10S2 in the main package 1B, among the semiconductor chips 30 of all of the layer portions 10 in the main packages 1A and 1B. The electrical path can thus supply the chip enable signal CE3 to only the memory chips MC5 and MC6 among the memory chips MC1 to MC8.

Similarly, an electrical path is formed through the terminal 4B2 of the main package 1A, the conductive path WB2 of the main package 1A, the terminal 5B2 of the main package 1A, the terminal 4C2 of the main package 1B, the conductive path WC2 of the main package 1B, and the terminal 5C2 of the main package 1B. This electrical path constitutes part of the signal line 93C4 shown in FIG. 19. The chip enable signal CE4 is supplied to the electrical path via the terminal 4B2 of the main package 1A or the terminal 5C2 of the main package 1B. Such an electrical path is electrically connected only to the memory chips MC7 and MC8, that is, the semiconductor chips 30 of the layer portions 10S3 and 10S4 in the main package 1B, among the semiconductor chips 30 of all of the layer portions 10 in the main packages 1A and 1B. The electrical path can thus supply the chip enable signal CE4 to only the memory chips MC7 and MC8 among the memory chips MC1 to MC8.

An electrical path is formed through the terminal 4C3 of the main package 1A, the conductive path WC3 of the main package 1A, the terminal 5C3 of the main package 1A, the terminal 4B3 of the main package 1B, the conductive path WB3 of the main package 1B, and the terminal 5B3 of the main package 1B. This electrical path constitutes part of the signal line 93R1 shown in FIG. 19. The electrical path is electrically connected only to the memory chip MC1, that is, the semiconductor chip 30 of the layer portion 10S1 in the main package 1A, among the semiconductor chips 30 of all of the layer portions 10 in the main packages 1A and 1B. The electrical path can thus transmit the ready/busy signal of only the memory chip MC1 among the memory chips MC1 to MC8, and output the ready/busy signal from the terminal 4C3 of the main package 1A or the terminal 5B3 of the main package 1B.

Similarly, there are formed three electrical paths that are each electrically connected to only a corresponding one of the memory chips MC2 to MC4 and can transmit and output the ready/busy signal of that memory chip alone.

An electrical path is formed through the terminal 4B3 of the main package 1A, the conductive path WB3 of the main package 1A, the terminal 5B3 of the main package 1A, the terminal 4C3 of the main package 1B, the conductive path WC3 of the main package 1B, and the terminal 5C3 of the main package 1B. This electrical path constitutes part of the signal line 93R5 shown in FIG. 19. The electrical path is electrically connected only to the memory chip MC5, that is, the semiconductor chip 30 of the layer portion 10S1 in the main package 1B, among the semiconductor chips 30 of all of the layer portions 10 in the main packages 1A and 1B. The electrical path can thus transmit the ready/busy signal of only the memory chip MC5 among the memory chips MC1 to MC8, and output the ready/busy signal from the terminal 4B3 of the main package 1A or the terminal 5C3 of the main package 1B.

Similarly, there are formed three electrical paths that are each electrically connected to only a corresponding one of the memory chips MC6 to MC8 and can transmit and output the ready/busy signal of that memory chip alone.

According to the example described so far, the chip enable signals or ready/busy signals associated with the semiconductor chips 30 (memory chips) that fall on the same layers in the respective main packages 1A and 1B of the same configuration can easily be made different between the main packages 1A and 1B.

The main package 1M of the present embodiment includes a plurality of semiconductor chips 30 that are stacked. Among the plurality of top terminals 4 of the main package 1M, the third-type terminals 4C1, 4C2, 4C3, 4C4, 4C5, and 4C6 are associated with different semiconductor chips 30. The terminal 4C1 is associated with the semiconductor chips 30 of the layer portions 10S1 and 10S2. The terminal 4C2 is associated with the semiconductor chips 30 of the layer portions 10S3 and 10S4. The terminal 4C3 is associated with the semiconductor chip 30 of the layer portion 10S1. The terminal 4C4 is associated with the semiconductor chip 30 of the layer portion 10S2. The terminal 4C5 is associated with the semiconductor chip 30 of the layer portion 10S3. The terminal 4C6 is associated with the semiconductor chip 30 of the layer portion 10S4. Hereinafter, the terminals 4C1 to 4C6 will also be referred to as the first terminals.

Now, a description will be given of remedies according to the present embodiment for coping with situations where the main package 1M includes at least one second-type layer portion 10B. In each second-type layer portion 10B, none of the plurality of electrodes 32 are electrically connected to the defective semiconductor chip 30. Consequently, the defective semiconductor chip 30 is electrically connected to none of the plurality of conductive paths W, and is thus disabled. In such a case, according to the present embodiment, an additional package is added to the main package 1M to construct a composite layered chip package 1.

Figure 7:
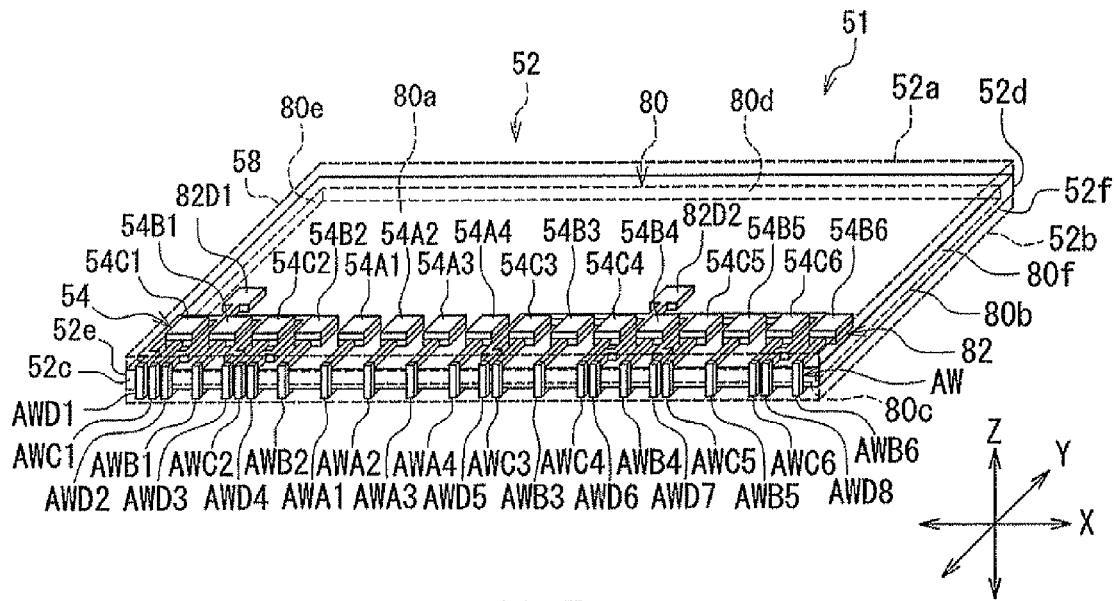
FIG. 7 is a perspective view of an additional package of the first embodiment of the invention.
Figure 8:
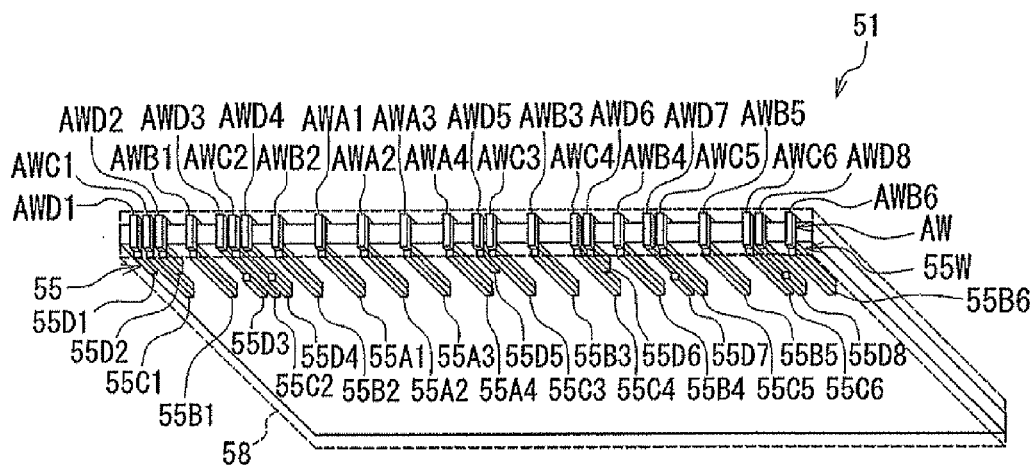
FIG. 8 is a perspective view showing the additional package of FIG. 7 as viewed from below.
Figure 9:
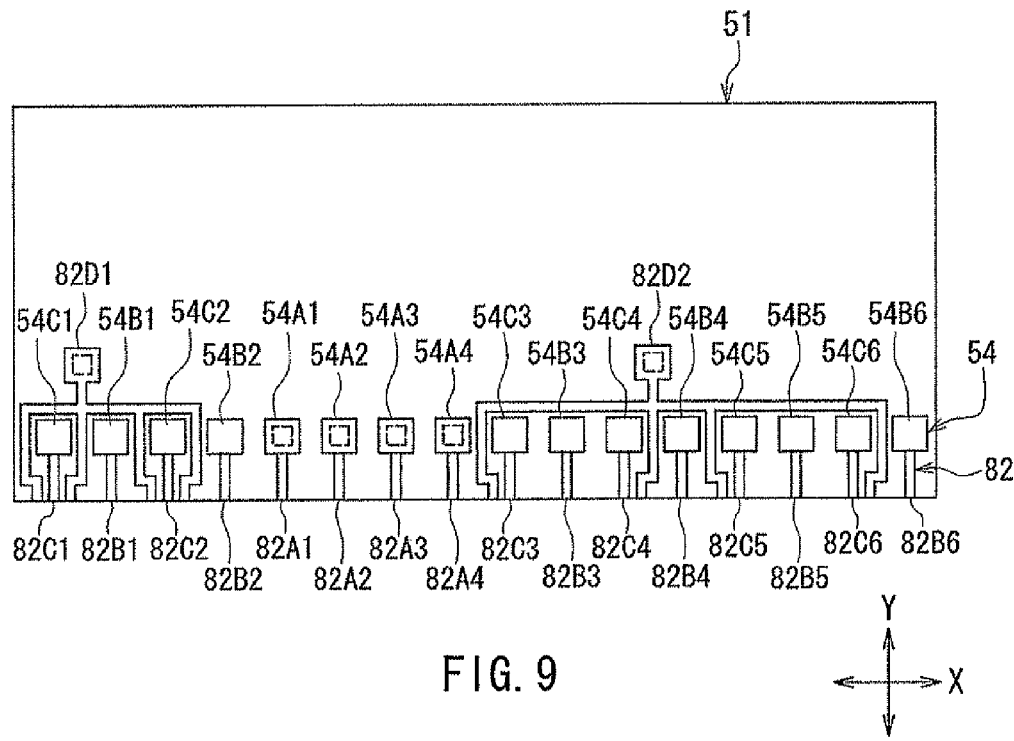
FIG. 9 is a plan view of the additional package of FIG. 7.
Figure 10:
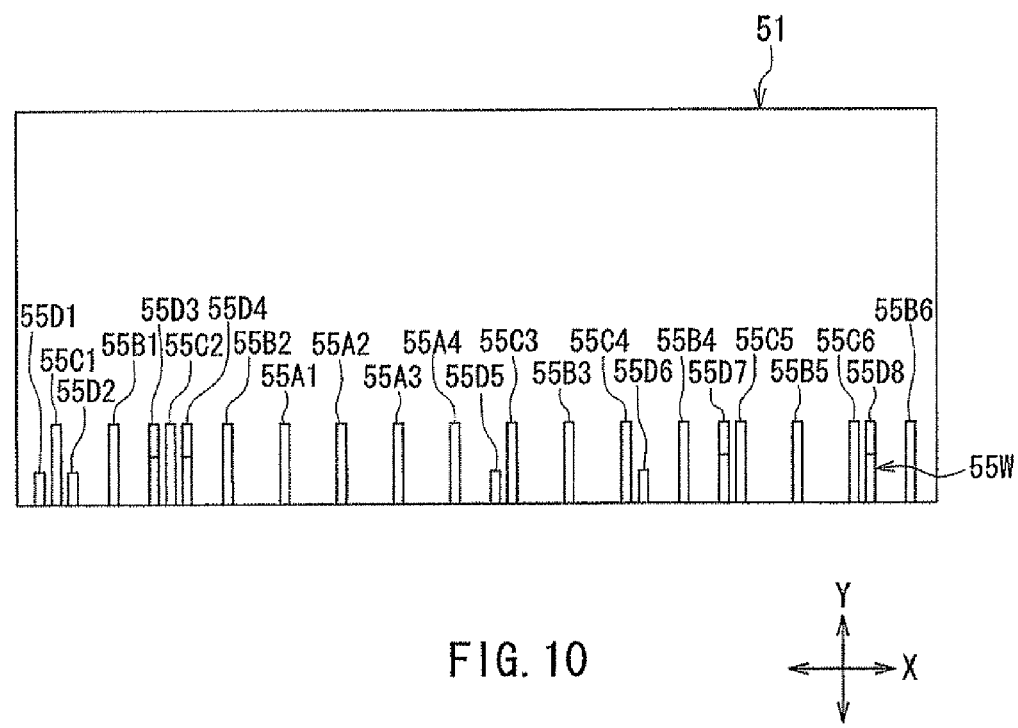
FIG. 10 is a plan view showing a plurality of bottom terminals and bottom wiring of the additional package of FIG. 7 as viewed from above.

The additional package will now be described with reference to FIG. 7 to FIG. 10. FIG. 7 is a perspective view of the additional package. FIG. 8 is a perspective view showing the additional package of FIG. 7 as viewed from below. FIG. 9 is a plan view of the additional package of FIG. 7. FIG. 10 is a plan view showing a plurality of bottom terminals and bottom wiring of the additional package of FIG. 7 as viewed from above.

As shown in FIG. 7, the additional package 51 includes an additional package main body 52 having a top surface 52$a$, a bottom surface 52$b$, and four side surfaces 52$c$, 52$d$, 52$e$, and 52$f$. The additional package main body 52 has a rectangular periphery as viewed in the direction perpendicular to the top surface 52$a$ (the Z direction). The periphery of the additional package main body 52 is smaller in shape than the periphery of the main body 2 as viewed in the direction perpendicular to the top surface 2$a$ (the Z direction). The additional package main body 52 includes an additional semiconductor chip 80, a plurality of electrodes 82, bottom wiring 55W, and an insulating portion 58. The configuration of the additional semiconductor chip 80 is the same as that of a conforming semiconductor chip 30. The additional semiconductor chip 80 has: a first surface 80$a$ with a device formed thereon; a second surface 80$b$ opposite to the first surface 80$a$; a first side surface 80$c$ and a second side surface 80$d$ that are mutually opposite to each other; and a third side surface 80$e$ and a fourth side surface 80$f$ that are mutually opposite to each other. The plurality of electrodes 82 are disposed on the side of the first surface 80$a$ of the additional semiconductor chip 80. The bottom wiring 55W is disposed on the side of the second surface 80$b$ of the additional semiconductor chip 80. The insulating portion 58 covers the outer surfaces of the additional semiconductor chip 80. In FIG. 7 and FIG. 8, part of the insulating portion 58 is shown by broken lines.

The additional package 51 further includes a plurality of conductive paths AW disposed on at least one of the side surfaces of the additional package main body 52. In the example shown in FIG. 7 and FIG. 8, the plurality of conductive paths AW are disposed only on the side surface 52$c$. The plurality of electrodes 82 and the bottom wiring 55W are electrically connected to the plurality of conductive paths AW.

The additional package 51 further includes a plurality of top terminals 54 disposed on the top surface 52$a$ of the additional package main body 52, and a plurality of bottom terminals 55 disposed on the bottom surface 52$b$ of the additional package main body 52. The plurality of top terminals 54 and the plurality of bottom terminals 55 correspond to the plurality of additional terminals of the present invention.

The plurality of top terminals 54 include terminals 54A1 to 54A4, 54B1 to 54B6, and 54C1 to 54C6. The shape and layout of the terminals 54A1 to 54A4, 54B1 to 54B6, and 54C1 to 54C6 are the same as those of the terminals 4A1 to 4A4, 4B1 to 4B6, and 4C1 to 4C6 shown in FIG. 2.

The plurality of conductive paths AW include conductive paths AWA1 to AWA4, AWB1 to AWB6, and AWC1 to AWC6 that correspond to the conductive paths WA1 to WA4, WB1 to WB6, and WC1 to WC6, respectively. The plurality of conductive paths AW further include conductive paths AWD1, AWD2, AWD3, AWD4, AWD5, AWD6, AWD7, and AWD8. The conductive paths AWD1 and AWD2 are adjacent to the conductive path AWC1 and located on the left and right sides thereof, respectively. The conductive paths AWD3 and AWD4 are adjacent to the conductive path AWC2 and located on the left and right sides thereof, respectively. The conductive path AWD5 is adjacent to the conductive path AWC3 and located on the left side thereof. The conductive path AWD6 is adjacent to the conductive path AWC4 and located on the right side thereof. The conductive path AWD7 is adjacent to the conductive path AWC5 and located on the left side thereof. The conductive path AWD8 is adjacent to the conductive path AWC6 and located on the right side thereof.

The plurality of electrodes 82 include electrodes 82A1 to 82A4, 82B1 to 82B6, 82C1 to 82C6, 82D1, and 82D2. The shape and layout of the electrodes 82A1 to 82A4, 82B1 to 82B6, and 82C1 to 82C6 are the same as those of the electrodes 32A1 to 32A4, 32B1 to 32B6, and 32C1 to 32C6, respectively. The electrodes 82A1 to 82A4 are in contact with and electrically connected to the additional semiconductor chip 80. In FIG. 9, the dashed squares in the electrodes 82A1 to 82A4 represent the areas where the electrodes 82A1 to 82A4 make contact with the additional semiconductor chip 80. None of the electrodes 82B1 to 82B6 and 82C1 to 82C6 are in contact with the additional semiconductor chip 80.

The electrode 82D1 has four branched parts that are electrically connected to the conductive paths AWD1, AWD2, AWD3, and AWD4, respectively. The electrode 82D2 has four branched parts that are electrically connected to the conductive paths AWD5, AWD6, AWD7, and AWD8, respectively. The electrodes 82D1 and 82D2 are in contact with and electrically connected to the additional semiconductor chip 80. In FIG. 9, the dashed squares in the electrodes 82D1 and 82D2 represent the areas where the electrodes 82D1 and 82D2 make contact with the additional semiconductor chip 80.

The plurality of top terminals 54 are formed by using the plurality of electrodes 82 except the electrodes 82D1 and 82D2. More specifically, portions of the plurality of electrodes 82 except the electrodes 82D1 and 82D2 constitute conductor pads. Conductor layers are formed on the conductor pads. The conductor pads and conductor layers constitute the top terminals 54. The terminals 54A1 to 54A4, 54B1 to 54B6, and 54C1 to 54C6 are electrically connected to the conductive paths AWA1 to AWA4, AWB1 to AWB6, and AWC1 to AWC6, respectively, via the electrodes 82A1 to 82A4, 82B1 to 82B6, and 82C1 to 82C6.

The plurality of bottom terminals 55 include terminals 55A1 to 55A4, 55B1 to 55B6, 55C1 to 55C6, and 55D1 to 55D8. The bottom terminals 55A1 to 55A4, 55B1 to 55B6, and 55C1 to 55C6 are all shaped to be smaller in width in the X direction and longer in the Y direction than the top terminals 54. The terminals 55A1 to 55A4, 55B1 to 55B6, and 55C1 to 55C6 are paired with the terminals 54A1 to 54A4, 54B1 to 54B6, and 54C1 to 54C6, respectively. Two terminals making up each pair are positioned to overlap each other as viewed in the direction perpendicular to the top surface 52a of the additional package main body 52 (the Z direction).

As shown in FIG. 10, when viewed in the direction perpendicular to the top surface 52a of the additional package main body 52 (the Z direction), the terminals 55D1 and 55D2 are adjacent to the terminal 55C1 and located on the left and right sides thereof, respectively. The terminals 55D3 and 55D4 are adjacent to the terminal 55C2 and located on the left and right sides thereof, respectively. The terminal 55D5 is adjacent to the terminal 55C3 and located on the left side thereof. The terminal 55D6 is adjacent to the terminal 55C4 and located on the right side thereof. The terminal 55D7 is adjacent to the terminal 55C5 and located on the left side thereof. The terminal 55D8 is adjacent to the terminal 55C6 and located on the right side thereof.

The terminals 55D1, 55D2, 55D5, and 55D6 are located closer to the side surface 52c of the additional package main body 52 than are the terminals 55D3, 55D4, 55D7, and 55D8.

The bottom wiring 55W electrically connects the terminals 55A1-55A4, 55B1-55B6, 55C1-55C6, and 55D1-55D8 to the conductive paths AWA1-AWA4, AWB1-AWB6, AWC1-AWC6, and AWD1-AWD8, respectively.

The conductive paths AWA1 to AWA4, AWB1 to AWB6, and AWC1 to AWC6 electrically connect the pairs of terminals (54A1, 55A1), (54A2, 55A2), (54A3, 55A3), (54A4, 55A4), (54B1, 55B1), (54B2, 55B2), (54B3, 55B3), (54B4, 55B4), (54B5, 55B5), (54B6, 55B6), (54C1, 55C1), (54C2, 55C2), (54C3, 55C3), (54C4, 55C4), (54C5, 55C5), and (54C6, 55C6), respectively.

The conductive paths AWD1 to AWD4 electrically connect the terminals 55D1-55D4 to the four branched parts of the electrode 82D1, respectively. The conductive paths AWD5 to AWD8 electrically connect the terminals 55D5-55D8 to the four branched parts of the electrode 82D2, respectively.

Hereinafter, the terminals 55D1 to 55D8 will also be referred to as the second terminals, the terminals 55C1 to 55C6 will also be referred to as the third terminals, and the terminals 54C1 to 54C6 will also be referred to as the fourth terminals.

Reference is now made to FIG. 11 to FIG. 18 to describe the composite layered chip package 1 including the main package 1M and the additional package 51 stacked on each other. The main package 1M and the additional package 51 can be positioned in any of a plurality of relative positional relationships with each other. In the present embodiment, the main package 1M and the additional package 51 can be positioned in any of first to fourth relative positional relationships with each other, in particular.

The first terminals 4C1 to 4C6 of the main package 1M and the second terminals 55D1 to 55D8 of the additional package 51 are shaped and positioned such that at least one pair of first and second terminals in which the first and second terminals are in contact with each other is formed in each of the first to fourth relative positional relationships. The combination of the first and second terminals making up the at least one pair of first and second terminals is different among the first to fourth relative positional relationships.

The plurality of third terminals 55C1 to 55C6 of the additional package 51 are shaped and positioned such that a plurality of pairs of first and third terminals in each of which the first and third terminals are in contact with each other are formed in each of the first to fourth relative positional relationships, wherein combinations of the first and third terminals making up the plurality of pairs of first and third terminals are the same for all the first to fourth relative positional relationships.

In the specific main body 2S, the plurality of layer portions 10 of the main part 2M include at least one first-type layer portion 10A and at least one second-type layer portion 10B. The semiconductor chip 30 of the first-type layer portion 10A is electrically connected to the wiring 3. The semiconductor chip 30 of the second-type layer portion 10B is not electrically connected to the wiring 3.

The main package 1M and the additional package 51 are positioned with respect to each other in one of the first to fourth relative positional relationships that is selected in accordance with which position in the specific main body 2S the semiconductor chip 30 of the second-type layer portion 10B to be substituted with the additional semiconductor chip 80 is located at. In the selected one of the first to fourth relative positional relationships, the first and second terminals making up the at least one pair of first and second terminals are joined to each other. The first terminal in the at least one pair of first and second terminals in which the first and second terminals are joined to each other is a terminal associated with the defective semiconductor chip 30. The additional semiconductor chip 80 in the additional package 51 is electrically connected to the wiring 3 of the main package 1M through the at least one pair of first and second terminals in which the first and second terminals are joined to each other, and substitutes for the defective semiconductor chip 30.

When the composite layered chip package 1 is viewed in the Z direction, the periphery of the additional package 51 including the additional package main body 52 and the plurality of conductive paths AW does not lie beyond the periphery of the main body 2 of the main package 1M.

The composite layered chip package 1 will be described in more detail below with reference to a plurality of specific examples of modules including the composite layered chip package 1.

Figure 11:
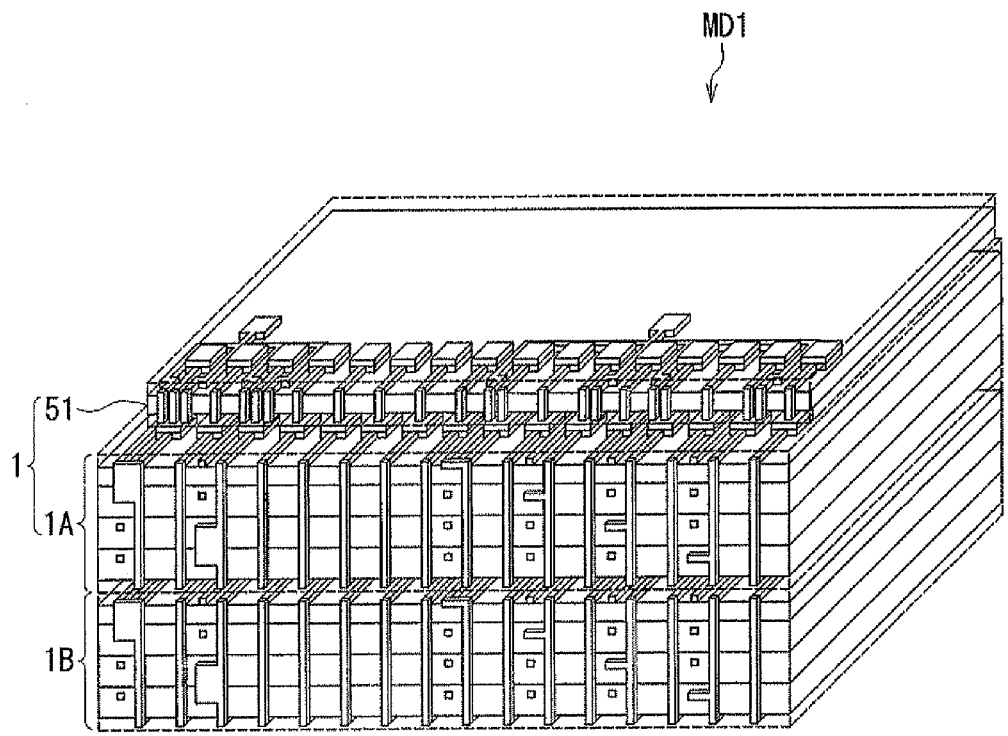
FIG. 11 is a perspective view showing a first example of a module including a composite layered chip package according to the first embodiment of the invention.
Figure 12:
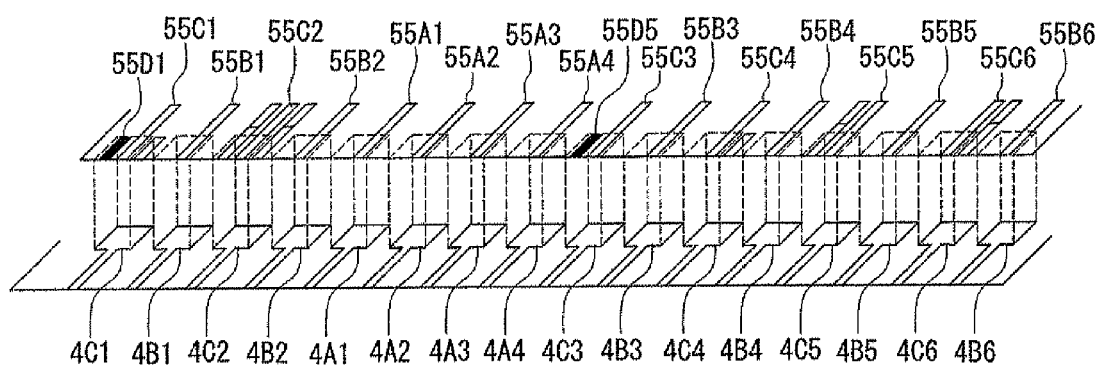
FIG. 12 is an explanatory diagram illustrating the connections between a plurality of terminals in FIG. 11.

FIG. 11 is a perspective view showing a first example of the module including the composite layered chip package 1 according to the present embodiment. FIG. 12 is an explanatory diagram illustrating the connections between a plurality of terminals in FIG. 11. The module MD1 of the first example includes the composite layered chip package 1 and the main package 1B. The composite layered chip package 1 includes the main package 1A and the additional package 51 that are positioned in the first relative positional relationship with each other. The main package 1A is placed on top of the main package 1B, and the additional package 51 is placed on top of the main package 1A. The positioning of the main package 1A and the main package 1B and the electrical connection therebetween are the same as those in the module MD shown in FIG. 1.

The first relative positional relationship is selected when the layer portion 10S1 of the main package 1A is the second-type layer portion 10B and the additional semiconductor chip 80 is to substitute for the semiconductor chip 30 of this layer portion 10S1. In the first relative positional relationship, as shown in FIG. 11, the additional package 51 is displaced, relative to the positioning in which the additional package 51 lies right on the main package 1A, greatly in the direction from the side surface 2c to the side surface 2d of the main body 2 of the main package 1A and slightly in the direction from the side surface 2e to the side surface 2f of the main body 2 of the main package 1A. The positioning in which the additional package 51 lies right on the main package 1A is such that the terminals 54A1 to 54A4, 54B1 to 54B6, and 54C1 to 54C6 of the additional package 51 overlap the terminals 4A1 to 4A4, 4B1 to 4B6, and 4C1 to 4C6 of the main package 1A, respectively, when the composite layered chip package 1 is viewed in the Z direction.

In FIG. 12, a plurality of regions on the bottom surface 52b of the additional package main body 52 that are in contact with the terminals 4A1 to 4A4, 4B1 to 4B6, and 4C1 to 4C6 are shown by broken lines. As shown in FIG. 12, in the first relative positional relationship, the terminal 55D1 is in contact with the terminal 4C1, and the terminal 55D5 is in contact with the terminal 4C3. Furthermore, the terminals 55A1 to 55A4, 55B1 to 55B6, and 55C1 to 55C6 are in contact with the terminals 4A1 to 4A4, 4B1 to 4B6, and 4C1 to 4C6, respectively. The terminals 55D2 to 55D4 and 55D6 to 55D8 are in contact with none of the plurality of terminals 4. Two terminals in contact with each other are joined to each other. The pair of terminals 55D1 and 4C1 and the pair of terminals 55D5 and 4C3 are pairs of first and second terminals in each of which the first and second terminals are in contact with each other. In FIG. 12, the terminals 55D1 and 55D5 are filled in with black to emphasize them.

A signal associated with the semiconductor chip 30 of the layer portion 10S1 of the main package 1A (the chip enable signal CE1 in the example shown in FIG. 19) appears on the terminal 4C1 with which the terminal 55D1 is in contact. A signal associated with the semiconductor chip 30 of the layer portion 10S1 of the main package 1A (the ready/busy signal R/B1 in the example shown in FIG. 19) appears on the terminal 4C3 with which the terminal 55D5 is in contact. Signals to be used in common by the four layer portions 10S1 to 10S4 of the main package 1A appear on the terminals 4A1 to 4A4 with which the terminals 55A1 to 55A4 are in contact. In this way, all of a plurality of signals associated with the semiconductor chip 30 of the layer portion 10S1 of the main package 1A are associated with the additional semiconductor chip 80. Therefore, the additional semiconductor chip 80 can substitute for the defective semiconductor chip 30 of the layer portion 10S1 of the main package 1A.

Figure 13:
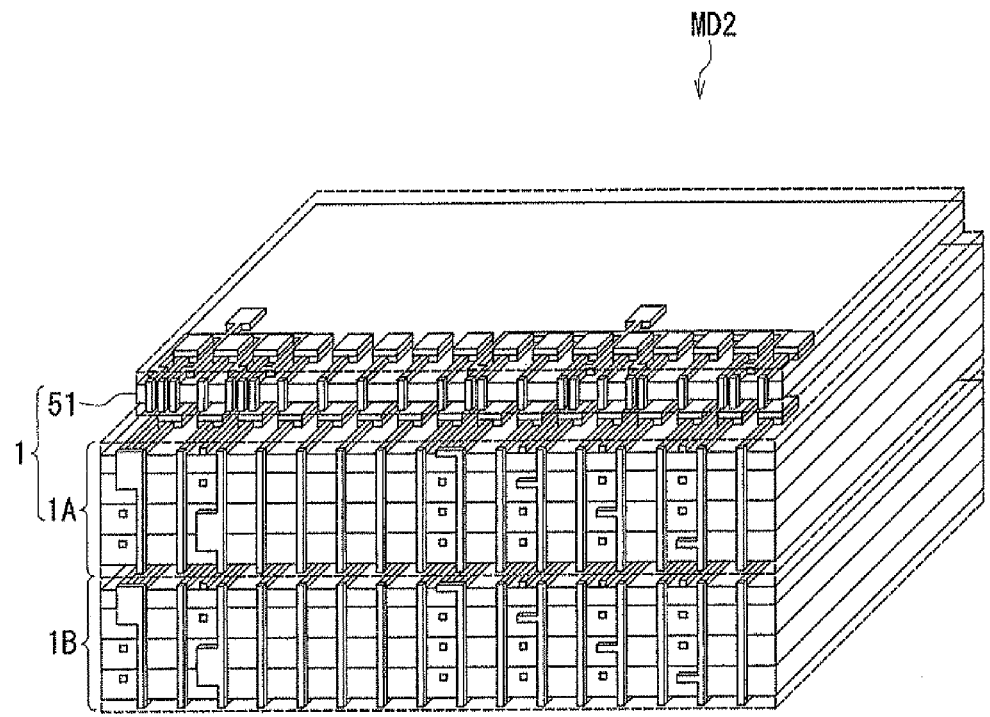
FIG. 13 is a perspective view showing a second example of the module including the composite layered chip package according to the first embodiment of the invention.
Figure 14:
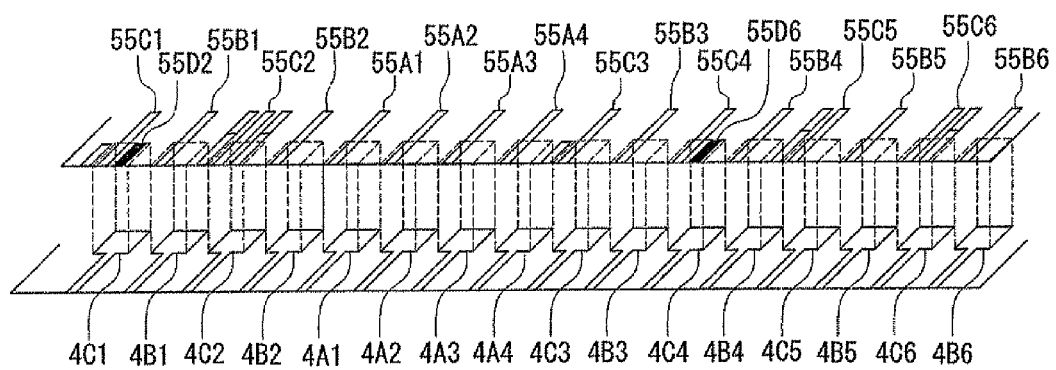
FIG. 14 is an explanatory diagram illustrating the connections between a plurality of terminals in FIG. 13.

FIG. 13 is a perspective view showing a second example of the module including the composite layered chip package 1 according to the present embodiment. FIG. 14 is an explanatory diagram illustrating the connections between a plurality of terminals in FIG. 13. The module MD2 of the second example includes the composite layered chip package 1 and the main package 1B. The composite layered chip package 1 includes the main package 1A and the additional package 51 that are positioned in the second relative positional relationship with each other. The main package 1A is placed on top of the main package 1B, and the additional package 51 is placed on top of the main package 1A. The positioning of the main package 1A and the main package 1B and the electrical connection therebetween are the same as those in the module MD shown in FIG. 1.

The second relative positional relationship is selected when the layer portion 10S2 of the main package 1A is the second-type layer portion 10B and the additional semiconductor chip 80 is to substitute for the semiconductor chip 30 of this layer portion 10S2. In the second relative positional relationship, as shown in FIG. 13, the additional package 51 is displaced, relative to the positioning in which the additional package 51 lies right on the main package 1A, greatly in the direction from the side surface 2c to the side surface 2d of the main body 2 of the main package 1A and slightly in the direction from the side surface 2f to the side surface 2e of the main body 2 of the main package 1A.

In FIG. 14, a plurality of regions on the bottom surface 52b of the additional package main body 52 that are in contact with the terminals 4A1 to 4A4, 4B1 to 4B6, and 4C1 to 4C6 are shown by broken lines. As shown in FIG. 14, in the second relative positional relationship, the terminal 55D2 is in contact with the terminal 4C1, and the terminal 55D6 is in contact with the terminal 4C4. Furthermore, the terminals 55A1 to 55A4, 55B1 to 55B6, and 55C1 to 55C6 are in contact with the terminals 4A1 to 4A4, 4B1 to 4B6, and 4C1 to 4C6, respectively. The terminals 55D1, 55D3 to 55D5, 55D7, and 55D8 are in contact with none of the plurality of terminals 4.

Two terminals in contact with each other are joined to each other. The pair of terminals 55D2 and 4C1 and the pair of terminals 55D6 and 4C4 are pairs of first and second terminals in each of which the first and second terminals are in contact with each other. In FIG. 14, the terminals 55D2 and 55D6 are filled in with black to emphasize them.

A signal associated with the semiconductor chip 30 of the layer portion 10S2 of the main package 1A (the chip enable signal CE1 in the example shown in FIG. 19) appears on the terminal 4C1 with which the terminal 55D2 is in contact. A signal associated with the semiconductor chip 30 of the layer portion 10S2 of the main package 1A (the ready/busy signal R/B2 in the example shown in FIG. 19) appears on the terminal 4C4 with which the terminal 55D6 is in contact. Signals to be used in common by the four layer portions 10S1 to 10S4 of the main package 1A appear on the terminals 4A1 to 4A4 with which the terminals 55A1 to 55A4 are in contact. In this way, all of a plurality of signals associated with the semiconductor chip 30 of the layer portion 10S2 of the main package 1A are associated with the additional semiconductor chip 80. Therefore, the additional semiconductor chip 80 can substitute for the defective semiconductor chip 30 of the layer portion 10S2 of the main package 1A.

Figure 15:
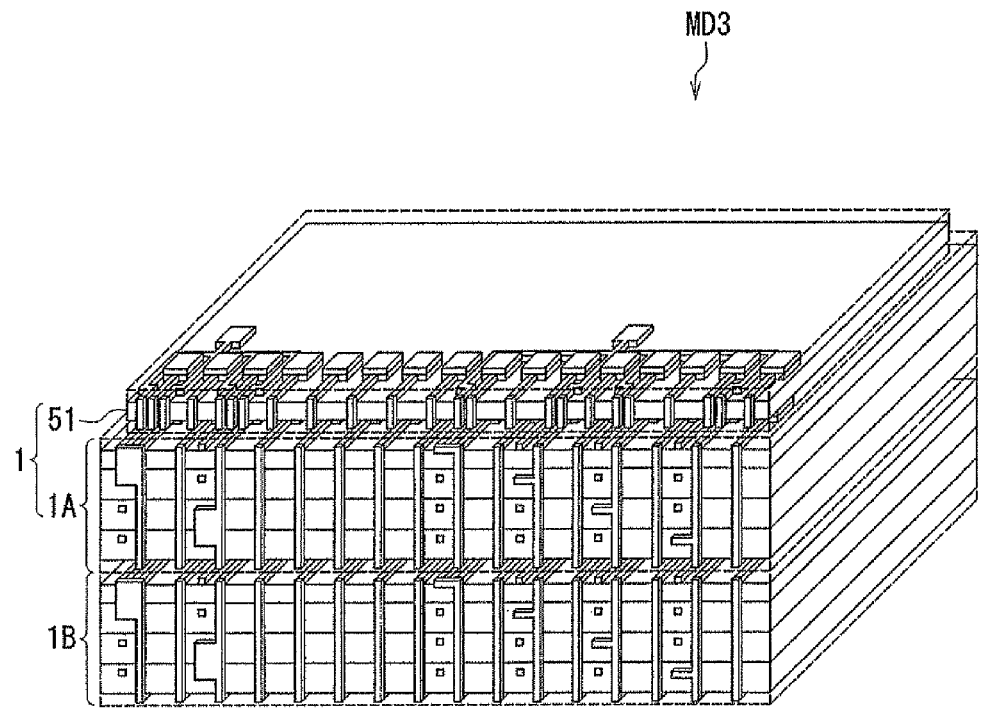
FIG. 15 is a perspective view showing a third example of the module including the composite layered chip package according to the first embodiment of the invention.
Figure 16:
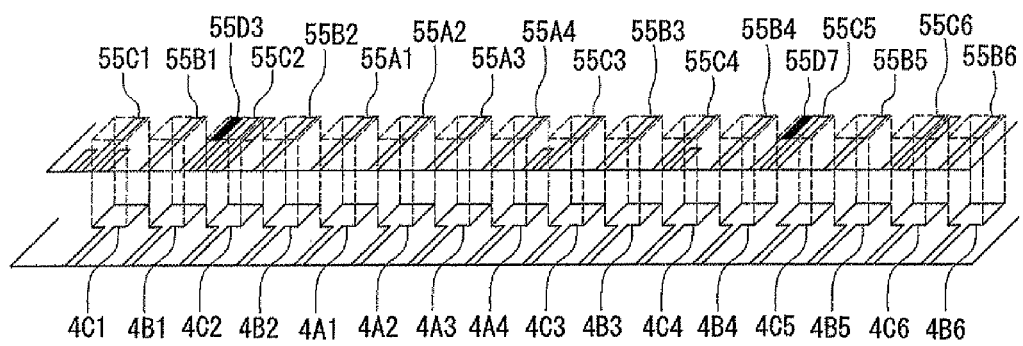
FIG. 16 is an explanatory diagram illustrating the connections between a plurality of terminals in FIG. 15.

FIG. 15 is a perspective view showing a third example of the module including the composite layered chip package 1 according to the present embodiment. FIG. 16 is an explanatory diagram illustrating the connections between a plurality of terminals in FIG. 15. The module MD3 of the third example includes the composite layered chip package 1 and the main package 1B. The composite layered chip package 1 includes the main package 1A and the additional package 51 that are positioned in the third relative positional relationship with each other. The main package 1A is placed on top of the main package 1B, and the additional package 51 is placed on top of the main package 1A. The positioning of the main package 1A and the main package 1B and the electrical connection therebetween are the same as those in the module MD shown in FIG. 1.

The third relative positional relationship is selected when the layer portion 10S3 of the main package 1A is the second-type layer portion 10B and the additional semiconductor chip 80 is to substitute for the semiconductor chip 30 of this layer portion 10S3. In the third relative positional relationship, as shown in FIG. 15, the additional package 51 is displaced, relative to the positioning in which the additional package 51 lies right on the main package 1A, slightly in the direction from the side surface 2e to the side surface 2f of the main body 2 of the main package 1A.

In FIG. 16, a plurality of regions on the bottom surface 52b of the additional package main body 52 that are in contact with the terminals 4A1 to 4A4, 4B1 to 4B6, and 4C1 to 4C6 are shown by broken lines. As shown in FIG. 16, in the third relative positional relationship, the terminal 55D3 is in contact with the terminal 4C2, and the terminal 55D7 is in contact with the terminal 4C5. Furthermore, the terminals 55A1 to 55A4, 55B1 to 55B6, and 55C1 to 55C6 are in contact with the terminals 4A1 to 4A4, 4B1 to 4B6, and 4C1 to 4C6, respectively. The terminals 55D1, 55D2, 55D4 to 55D6, and 55D8 are in contact with none of the plurality of terminals 4. Two terminals in contact with each other are joined to each other. The pair of terminals 55D3 and 4C2 and the pair of terminals 55D7 and 4C5 are pairs of first and second terminals in each of which the first and second terminals are in contact with each other. In FIG. 16, the terminals 55D3 and 55D7 are filled in with black to emphasize them.

A signal associated with the semiconductor chip 30 of the layer portion 10S3 of the main package 1A (the chip enable signal CE2 in the example shown in FIG. 19) appears on the terminal 4C2 with which the terminal 55D3 is in contact. A signal associated with the semiconductor chip 30 of the layer portion 10S3 of the main package 1A (the ready/busy signal R/B3 in the example shown in FIG. 19) appears on the terminal 4C5 with which the terminal 55D7 is in contact. Signals to be used in common by the four layer portions 10S1 to 10S4 of the main package 1A appear on the terminals 4A1 to 4A4 with which the terminals 55A1 to 55A4 are in contact. In this way, all of a plurality of signals associated with the semiconductor chip 30 of the layer portion 10S3 of the main package 1A are associated with the additional semiconductor chip 80. Therefore, the additional semiconductor chip 80 can substitute for the defective semiconductor chip 30 of the layer portion 10S3 of the main package 1A.

Figure 17:
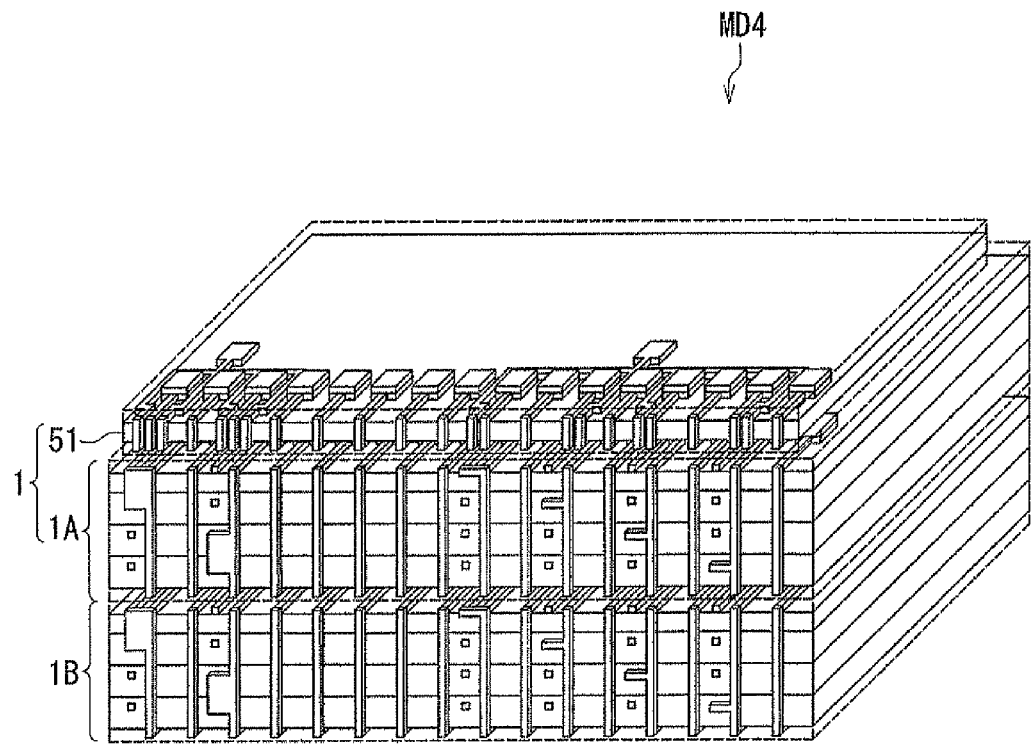
FIG. 17 is a perspective view showing a fourth example of the module including the composite layered chip package according to the first embodiment of the invention.
Figure 18:
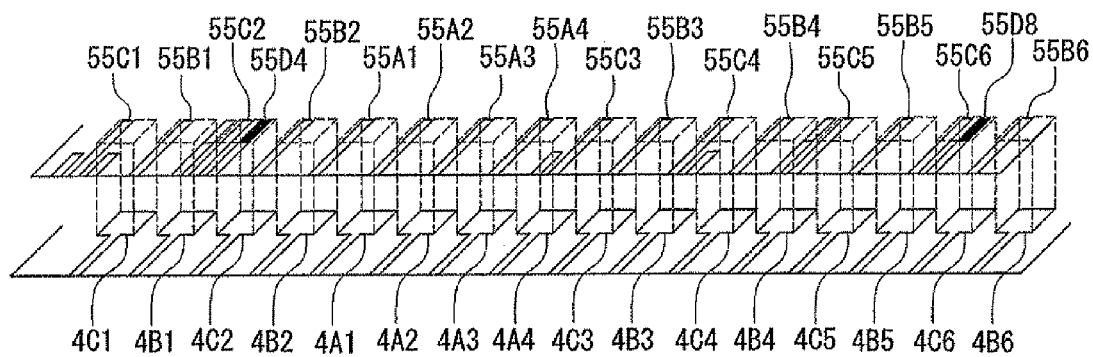
FIG. 18 is an explanatory diagram illustrating the connections between a plurality of terminals in FIG. 17.

FIG. 17 is a perspective view showing a fourth example of the module including the composite layered chip package 1 according to the present embodiment. FIG. 18 is an explanatory diagram illustrating the connections between a plurality of terminals in FIG. 17. The module MD4 of the fourth example includes the composite layered chip package 1 and the main package 1B. The composite layered chip package 1 includes the main package 1A and the additional package 51 that are positioned in the fourth relative positional relationship with each other. The main package 1A is placed on top of the main package 1B, and the additional package 51 is placed on top of the main package 1A. The positioning of the main package 1A and the main package 1B and the electrical connection therebetween are the same as those in the module MD shown in FIG. 1.

The fourth relative positional relationship is selected when the layer portion 10S4 of the main package 1A is the second-type layer portion 10B and the additional semiconductor chip 80 is to substitute for the semiconductor chip 30 of this layer portion 10S4. In the fourth relative positional relationship, as shown in FIG. 17, the additional package 51 is displaced, relative to the positioning in which the additional package 51 lies right on the main package 1A, slightly in the direction from the side surface 2f to the side surface 2e of the main body 2 of the main package 1A.

In FIG. 18, a plurality of regions on the bottom surface 52b of the additional package main body 52 that are in contact with the terminals 4A1 to 4A4, 4B1 to 4B6, and 4C1 to 4C6 are shown by broken lines. As shown in FIG. 18, in the fourth relative positional relationship, the terminal 55D4 is in contact with the terminal 4C2, and the terminal 55D8 is in contact with the terminal 4C6. Furthermore, the terminals 55A1 to 55A4, 55B1 to 55B6, and 55C1 to 55C6 are in contact with the terminals 4A1 to 4A4, 4B1 to 4B6, and 4C1 to 4C6, respectively. The terminals 55D1 to 55D3 and 55D5 to 55D7 are in contact with none of the plurality of terminals 4. Two terminals in contact with each other are joined to each other. The pair of terminals 55D4 and 4C2 and the pair of terminals 55D8 and 4C6 are pairs of first and second terminals in each of which the first and second terminals are in contact with each other. In FIG. 18, the terminals 55D4 and 55D8 are filled in with black to emphasize them.

A signal associated with the semiconductor chip 30 of the layer portion 10S4 of the main package 1A (the chip enable signal CE2 in the example shown in FIG. 19) appears on the terminal 4C2 with which the terminal 55D4 is in contact. A signal associated with the semiconductor chip 30 of the layer portion 10S4 of the main package 1A (the ready/busy signal R/B4 in the example shown in FIG. 19) appears on the terminal 4C6 with which the terminal 55D8 is in contact. Signals to be used in common by the four layer portions 10S1 to 10S4 of the main package 1A appear on the terminals 4A1 to 4A4 with which the terminals 55A1 to 55A4 are in contact. In this way, all of a plurality of signals associated with the semiconductor chip 30 of the layer portion 10S4 of the main package 1A are associated with the additional semiconductor chip 80. Therefore, the additional semiconductor chip 80 can substitute for the defective semiconductor chip 30 of the layer portion 10S4 of the main package 1A.

In the present embodiment, the terminals 54A1 to 54A4, 54B1 to 54B6, and 54C1 to 54C6 disposed on the top surface 52a of the additional package main body 52 are electrically connected to the terminals 55A1 to 55A4, 55B1 to 55B6, and 55C1 to 55C6 disposed on the bottom surface 52b of the additional package main body 52 via the conductive paths AWA1 to AWA4, AWB1 to AWB6, and AWC1 to AWC6, respectively. Therefore, the signals that appear on the terminals 55A1 to 55A4, 55B1 to 55B6, and 55C1 to 55C6 appear on the terminals 54A1 to 54A4, 54B1 to 54B6, and 54C1 to 54C6, respectively.

Accordingly, in the present embodiment, an additional package 51 can be stacked on another additional package 51, and these two additional packages 51 can be electrically connected to each other. According to the present embodiment, when a single main package 1M includes a plurality of second-type layer portions 10B, a plurality of additional packages 51 can be stacked on the single main package 1M. In this case, a plurality of additional semiconductor chips 80 in the plurality of additional packages 51 are used as substitutes for a plurality of defective semiconductor chips 30 in the plurality of second-type layer portions 10B.

In two vertically adjacent additional packages 51, the plurality of bottom terminals 55 of the upper additional package 51 are electrically connected to the plurality of top terminals 54 of the lower additional package 51. A suitable relative positional relationship between the lower additional package 51 and the upper additional package 51 is selected in accordance with which position in the specific main body 2S the semiconductor chip 30 of the second-type layer portion 10B to be substituted with the additional semiconductor chip 80 of the upper additional package 51 is located at. More specifically, the relative positional relationships between the main package 1A and the additional package 51 that have been described with reference to FIG. 11 to FIG. 18 are employable between the lower additional package 51 and the upper additional package 51, with the main package 1A replaced with the lower additional package 51.

In the present embodiment, a main package 1M can be stacked on an additional package 51, and these packages can be electrically connected to each other.

It should be noted that possible configurations of the composite layered chip package 1 are not limited to the first to fourth examples described above. In the present embodiment, when a main package 1M includes a second-type layer portion 10B, an additional package 51 can be placed on the main package 1M in one of the relative positional relationships that is selected in accordance with which position in the specific main body 2S the semiconductor chip 30 of the second-type layer portion 10B to be substituted with the additional semiconductor chip 80 is located at.

Figure 20:
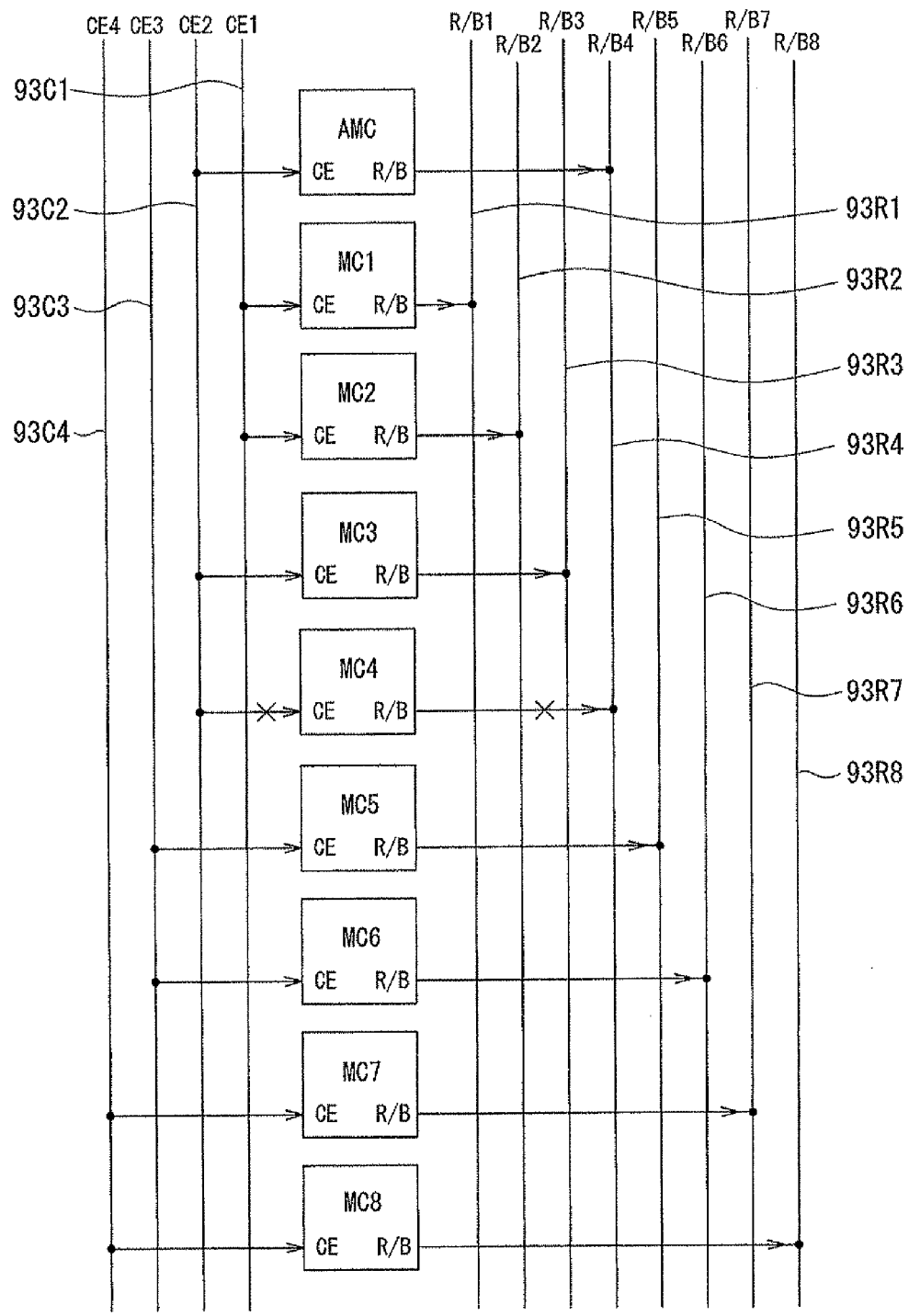
FIG. 20 is a block diagram showing a remedy for coping with situations where the memory device shown in FIG. 19 includes a defective semiconductor chip.

FIG. 19 shows a case where the module MD includes no defective semiconductor chip 30 (memory chip). As one example, FIG. 20 shows a remedy for coping with the situation where the semiconductor chip 30 of the layer portion 10S4 of the main package 1A, i.e., the memory chip MC4, is defective. FIG. 20 shows the relationship between the plurality of memory chips and the signal lines 93C1 to 93C4 and 93R1 to 93R8.

The memory chip MC4 being defective, none of the plurality of electrodes 32 in the layer portion 10S4 of the main package 1A are electrically connected to the memory chip MC4. Consequently, the defective memory chip MC4 is electrically connected to none of the plurality of conductive paths W, and is thus disabled. In this case, according to the present embodiment, the composite layered chip package 1 is constructed by placing the additional package 51 on the main package 1M in one of the plurality of relative positional relationships selected so that the additional semiconductor chip 80 substitutes for the semiconductor chip 30 of the layer portion 10S4 of the main package 1A.

In FIG. 20, the symbol AMC represents the memory chip that is the additional semiconductor chip 80 of the additional package 51. The electrodes 82D1 and 82D2 of the additional package 51 are electrically connected to the conductive paths WC2 and WC6 of the main package 1A, respectively, as with the layer portion 10S4 of the main package 1A. Consequently, as shown in FIG. 20, the electrode pads CE and R/B of the memory chip AMC are electrically connected to the signal lines 93C2 and 93R4, respectively. The composite layered chip package 1 therefore has the same functions as those of a module MD that includes no defective semiconductor chip 30 (memory chip).

Figure 21:
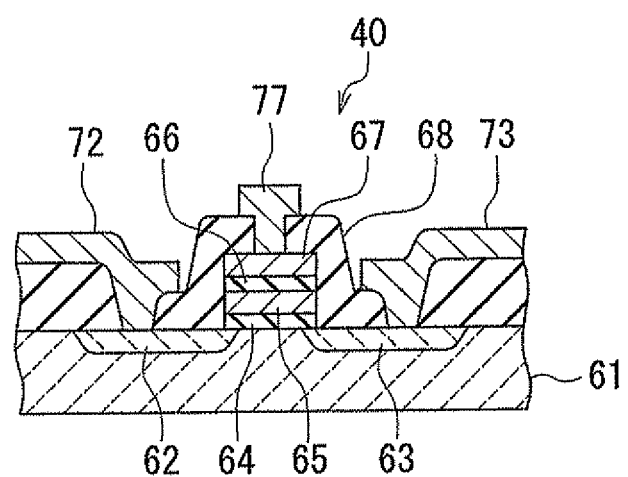
FIG. 21 is a cross-sectional view showing an example of a memory cell included in the semiconductor chip.

Reference is now made to FIG. 21 to describe an example of the configuration of the memory cells included in the semiconductor chip 30 (memory chip). The memory cell 40 shown in FIG. 21 includes a source 62 and a drain 63 formed near a surface of a P-type silicon substrate 61. The source 62 and the drain 63 are both N-type regions. The source 62 and the drain 63 are disposed at a predetermined distance from each other so that a channel composed of a part of the P-type silicon substrate 61 is provided between the source 62 and the drain 63. The memory cell 40 further includes an insulating film 64, a floating gate 65, an insulating film 66, and a control gate 67 that are stacked in this order on the surface of the substrate 61 at the location between the source 62 and the drain 63. The memory cell 40 further includes an insulating layer 68 that covers the source 62, the drain 63, the insulating film 64, the floating gate 65, the insulating film 66 and the control gate 67. The insulating layer 68 has contact holes that open in the tops of the source 62, the drain 63 and the control gate 67, respectively. The memory cell 40 includes a source electrode 72, a drain electrode 73, and a control gate electrode 77 that are formed on the insulating layer 68 at locations above the source 62, the drain 63 and the control gate 67, respectively. The source electrode 72, the drain electrode 73 and the control gate electrode 77 are connected to the source 62, the drain 63 and the control gate 67, respectively, through the corresponding contact holes.

Now, a manufacturing method for layered chip packages according to the present embodiment will be described. The manufacturing method according to the present embodiment is a method for manufacturing a plurality of layered chip packages. Each of the plurality of layered chip packages manufactured by the manufacturing method includes a main package 1M. At least one of the plurality of layered chip packages is a composite layered chip package 1 which further includes an additional package 51 stacked on the main package 1M.

Figure 22:
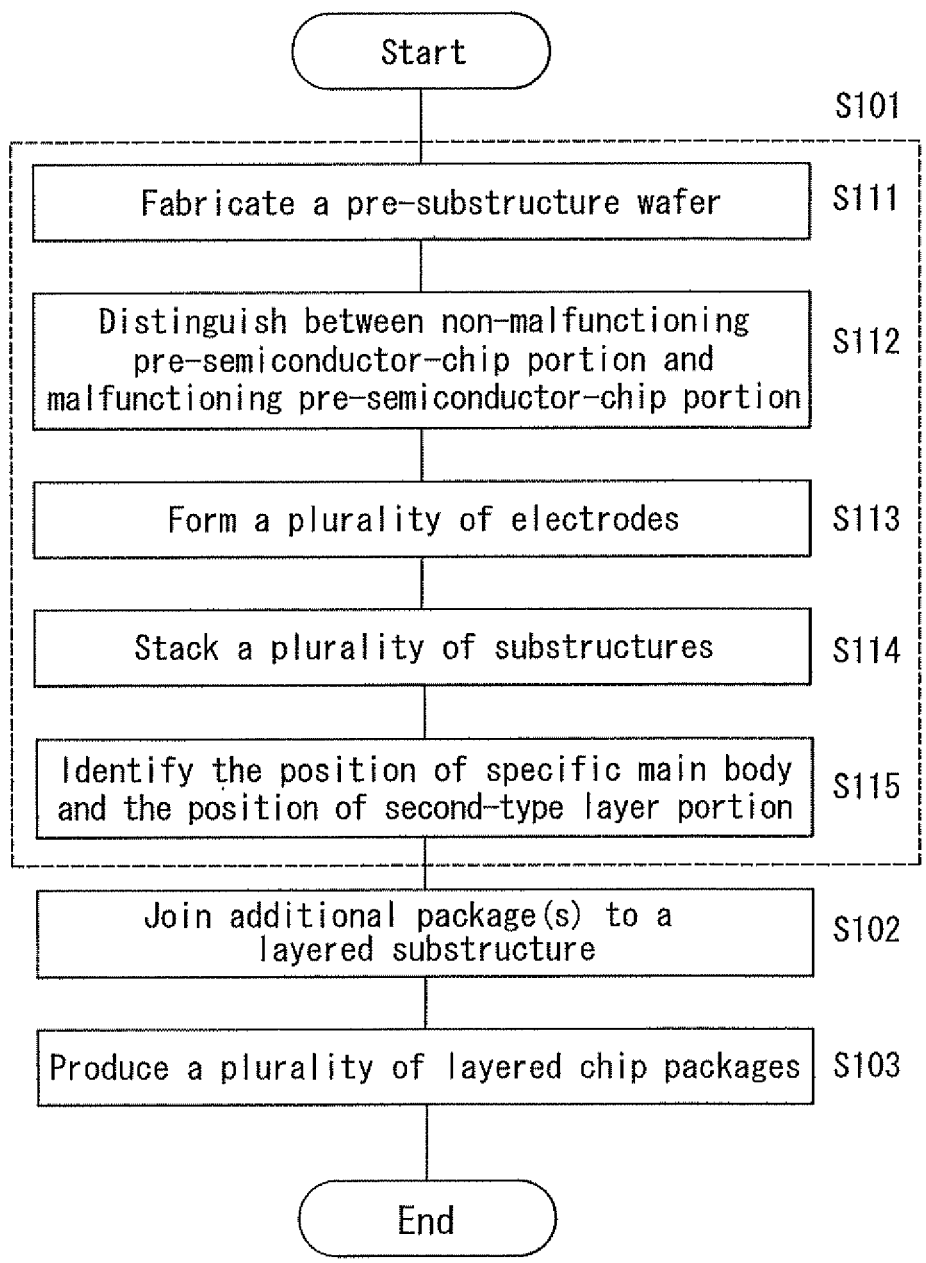
FIG. 22 is a flow chart illustrating a manufacturing method for layered chip packages according to the first embodiment of the invention.

First, reference is made to FIG. 22 to outline the manufacturing method for the layered chip packages according to the present embodiment. FIG. 22 is a flow chart illustrating the manufacturing method for the layered chip packages according to the present embodiment. As shown in FIG. 22, the manufacturing method for the layered chip packages includes the step S101 of fabricating a layered substructure, the step S102 of joining at least one additional package 51 to the layered substructure, and the step S103 of producing a plurality of layered chip packages from the layered substructure with the at least one additional package 51 joined thereto.

In the step S101 of fabricating the layered substructure, the layered substructure is fabricated by stacking a plurality of substructures each of which includes a plurality of preliminary layer portions that are arrayed. Each of the plurality of preliminary layer portions is to become any one of the layer portions 10 included in the main part 2M. The substructures are to be cut later at positions of boundaries between every adjacent preliminary layer portions. The layered substructure includes a plurality of main bodies 2 that are to be separated from each other later. At least one of the plurality of main bodies 2 included in the layered substructure is the specific main body 2S.

The step S101 of fabricating the layered substructure includes, as a series of steps for fabricating each substructure, the step S111 of fabricating a pre-substructure wafer that is to become the substructure, the step S112 of distinguishing between non-malfunctioning pre-semiconductor-chip portions and malfunctioning pre-semiconductor-chip portions, and the step S113 of forming a plurality of electrodes.

The pre-substructure wafer includes a plurality of pre-semiconductor chip portions that are arrayed. The pre-semiconductor-chip portions are to become individual semiconductor chips 30. In the step S112 of distinguishing, the plurality of pre-semiconductor-chip portions included in the pre-substructure wafer are distinguished into non-malfunctioning pre-semiconductor-chip portions and malfunctioning pre-semiconductor-chip portions.

In the step S113 of forming the plurality of electrodes, the plurality of electrodes 32 are formed so that the plurality of electrodes 32 are in contact with and electrically connected to the non-malfunctioning pre-semiconductor-chip portions and are not in contact with the malfunctioning pre-semiconductor-chip portions, by using the distinction results obtained in the step S112 of distinguishing.

The step S101 of fabricating the layered substructure further includes the step S114 of stacking the plurality of substructures. The step S114 is performed after the step S113 of forming the plurality of electrodes. The step S114 completes the layered substructure.

The step S101 of fabricating the layered substructure further includes the step S115 of identifying the position of the at least one specific main body 2S included in the layered substructure. The step S115 is performed after the step S114 of stacking the plurality of substructures. In the step S115, the position of the at least one specific main body 2S is identified by using the distinction results obtained in the step of S112 of distinguishing. Further, in the step S115, the position of the at least one second-type layer portion 10B in the specific main body 2S is also identified by using the distinction results obtained in the step of S112 of distinguishing.

In the step 5102 of joining at least one additional package to the layered substructure, the at least one additional package 51 is joined to the at least one specific main body 2S. In the step S102, when the additional package 51 is joined to the specific main body 2S, the identification results obtained in the step S115 are used to position the additional package 51 with respect to the specific main body 2S in one of the first to fourth relative positional relationships that is selected in accordance with which position in the specific main body 2S the semiconductor chip 30 of the second-type layer portion 10B to be substituted with the additional semiconductor chip 80 is located at.

The step S103 of producing the plurality of layered chip packages includes the step of separating the plurality of main bodies 2 from each other by cutting the layered substructure with the at least one additional package 51 joined thereto.

Figure 23:
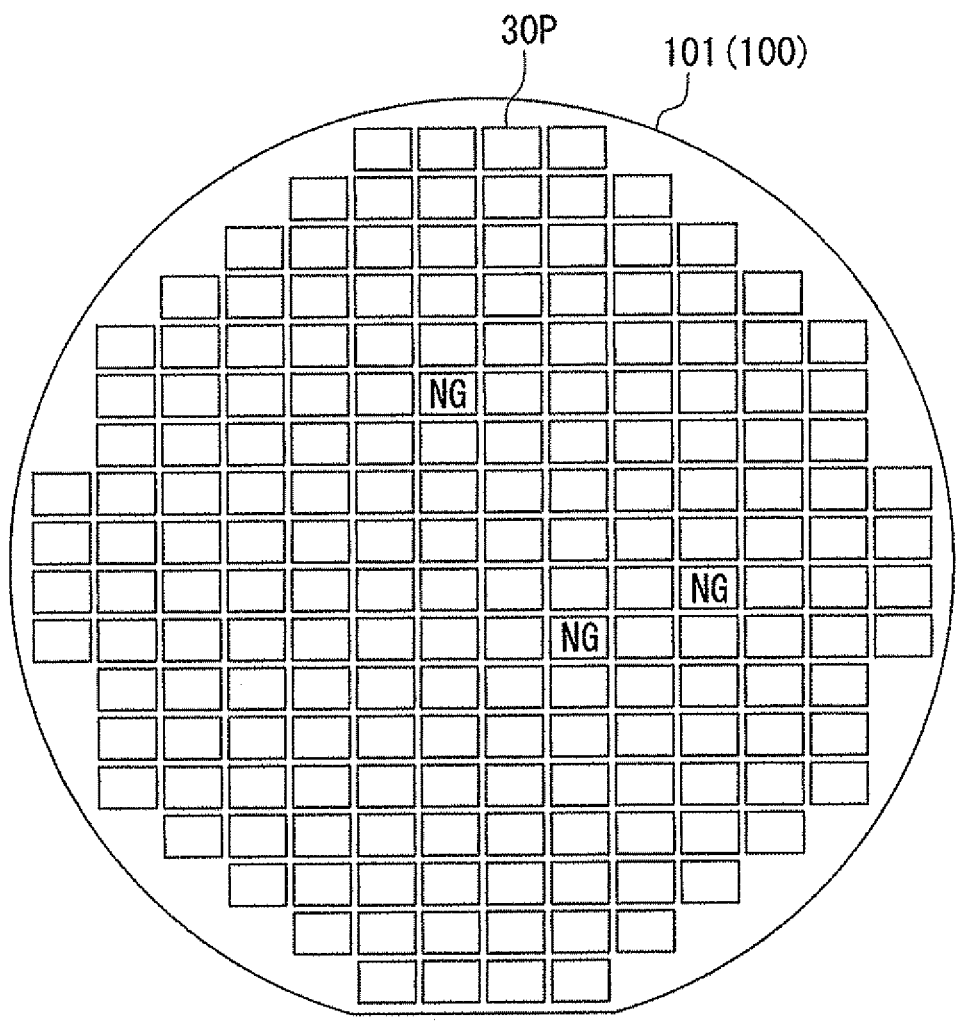
FIG. 23 is a plan view showing a pre-substructure wafer fabricated in a step of a manufacturing method for the main package of the first embodiment of the invention.
Figure 24:
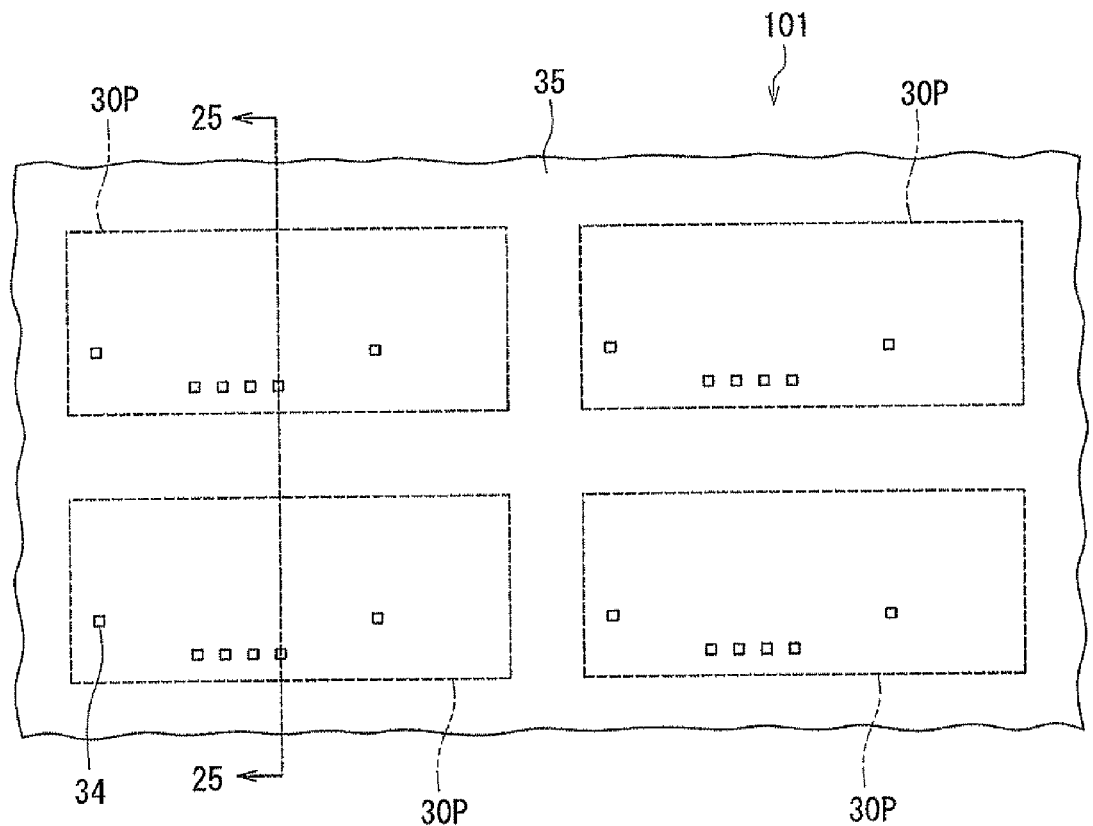
FIG. 24 is a magnified plan view of a part of the pre-substructure wafer shown in FIG. 23.
Figure 25:
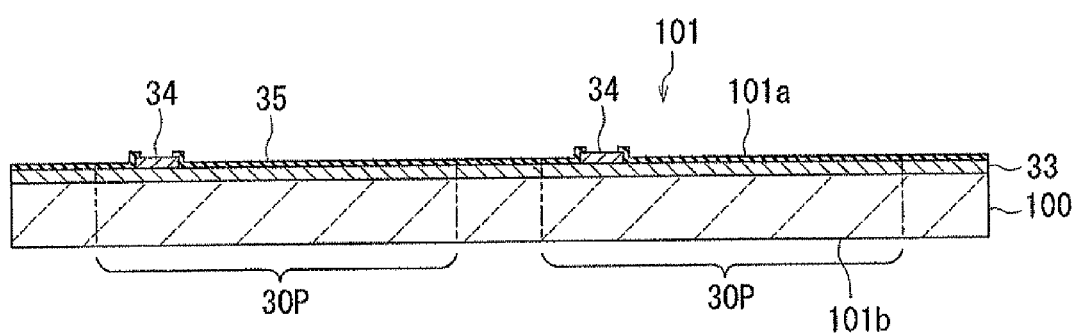
FIG. 25 shows a cross section taken along line 25-25 of FIG. 24.

The step S101 of fabricating the layered substructure will now be described in detail with reference to FIG. 23 to FIG. 36. In the step S101 of fabricating the layered substructure, first, a pre-substructure wafer 101 is fabricated in the step S111. The pre-substructure wafer 101 includes a plurality of pre-semiconductor-chip portions 30P that are arrayed. The pre-semiconductor-chip portions 30P are to become individual semiconductor chips 30. FIG. 23 is a plan view of the pre-substructure wafer 101. FIG. 24 is a magnified plan view of a part of the pre-substructure wafer 101 shown in FIG. 23. FIG. 25 shows a cross section taken along line 25-25 of FIG. 24.

Specifically, in the step of fabricating the pre-substructure wafer 101, the pre-substructure wafer 101 is fabricated by performing processing, such as a wafer process, on one of two mutually opposite surfaces of a semiconductor wafer 100. The plurality of pre-semiconductor-chip portions 30P, each of which includes a device, are arrayed in the pre-substructure wafer 101. In the pre-substructure wafer 101, the plurality of pre-semiconductor-chip portions 30P may be in a row, or in a plurality of rows such that a number of pre-semiconductor-chip portions 30P align both in vertical and horizontal directions. The following description assumes that the plurality of pre-semiconductor-chip portions 30P in the pre-substructure wafer 101 are in a plurality of rows such that a number of pre-semiconductor-chip portions 30P align both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 23 depicts the pre-semiconductor-chip portions 30P larger relative to the semiconductor wafer 100. For example, if the semiconductor wafer 100 is a 12-inch wafer and the top surface of each pre-semiconductor-chip portion 30P is 8 to 10 mm long at each side, then 700 to 900 pre-semiconductor-chip portions 30P are obtainable from a single semiconductor wafer 100.

As shown in FIG. 25, the pre-semiconductor-chip portions 30P include a device-forming region 33 that is formed near one of the surfaces of the semiconductor wafer 100. The device-forming region 33 is a region where devices are formed by processing the one of the surfaces of the semiconductor wafer 100. The pre-semiconductor-chip portions 30P further include a plurality of electrode pads 34 disposed on the device-forming region 33, and a passivation film 35 disposed on the device-forming region 33. The passivation film 35 is made of an insulating material such as phospho-silicate-glass (PSG), silicon nitride, or polyimide resin. The passivation film 35 has a plurality of openings for exposing the top surfaces of the plurality of electrode pads 34. The plurality of electrode pads 34 are located in the positions corresponding to those of the plurality of electrodes 32 to be formed later, and are electrically connected to the devices formed in the device-forming region 33. Hereinafter, the surface of the pre-substructure wafer 101 located closer to the plurality of electrode pads 34 and the passivation film 35 will be referred to as the first surface 101a, and the opposite surface will be referred to as the second surface 101b.

In the step S101 of fabricating the layered substructure, next, a wafer sort test is performed to carry out the step S112 of distinguishing the plurality of pre-semiconductor-chip portions 30P included in the pre-substructure wafer 101 into non-malfunctioning pre-semiconductor-chip portions 30P and malfunctioning pre-semiconductor-chip portions 30P. In this step, a probe of a testing device is brought into contact with the plurality of electrode pads 34 of each pre-semiconductor-chip portion 30P so that whether the pre-semiconductor-chip portion 30P is non-malfunctioning or malfunctioning is tested with the testing device. In FIG. 23, the pre-semiconductor-chip portions 30P marked with "NG" are malfunctioning ones, and the other pre-semiconductor-chip portions 30P are non-malfunctioning ones. This step provides, as the distinction results, location information on non-malfunctioning pre-semiconductor-chip portions 30P and malfunctioning pre-semiconductor-chip portions 30P in each pre-substructure wafer 101. The location information is used in a step to be performed later. The passivation film 35 may be formed after the wafer sort test, and may thus be yet to be formed at the time of performing the wafer sort test.

Figure 26:
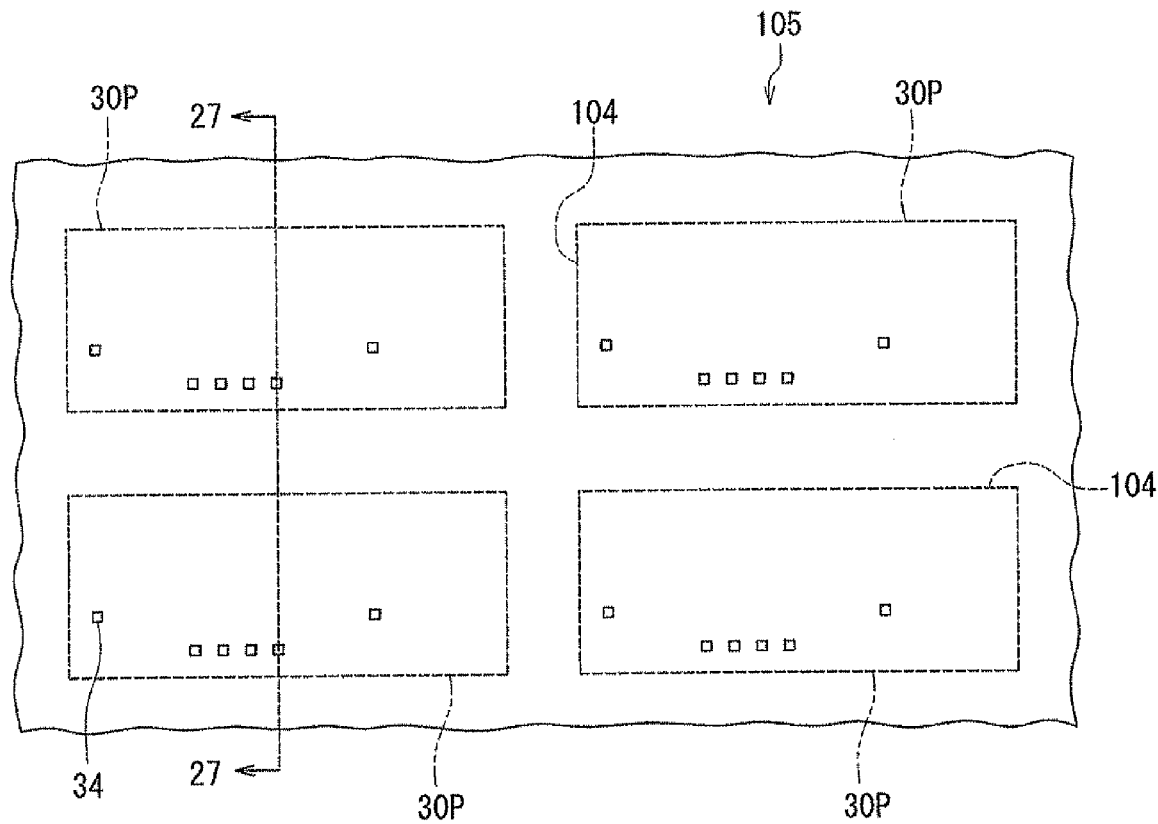
FIG. 26 is a plan view showing a step that follows the step shown in FIG. 24.
Figure 27:
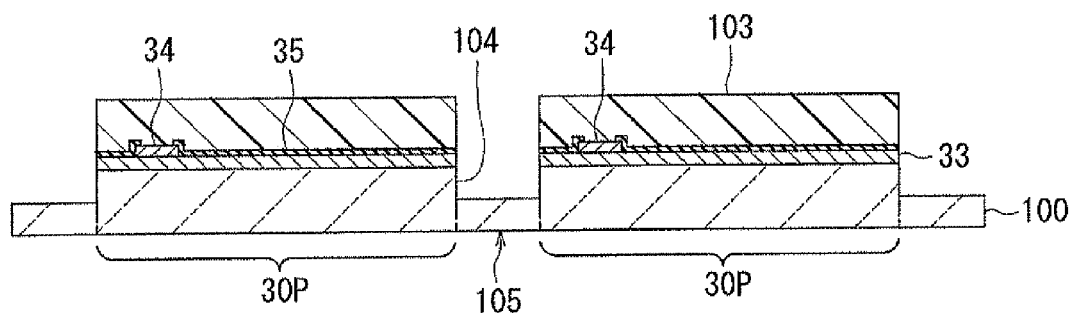
FIG. 27 shows a cross section taken along line 27-27 of FIG. 26.

FIG. 26 is a plan view showing a step that follows the step shown in FIG. 24. FIG. 27 shows a cross section taken along line 27-27 of FIG. 26. In this step, first, a protection layer 103 is formed to cover the first surface 101a of the pre-substructure wafer 101. The protection layer 103 is formed of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P. Note that the protection layer 103 is omitted in FIG. 26.

In the positions of the boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 have a width in the range of 50 to 150 μm, for example. The grooves 104 have a depth in the range of 20 to 80 μm, for example.

The grooves 104 may be formed using a dicing saw or by performing etching, for example. The etching may be reactive ion etching or anisotropic wet etching using KOH as the etching solution, for example. When forming the grooves 104 by etching, the protection layer 103 made of photoresist may be patterned by photolithography to form the etching mask. The protection layer 103 is removed after the formation of the grooves 104. A pre-polishing substructure main body 105 is thus formed by the pre-substructure wafer 101 with the plurality of grooves 104 formed therein.

Figure 28:
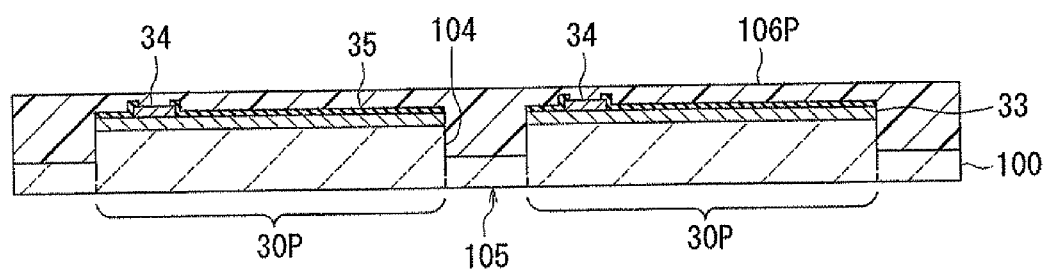
FIG. 28 is a cross-sectional view showing a step that follows the step shown in FIG. 27.

FIG. 28 shows a step that follows the step shown in FIG. 27. In this step, an insulating film 106P is formed to fill the plurality of grooves 104 of the pre-polishing substructure main body 105 and to cover the plurality of electrode pads 34 and the passivation film 35. The insulating film 106P is to become a part of the insulating portion 31 later. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

The insulating film 106P is preferably formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks that are recognizable through the insulating film 106P can be formed on the insulating film 106P. Such alignment marks facilitates alignment of a plurality of substructures to be stacked.

The insulating film 106P may include a first layer that fills the plurality of grooves 104 and a second layer that covers the first layer, the plurality of electrode pads 34 and the passivation film 35. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, asking or chemical mechanical polishing (CMP), before forming the second layer on the first layer.

If the passivation film 35 is not formed by the time of performing the wafer sort test, the second layer of the insulating film 106P may be used as the passivation film. In such a case, the second layer may be formed of an inorganic material such as silicon oxide or silicon nitride. If the second layer of the insulating film 106P is to be used as the passivation film, the plurality of openings for exposing the top surfaces of the plurality of electrode pads 34 are not formed in the second layer as initially formed.

Figure 29:
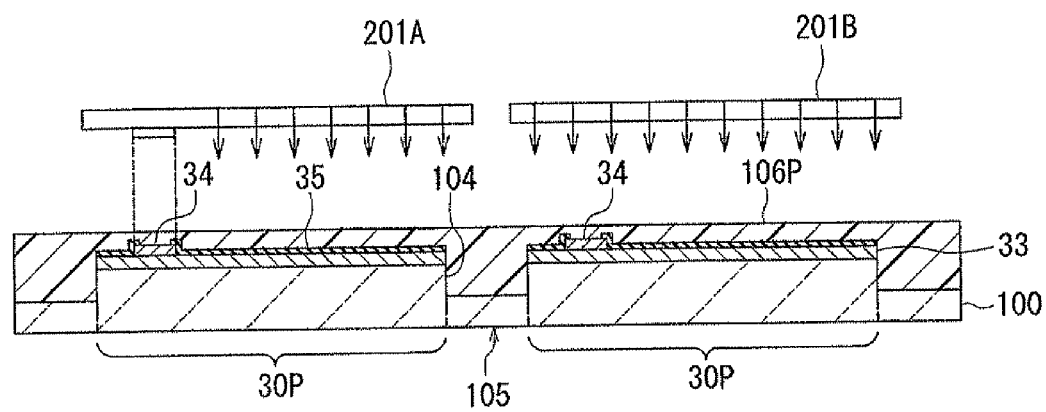
FIG. 29 is a cross-sectional view showing a step that follows the step shown in FIG. 28.
Figure 30:
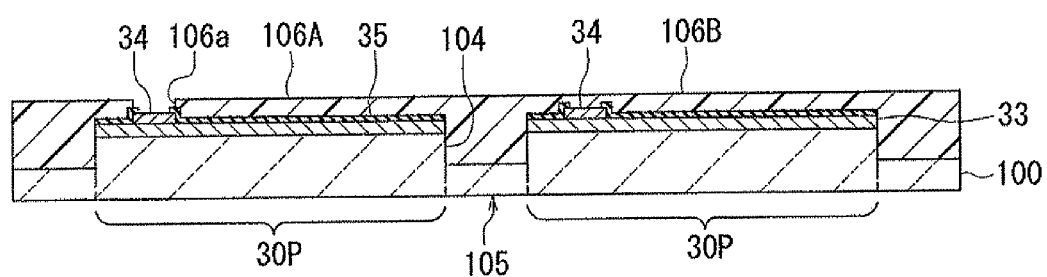
FIG. 30 is a cross-sectional view showing a step that follows the step shown in FIG. 29.

Reference is now made to FIG. 29 and FIG. 30 to describe the step of forming the plurality of openings for exposing the plurality of electrode pads 34 in the insulating film 106P in the non-malfunctioning pre-semiconductor-chip portions 30P. FIG. 29 shows a step that follows the step shown in FIG. 28. FIG. 30 shows a step that follows the step shown in FIG. 29.

Here, a description will initially be given of a case where either the entire insulating film 106P or the second layer of the insulating film 106P is formed of a negative photosensitive material and photolithography is employed to form the openings in the insulating film 106P. In this case, first, all the pre-semiconductor-chip portions 30P are simultaneously subjected to the exposure of the insulating film 106P by using a mask 201A shown in FIG. 29. The mask 201A has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is selectively exposed in the malfunctioning pre-semiconductor-chip portions 30P only, using a mask 201B shown in FIG. 29. This exposure process uses the distinction results obtained in the step S112 of distinguishing, that is, the location information on non-malfunctioning pre-semiconductor-chip portions 30P and malfunctioning pre-semiconductor-chip portions 30P in each pre-substructure wafer 101 which was obtained by the wafer sort test. In FIG. 29, the pre-semiconductor-chip portion 30P on the left is a non-malfunctioning one, whereas the pre-semiconductor-chip portion 30P on the right is a malfunctioning one. The mask 201B entirely transmits light. As a result of this exposure process, the entire insulating film 106P in the malfunctioning pre-semiconductor-chip portions 30P becomes insoluble in the developing solution.

Next, the insulating film 106P is developed with the developing solution. As a result, as shown in FIG. 30, a plurality of openings 106a for exposing the plurality of electrode pads 34 are formed in the insulating film 106P in the non-malfunctioning pre-semiconductor-chip portion 30P (the left side). On the other hand, no openings 106P are formed in the insulating film 106P in the malfunctioning pre-semiconductor-chip portion 30P (the right side). After the development, the area of the insulating film 106P corresponding to the non-malfunctioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 34, and is disposed around the plurality of electrode pads 34. The second-type insulating layer 106B covers the plurality of electrode pads 34 so as to avoid exposure.

Now, an example of the method for forming the plurality of openings 106a in the insulating film 106P will be described for the case where either the entire insulating film 106P or the second layer of the insulating film 106P is formed of a non-photosensitive material. In the example, a negative photoresist layer is initially formed on the insulating film 106P. The photoresist layer is then exposed and developed by the same method as with the exposure and development of the foregoing insulating film 106P. Consequently, in the non-malfunctioning pre-semiconductor-chip portions 30P, a plurality of openings are formed in the photoresist layer at positions corresponding to those of the plurality of electrode pads 34. Meanwhile, no opening is formed in the photoresist layer in the malfunctioning pre-semiconductor-chip portions 30P. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layers 106A and 106B.

Figure 31:
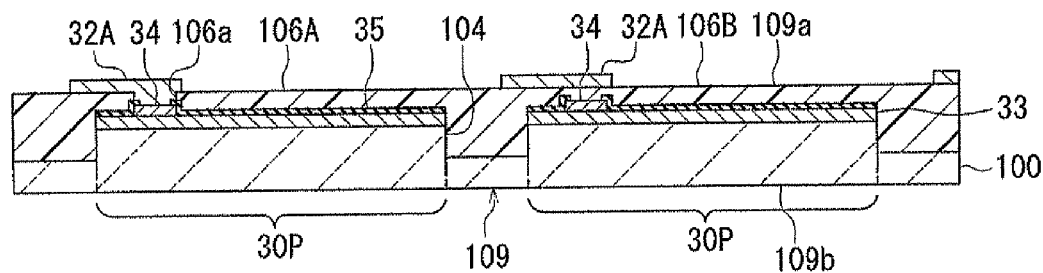
FIG. 31 is a cross-sectional view showing a step that follows the step shown in FIG. 30.
Figure 32:
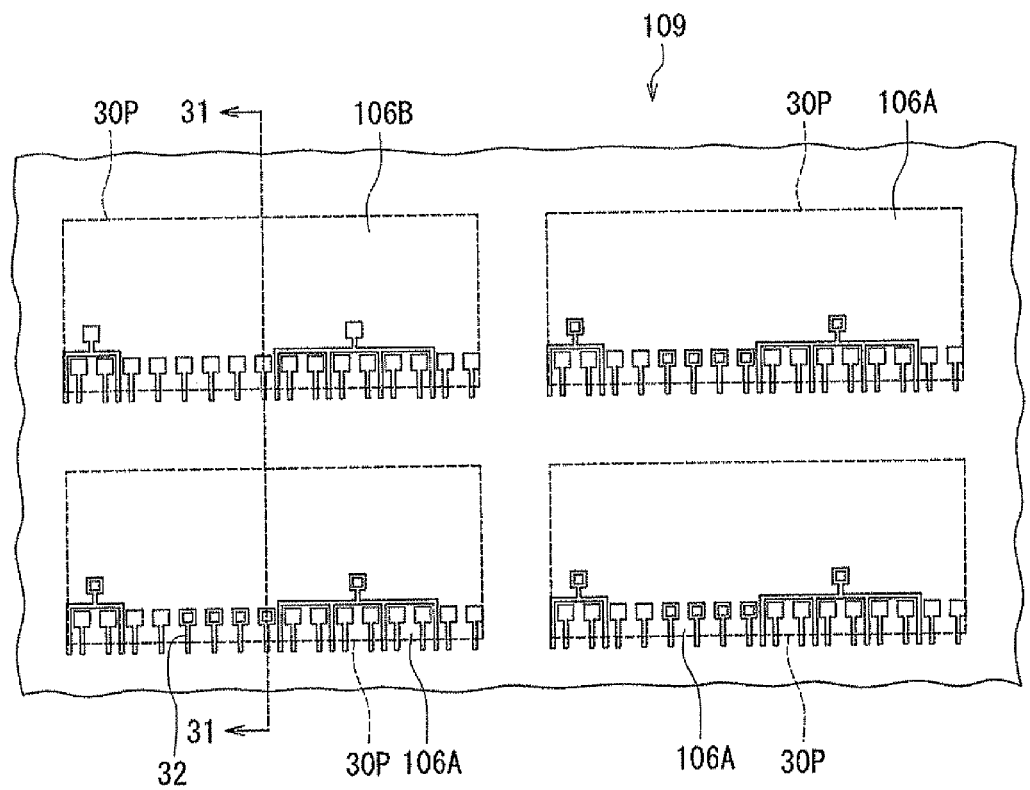
FIG. 32 is a plan view showing the step of FIG. 31.

FIG. 31 and FIG. 32 show a step that follows the step shown in FIG. 30. FIG. 31 shows a cross section taken along line 31-31 of FIG. 32. In this step, the electrodes 32 are formed on the insulating layers 106A and 106B by plating, for example. In each of the non-malfunctioning pre-semiconductor-chip portions 30P, the first-type electrodes 32A1 to 32A4 and the fourth-type electrodes 32D1 and 32D2 among the electrodes 32 are in contact with and electrically connected to the respective corresponding electrode pads 34 through the plurality of openings 106a of the insulating layer 106A. In each of the non-malfunctioning pre-semiconductor-chip portions 30P, none of the second-type and third-type electrodes 32B1 to 32B6 and 32C1 to 32C6 are in contact with the pre-semiconductor-chip portion 30P. In each of the malfunctioning pre-semiconductor-chip portions 30P, on the other hand, none of the electrodes 32 are in contact with the pre-semiconductor-chip portion 30P since no openings 106a are formed in the insulating layer 106B.

A series of steps illustrated in FIG. 28 to FIG. 32 correspond to the step S113 of forming the plurality of electrodes. In the step S113, as previously described, the plurality of electrodes 32 are formed so that the plurality of electrodes 32 are in contact with and electrically connected to the non-malfunctioning pre-semiconductor-chip portions 30P and are not in contact with the malfunctioning pre-semiconductor-chip portions 30P, by using the distinction results obtained in the step S112 of distinguishing.

In this way, there is fabricated a pre-polishing substructure 109 shown in FIG. 31 and FIG. 32. The pre-polishing substructure 109 has a first surface 109a corresponding to the first surface 101a of the pre-substructure wafer 101, and a second surface 109b corresponding to the second surface 101b of the pre-substructure wafer 101.

The electrodes 32 are formed of a conductive material such as Cu. In the case of forming the electrodes 32 by plating, a seed layer for plating is initially formed. Next, a photoresist layer is formed on the seed layer. The photoresist layer is then patterned by photolithography to form a frame that has a plurality of openings in which the electrodes 32 are to be accommodated later. Next, plating layers that are intended to constitute respective portions of the electrodes 32 are formed by plating on the seed layer in the openings of the frame. The plating layers have a thickness in the range of 5 to 15 μm, for example. Next, the frame is removed, and portions of the seed layer other than those lying under the plating layers are also removed by etching. The plating layers and the remaining portions of the seed layer under the plating layers thus form the electrodes 32.

Figure 33:
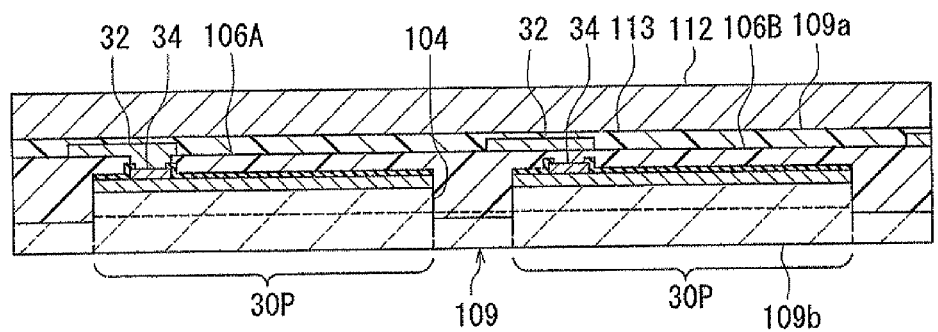
FIG. 33 is a cross-sectional view showing a step that follows the step shown in FIG. 31.

FIG. 33 shows a step that follows the step shown in FIG. 31. In this step, using an insulating adhesive, the pre-polishing substructure 109 is bonded to a plate-shaped jig 112 shown in FIG. 33, with the first surface 109a of the pre-polishing substructure 109 arranged to face a surface of the jig 112. The pre-polishing substructure 109 bonded to the jig 112 will hereinafter be referred to as a first pre-polishing substructure 109. In FIG. 33, the reference numeral 113 indicates an insulating layer formed by the adhesive.

Figure 34:
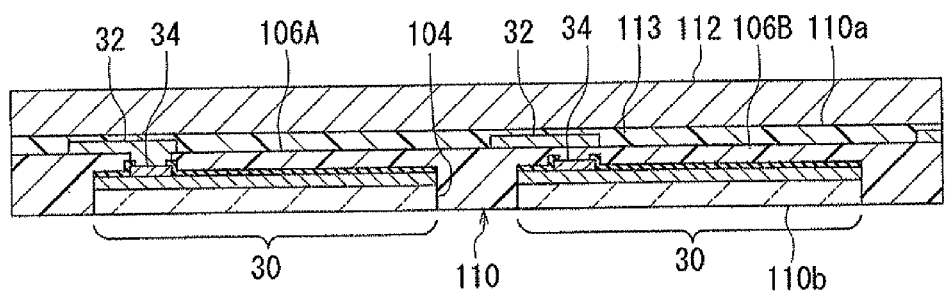
FIG. 34 is a cross-sectional view showing a step that follows the step shown in FIG. 33.

FIG. 34 shows a step that follows the step shown in FIG. 33. In this step, the second surface 109b of the first pre-polishing substructure 109 is polished. This polishing is performed until the plurality of grooves 104 are exposed. The broken line in FIG. 33 indicates the level of the second surface 109b after the polishing. By polishing the second surface 109b of the first pre-polishing substructure 109, the first pre-polishing substructure 109 is reduced in thickness, and a substructure 110 bonded to the jig 112 is thereby formed. The substructure 110 has a thickness of 20 to 80 μm, for example. Hereinafter, the substructure 110 bonded to the jig 112 will be referred to as a first substructure 110. The first substructure 110 has a first surface 110a corresponding to the first surface 109a of the first pre-polishing substructure 109, and a second surface 110b opposite to the first surface 110a. The second surface 110b is the polished surface. By polishing the second surface 109b of the first pre-polishing substructure 109 until the plurality of grooves 104 are exposed, the plurality of pre-semiconductor-chip portions 30P are separated from each other into individual semiconductor chips 30.

Figure 35:
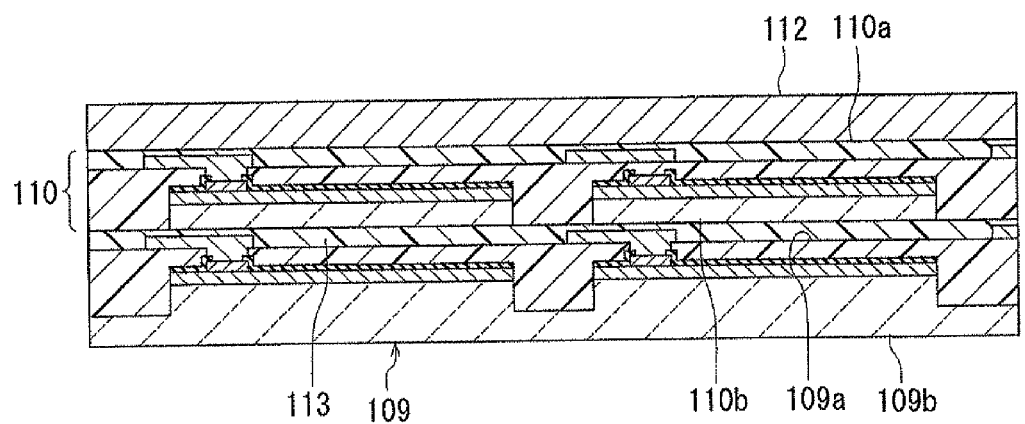
FIG. 35 is a cross-sectional view showing a step that follows the step shown in FIG. 34.

FIG. 35 shows a step that follows the step shown in FIG. 34. In this step, using an insulating adhesive, a pre-polishing substructure 109 is initially bonded to the first substructure 110 bonded to the jig 112. The pre-polishing substructure 109 is bonded to the first substructure 110 with the first surface 109a arranged to face the polished surface, i.e., the second surface 110b, of the first substructure 110. Hereinafter, the pre-polishing substructure 109 bonded to the first substructure 110 will be referred to as a second pre-polishing substructure 109. The insulating layer 113 formed by the adhesive between the first substructure 110 and the second pre-polishing substructure 109 covers the electrodes 32 of the second pre-polishing substructure 109, and is to become part of the insulating portion 31 later.

Next, although not illustrated, the second surface 109b of the second pre-polishing substructure 109 is polished. This polishing is performed until the plurality of grooves 104 are exposed. By polishing the second surface 109b of the second pre-polishing substructure 109, the second pre-polishing substructure 109 is reduced in thickness, and a second substructure 110 bonded to the first substructure 110 is thereby formed. The second substructure 110 has a thickness of, for example, 20 to 80 μm, as does the first substructure 110.

Figure 36:
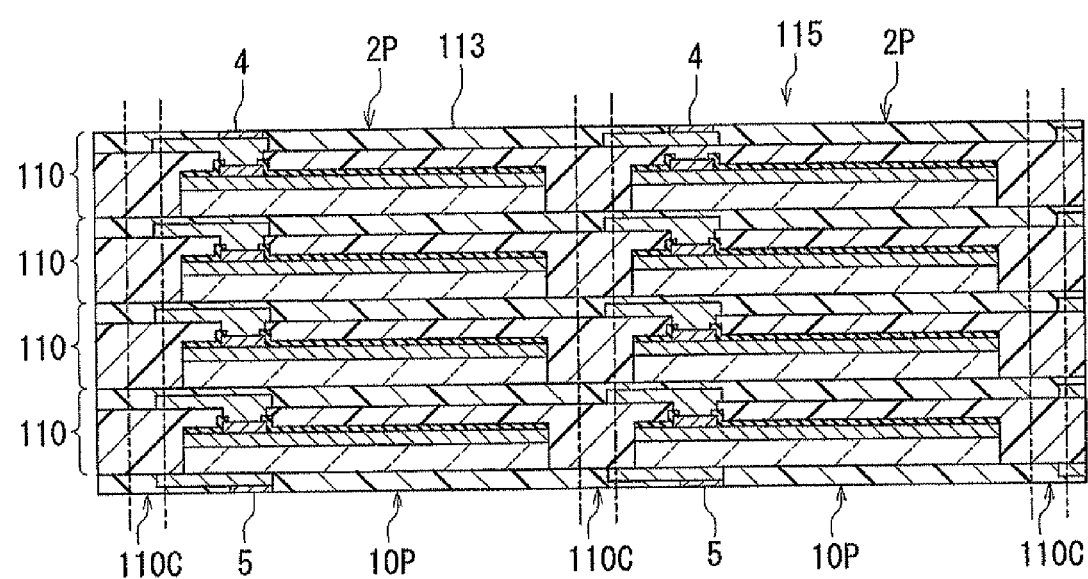
FIG. 36 is a cross-sectional view showing a part of a layered substructure fabricated in a step that follows the step shown in FIG. 35.

The same step as shown in FIG. 35 may subsequently be repeated to form three or more substructures 110 into a stack. FIG. 36 shows a step that follows the step shown in FIG. 35. After the same step as shown in FIG. 35 is repeated to form a predetermined number of substructures 110 into a stack, the stack of the predetermined number of substructures 110 is released from the jig 112. FIG. 36 shows an example where a stack of four substructures 110 is formed.

Next, part of the insulating layer 113 is removed from the uppermost substructure 110 of the stack by, for example, etching, whereby the plurality of electrodes 32 except the electrodes 32D1 and 32D2 are exposed in part to form a plurality of conductor pads. Next, a plurality of conductor layers are formed on the plurality of conductor pads, whereby the plurality of top terminals 4 are formed. The parts of the plurality of electrodes 32 covered with the insulating layer 113 constitute the top wiring 4W.

Next, the plurality of bottom terminals 5, the bottom wiring 5W, and the insulating layer 8 are formed on the bottom surface of the lowermost substructure 110 of the stack. The plurality of terminals 5 and the bottom wiring 5W are each formed of a conductive material such as Cu or Au. The plurality of bottom terminals 5, the bottom wiring 5W, and the insulating layer 8 are formed in the following manner, for example. Initially, a first conductor layer, which is to become the bottom wiring 5W and respective parts of the plurality of bottom terminals 5, is formed on the bottom surface of the lowermost substructure 110 of the stack by plating, for example. Next, the insulating layer 8 is formed to cover the first conductor layer. Part of the insulating layer 8 is then removed by etching, for example. The first conductor layer is thereby exposed in part to form a plurality of conductor pads. Next, a plurality of second conductor layers are formed on the plurality of conductor pads, whereby the plurality of bottom terminals 5 are formed. The bottom terminals 5 are each composed of the conductor pad and the second conductor layer. The part of the first conductor layer covered with the insulating layer 8 constitutes the bottom wiring 5W.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 μm, for example. If the terminals 4 are to include the solder layer, the solder layer is formed on the surface of each of the electrodes 32 of the uppermost substructure 110 directly or via an underlayer by plating, for example. If the terminals 5 are to include the solder layer, the first conductor layer to become respective parts of the terminals 5 is formed on the bottom surface of the lowermost substructure 110 of the stack, using a conductive material such as Cu or Au. The solder layer as the second conductor layer is then formed on the surface of the first conductor layer directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

In this way, there is formed a layered substructure 115 including a plurality of stacked substructures 110. Each of the substructures 110 includes a plurality of preliminary layer portions 10P that are arrayed. Each of the preliminary layer portions 10P is to become any one of the layer portions 10 included in the main part 2M of the main body 2. The substructures 110 are to be cut later at the positions of the boundaries between every adjacent preliminary layer portions 10P.

In FIG. 36, the reference symbol 110C indicates the cutting positions in the substructures 110. The layered substructure 115 includes a plurality of main bodies 2 that are arrayed. The plurality of main bodies 2 are to be separated from each other later. Hereinafter, each of yet-to-be separated main bodies 2 will be referred to as a pre-separation main body 2P. In the example shown in FIG. 36, each single pre-separation main body 2P includes four preliminary layer portions 10P.

A series of steps illustrated in FIG. 33 to FIG. 36 correspond to the step S114 of stacking a plurality of substructures. The layered substructure 115 is fabricated in the step S114. Next, the step S115 of identifying the position of the at least one specific main body 2S included in the layered substructure 115 is performed. In the step S115, the position of the at least one specific main body 2S in the layered substructure 115 and the position of the at least one second-type layer portion 10B in the specific main body 2S are identified by using the distinction results obtained in the step S112 of distinguishing. The step S112 of distinguishing provides, as the distinction results, the location information on non-malfunctioning pre-semiconductor-chip portions 30P and malfunctioning pre-semiconductor-chip portions 30P in each pre-substructure wafer 101. This means that the location information on non-malfunctioning pre-semiconductor-chip portions 30P and malfunctioning pre-semiconductor-chip portions 30P is obtained for each of the substructures 110 included in the layered substructure 115. The location information serves to identify the position of the at least one specific main body 2S in the layered substructure 115 and the position of the at least one second-type layer portion 10B in the specific main body 2S.

Figure 37:
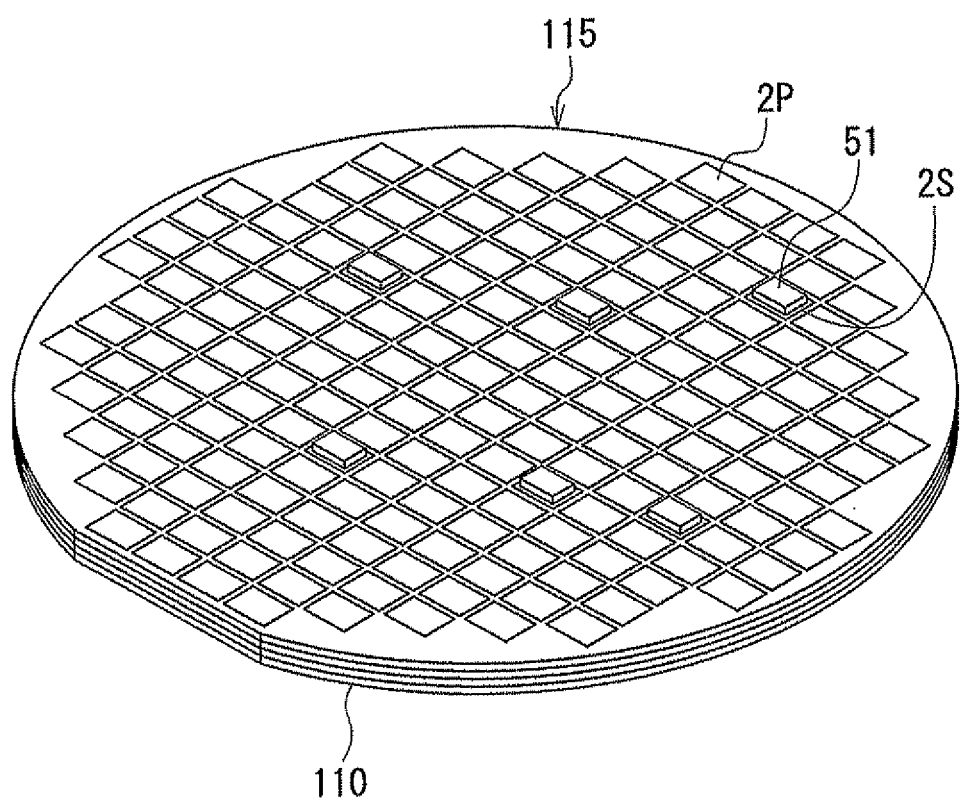
FIG. 37 is a perspective view showing the step of joining additional package(s) to the layered substructure.

Reference is now made to FIG. 37 to describe the step S102 of joining at least one additional package 51 to the layered substructure 115. The step S115 preceding the step S102 has identified the position of the at least one specific main body 2S in the layered substructure 115. The step S102 uses the identification results to join at least one additional package 51 to the at least one specific main body 2S in the layered substructure 115. By way of example, FIG. 37 shows a state where six additional packages 51 are joined to the layered substructure 115 including six specific main bodies 2S. The step S102 can be performed with a chip bonding apparatus that is capable of recognizing and controlling the positions of chips.

The step S115 has also identified the position of the at least one second-type layer portion 10B in the specific main body 2S. When joining the additional package 51 to the specific main body 2S in the step S102, the identification results are used to position the additional package 51 with respect to the specific main body 2S in one of the first to fourth relative positional relationships that is selected in accordance with which position in the specific main body 2S the semiconductor chip 30 of the second-type layer portion 10B to be substituted with the additional semiconductor chip 80 is located at.

Specifically, if the layer portion 10S1 in the specific main body 2S is the second-type layer portion 10B and the additional semiconductor chip 80 is to substitute for the semiconductor chip 30 of this layer portion 10B, then the additional package 51 is positioned with respect to the specific main body 2S in the first relative positional relationship shown in FIG. 11 and FIG. 12.

If the layer portion 10S2 in the specific main body 2S is the second-type layer portion 10B and the additional semiconductor chip 80 is to substitute for the semiconductor chip 30 of this layer portion 10B, then the additional package 51 is positioned with respect to the specific main body 2S in the second relative positional relationship shown in FIG. 13 and FIG. 14.

If the layer portion 10S3 in the specific main body 2S is the second-type layer portion 10B and the additional semiconductor chip 80 is to substitute for the semiconductor chip 30 of this layer portion 10B, then the additional package 51 is positioned with respect to the specific main body 2S in the third relative positional relationship shown in FIG. 15 and FIG. 16.

If the layer portion 10S4 in the specific main body 2S is the second-type layer portion 10B and the additional semiconductor chip 80 is to substitute for the semiconductor chip 30 of this layer portion 10B, then the additional package 51 is positioned with respect to the specific main body 2S in the fourth relative positional relationship shown in FIG. 17 and FIG. 18.

Reference is now made to FIG. 38 to FIG. 41 to describe in detail the step S103 of producing a plurality of layered chip packages from the layered substructure 115 with at least one additional package 51 joined thereto. The following will describe an example where the layered substructure 115 of FIG. 36, which includes four stacked substructures 110, is used to produce a plurality of layered packages each of which includes four layer portions 10.

Figure 38:
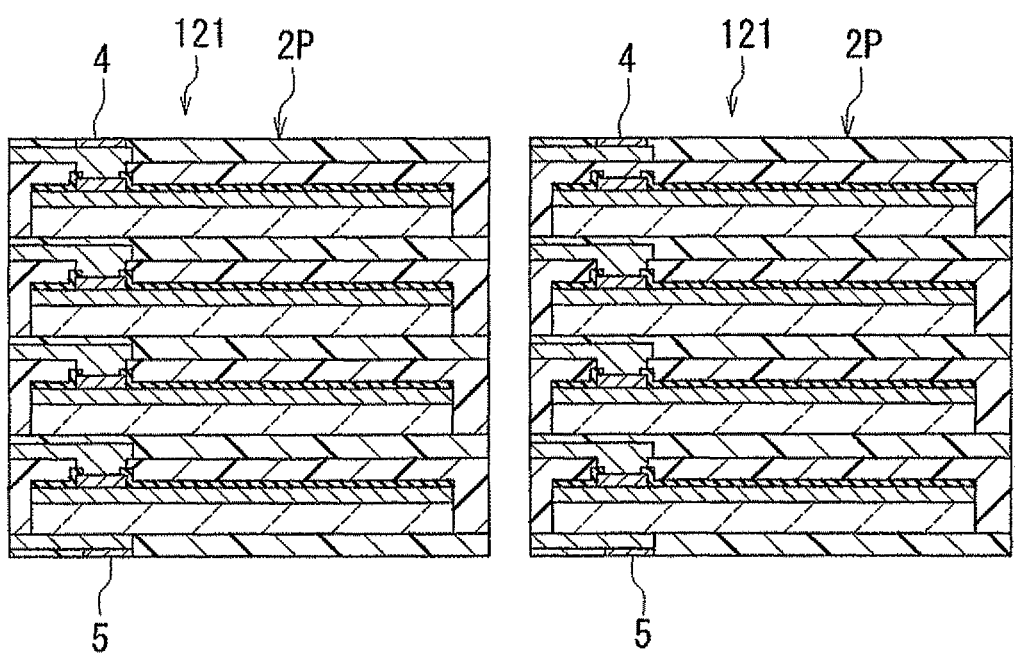
FIG. 38 is a cross-sectional view showing the step of forming blocks by cutting the layered substructure shown in FIG. 37.
Figure 39:
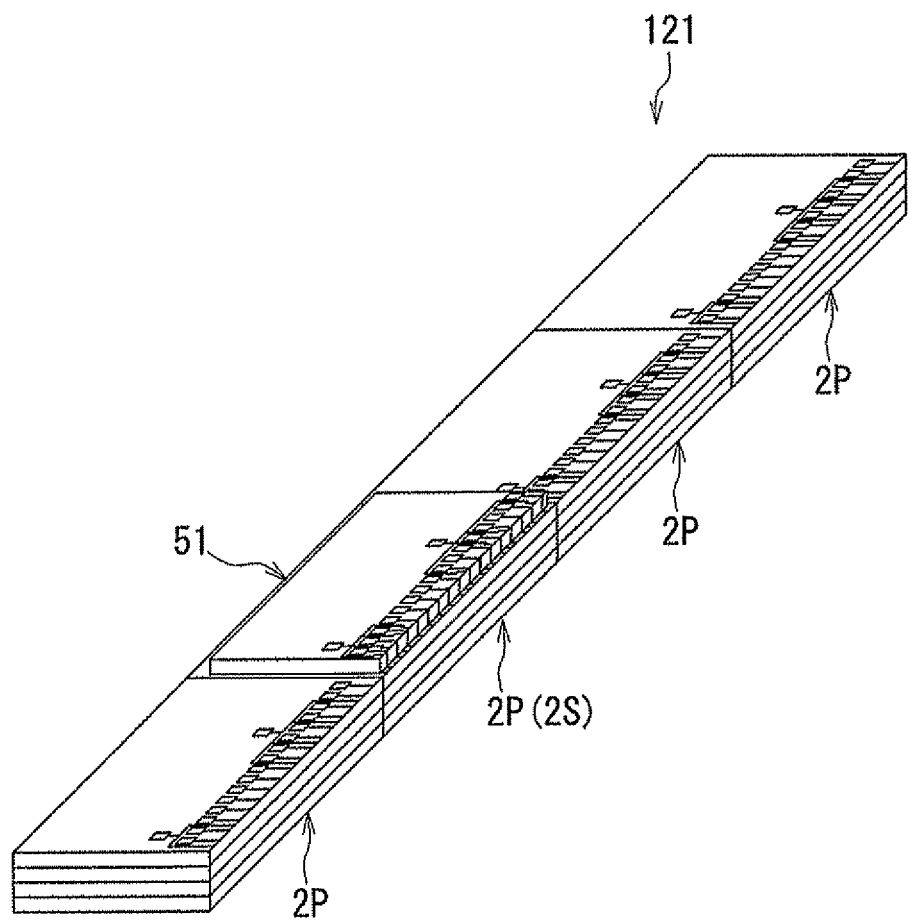
FIG. 39 is a perspective view showing a block formed in the step shown in FIG. 38.

FIG. 38 shows a step that follows the step shown in FIG. 36. In this step, the layered substructure 115 is cut at the cutting positions 110C shown in FIG. 36 into blocks 121 in each of which a plurality of pre-separation main bodies 2P are aligned. In this step, the layered substructure 115 is cut to expose the respective surfaces of the pre-separation main bodies 2P included in each block 121 on which the wiring 3 is to be formed later. FIG. 39 shows an example of the block 121 formed in the step shown in FIG. 38. In this example, the block 121 includes four pre-separation main bodies 2P. However, the number of the pre-separation main bodies 2P included in each block 121 is not limited to four, and may be any plural number. Further, FIG. 39 shows an example in which one of the four pre-separation main bodies 2P is the specific main body 2S.

Figure 40:
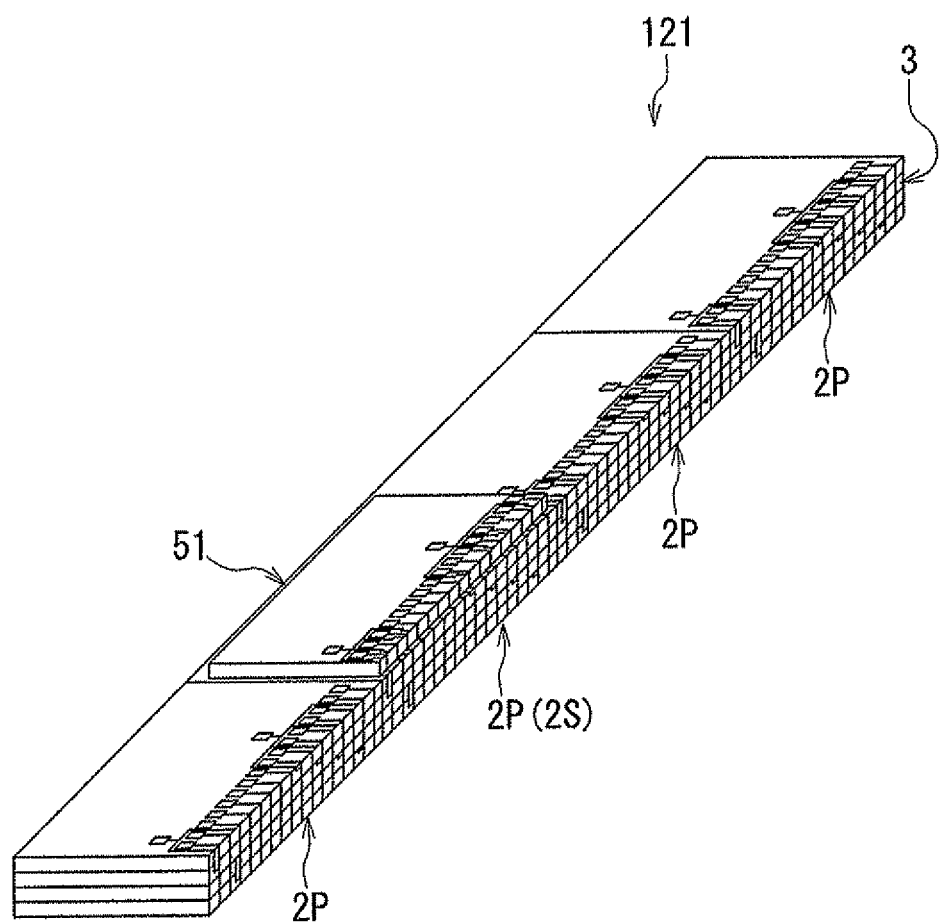
FIG. 40 is a perspective view showing the step of forming wiring on all of pre-separation main bodies included in the block shown in FIG. 39.

Next, as shown in FIG. 40, the wiring 3 is formed simultaneously on all the pre-separation main bodies 2P included in the block 121 shown in FIG. 39. In this step, a plurality of blocks 121 may be gathered with their respective surfaces for the wiring 3 to be formed thereon upward, and the wiring 3 may then be formed simultaneously on all the pre-separation main bodies 2P that the plurality of blocks 121 include.

In the case of forming the wiring 3 by plating, a seed layer for plating is first formed on the surfaces on which the wiring 3 is to be formed. Then, a photoresist layer is formed on the seed layer and the photoresist layer is patterned by photolithography to thereby form a frame having a plurality of openings that are to later accommodate a plurality of units of wiring 3 corresponding to the plurality of pre-separation main bodies 2P. Next, plating layers to constitute portions of the wiring 3 are formed by plating on the seed layer in the openings of the frame. The frame is then removed, and portions of the seed layer other than those lying under the plating layers are also removed by etching. The plating layers and the remaining portions of the seed layer under the plating layers thus form the wiring 3. The wiring 3 is formed for each of the pre-separation main bodies 2P.

Figure 41:
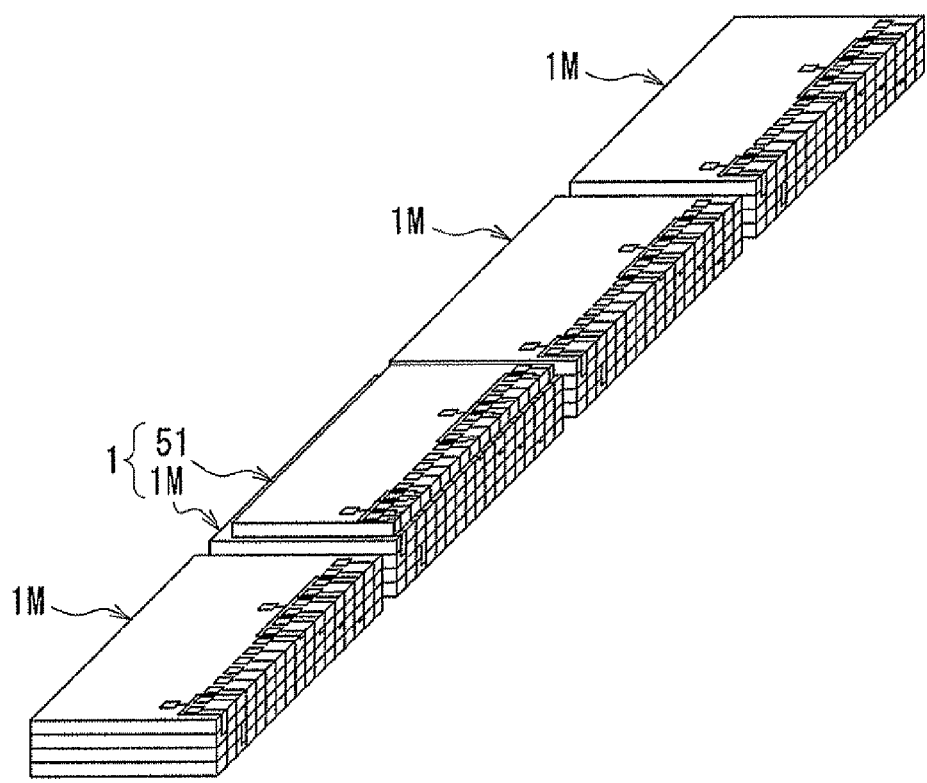
FIG. 41 is a perspective view showing the step of separating a plurality of main bodies from each other by cutting the block shown in FIG. 40.

Next, as shown in FIG. 41, the block 121 is cut at the positions of the boundaries between every two adjacent pre-separation main bodies 2P to separate the plurality of pre-separation main bodies 2P from each other. This makes the pre-separation main bodies 2P into main bodies 2, thereby producing a plurality of layered chip packages. Of the plurality of layered chip packages, ones that include no additional package 51 are each composed only of the main package 1M. Of the plurality of layered chip packages, ones that include additional packages 51 are composite layered chip packages 1 each of which has the main package 1M and the additional package 51.

So far the description has dealt with the case where the layered substructure 115 including four substructures 110 as shown in FIG. 36 is used to produce a plurality of main packages 1M each of which includes four layer portions 10. In the present embodiment, however, the number of the substructures 110 to be included in the layered substructure 115 can be varied to produce main packages 1M with different numbers of layer portions 10. Further, in the present embodiment, a structure composed of a single substructure 110 with a plurality of bottom terminals 55 formed on its bottom surface may be fabricated instead of the layered substructure 115, and such a structure may be used instead of the layered substructure 115 to produce a plurality of packages each of which includes only a single layer portion 10. It is thereby possible to produce a plurality of additional packages 51 such as ones shown in FIG. 7 and FIG. 8.

The effects of the manufacturing method for the layered chip packages according to the present embodiment will now be described. The manufacturing method uses a layered substructure 115 including at least one specific main body 2S, and joins at least one additional package 51 to the at least one specific main body 2S included in the layered substructure 115. The layered substructure 115 with the at least one additional package 51 joined thereto is then cut to separate a plurality of main bodies 2 from each other to produce a plurality of layered chip packages. In the specific main body 2S, the plurality of layer portions 10 of the main part 2M include at least one first-type layer portion 10A and at least one second-type layer portion 10B. In the present embodiment, a composite layered chip package 1 including a main package 1M and an additional package 51 is formed by joining the additional package 51 to the specific main body 2S. The additional semiconductor chip 80 of the additional package 51 is to substitute for a defective semiconductor chip 30 included in the second-type layer portion 10B. According to the present embodiment, it is thus possible to provide a composite layered chip package 1 which is a layered chip package that includes a plurality of stacked semiconductor chips 30 and is capable of providing, even if a defective semiconductor chip 30 is included therein, the same functions as those for the case where no defective semiconductor chip 30 is included.

The present embodiment does not join an additional package 51 to a discrete specific main body 2S but joins at least one additional package 51 to at least one specific main body 2S included in the layered substructure 115. It is not easy to join an additional package 51 to a discrete specific main body 2S since the specific main body 2S and the additional package 51 are both extremely small. In contrast, the present embodiment joins the additional package 51 to a predetermined position, i.e., the position at which the specific main body 2S is located, in the layered substructure 115 which is much larger than a discrete specific main body 2S. This can be easily accomplished by using a chip bonding apparatus.

Further, when the layered substructure 115 includes a plurality of specific main bodies 2S, the operation of joining a plurality of additional packages 51 to the plurality of specific main bodies 2S can be performed continuously with the single layered substructure 115 kept mounted on the chip bonding apparatus.

Consequently, according to the present embodiment, it is possible to manufacture a plurality of layered chip packages including at least one composite layered chip package 1 easily at low cost.

Further, in the present embodiment, the position of the at least one specific main body 2S in the layered substructure 115 and the position of the at least one second-type layer portion 10B in the specific main body 2S are identified in the step S115. In the step 5102, when joining the additional package 51 to the specific main body 2S, the identification results obtained in the step S115 are used to position the additional package 51 with respect to the specific main body 2S in one of the first to fourth relative positional relationships that is selected in accordance with which position in the specific main body 2S the semiconductor chip 30 of the second-type layer portion 10B to be substituted with the additional semiconductor chip 80 is located at. Thus, in the present embodiment, the additional semiconductor chip 80 of the additional package 51 of one type can serve as a substitute for the defective semiconductor chip 30 of a second-type layer portion 10B no matter which position in the specific main body 2S the second-type layer portion 10B is located at. Consequently, the present embodiment makes it possible to provide the composite layered chip package 1 at low cost.

In the present embodiment, the plurality of top terminals 4 in the main package 1M are formed by using the plurality of electrodes 32 of the uppermost layer portion 10 in the main part 2M. According to the present embodiment, such a configuration makes it possible to form the plurality of electrodes 32 in the same layout across all the layer portions 10 in the main part 2M and to form the plurality of top terminals 4 by using the plurality of electrodes 32 of the uppermost layer portion 10.

In the present embodiment, defective semiconductor chips 30 are not electrically connected to the wiring 3. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the composite layered chip package 1.

The main package of the present invention may have a configuration in which the positions of the terminals 4 and 5 are vertically reversed from those in the main package 1M shown in FIG. 2 and FIG. 3. Such a main package will hereinafter be referred to as a modified main package. The additional package of the present invention may have a configuration in which the positions of the terminals 54 and 55 are vertically reversed from those in the additional package 51 shown in FIG. 7 and FIG. 8. Such an additional package will hereinafter be referred to as a modified additional package.

The composite layered chip package of the present invention may be a combination of the modified main package and the modified additional package. Such a composite layered chip package will hereinafter be referred to as a modified composite layered chip package. In the modified composite layered chip package, the plurality of first terminals are, disposed on the bottom surface 2Mb of the main part 2M of the modified main package. The at least one second terminal and the plurality of third terminals are disposed on the top surface 52a of the additional package main body 52 of the modified additional package, and the plurality of fourth terminals are disposed on the bottom surface 52b of the additional package main body 52. The modified composite layered chip package can be constructed by placing the modified additional package below the modified main package and joining every two mutually contacting terminals to each other.

Second Embodiment

Figure 42:
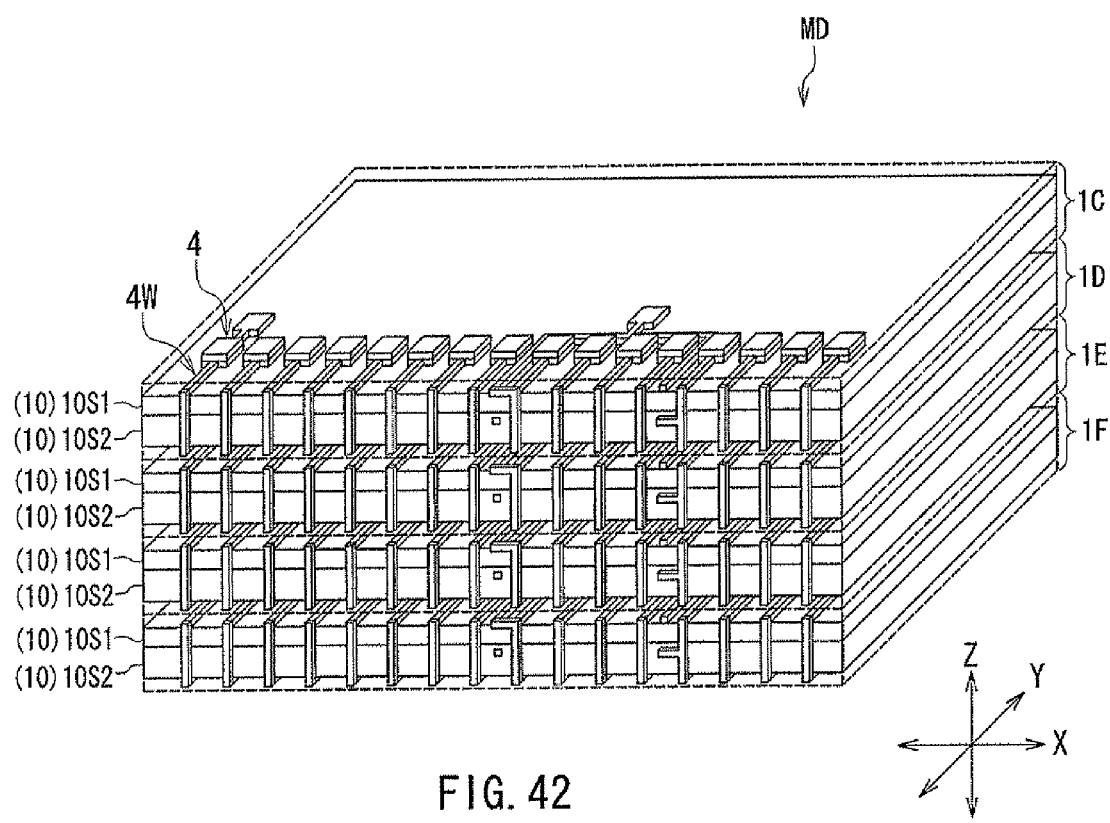
FIG. 42 is a perspective view of a module of a second embodiment of the invention.
Figure 43:
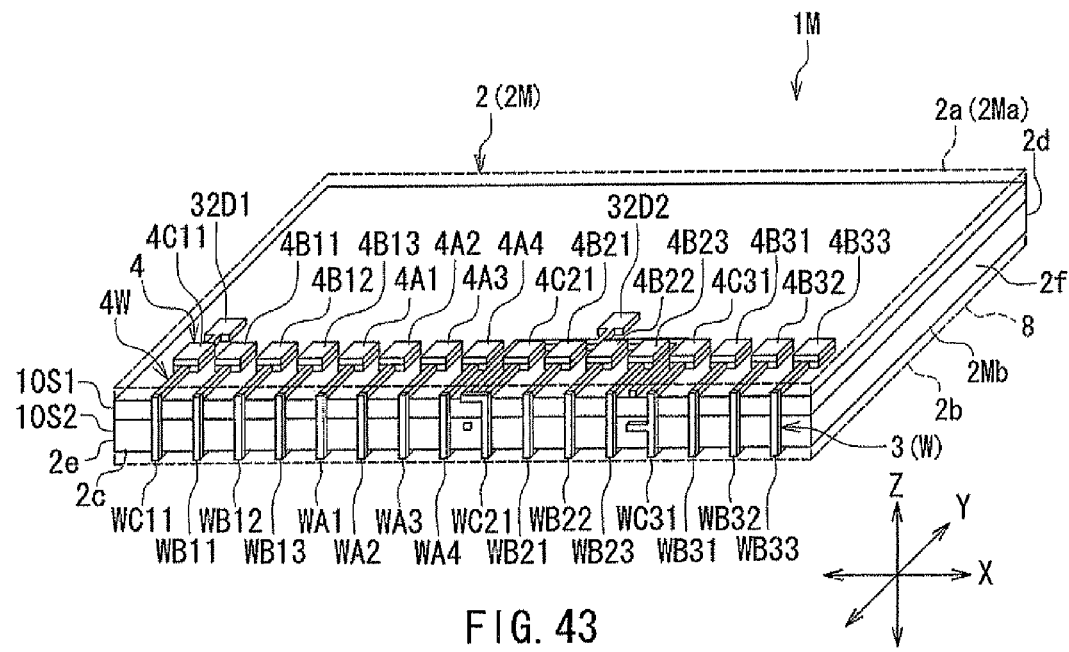
FIG. 43 is a perspective view of a main package of the second embodiment of the invention.
Figure 44:
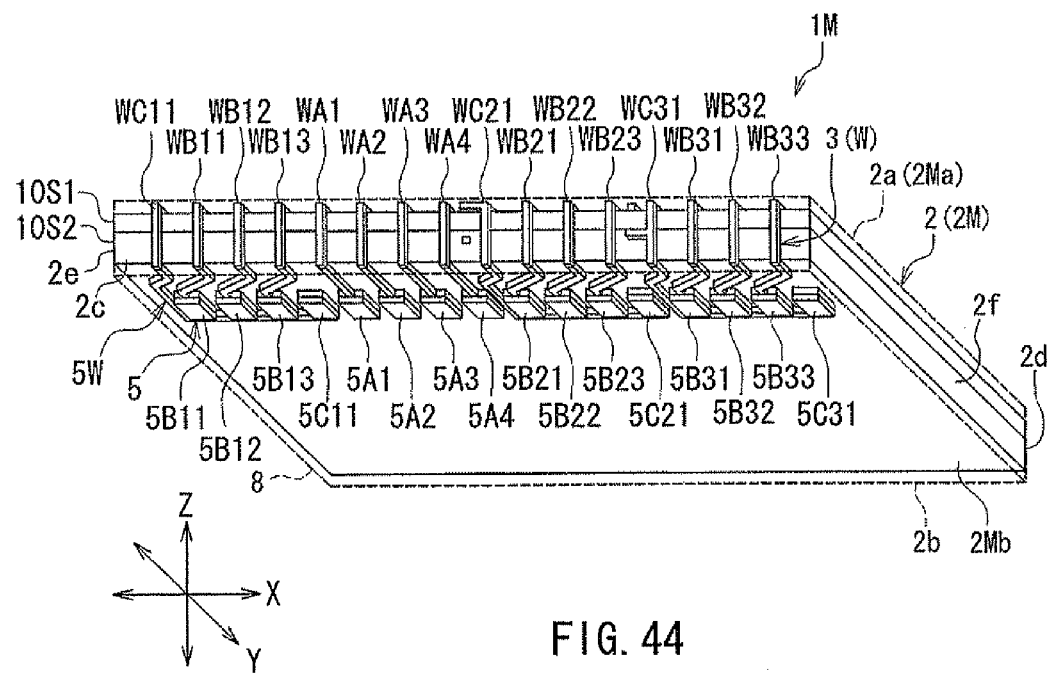
FIG. 44 is a perspective view showing the main package of FIG. 43 as viewed from below.
Figure 45:
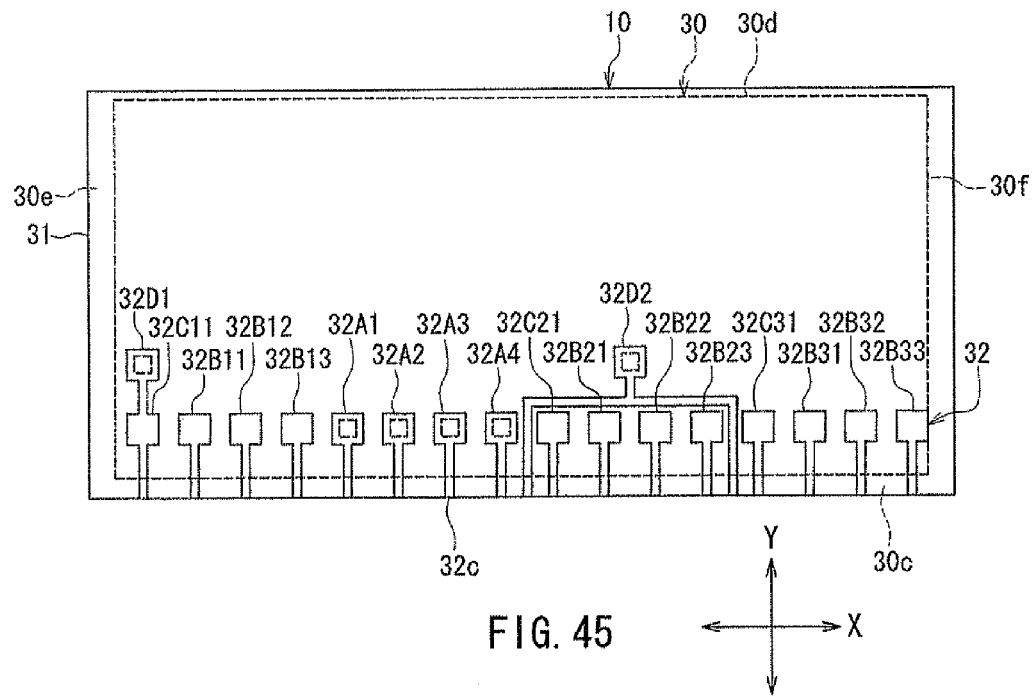
FIG. 45 is a plan view showing a layer portion included in the main package of FIG. 43.
Figure 46:
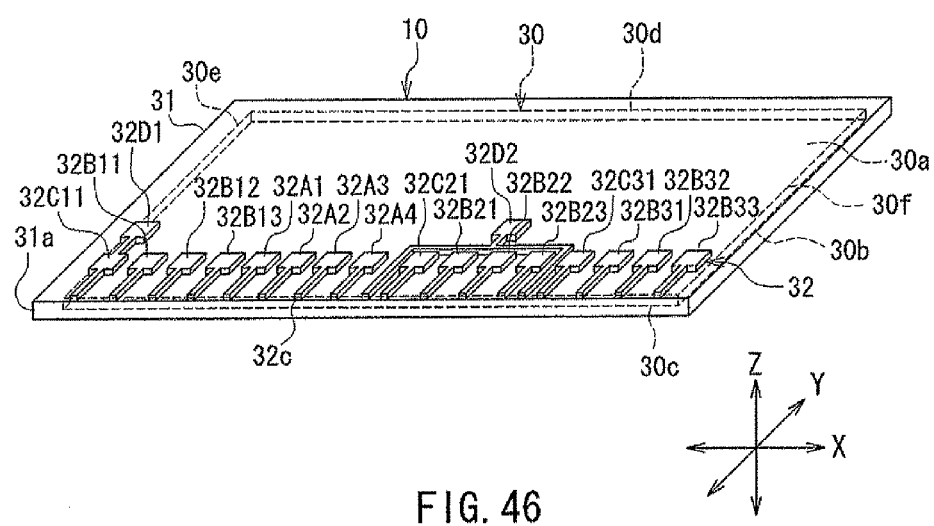
FIG. 46 is a perspective view of the layer portion shown in FIG. 45.
Figure 47:
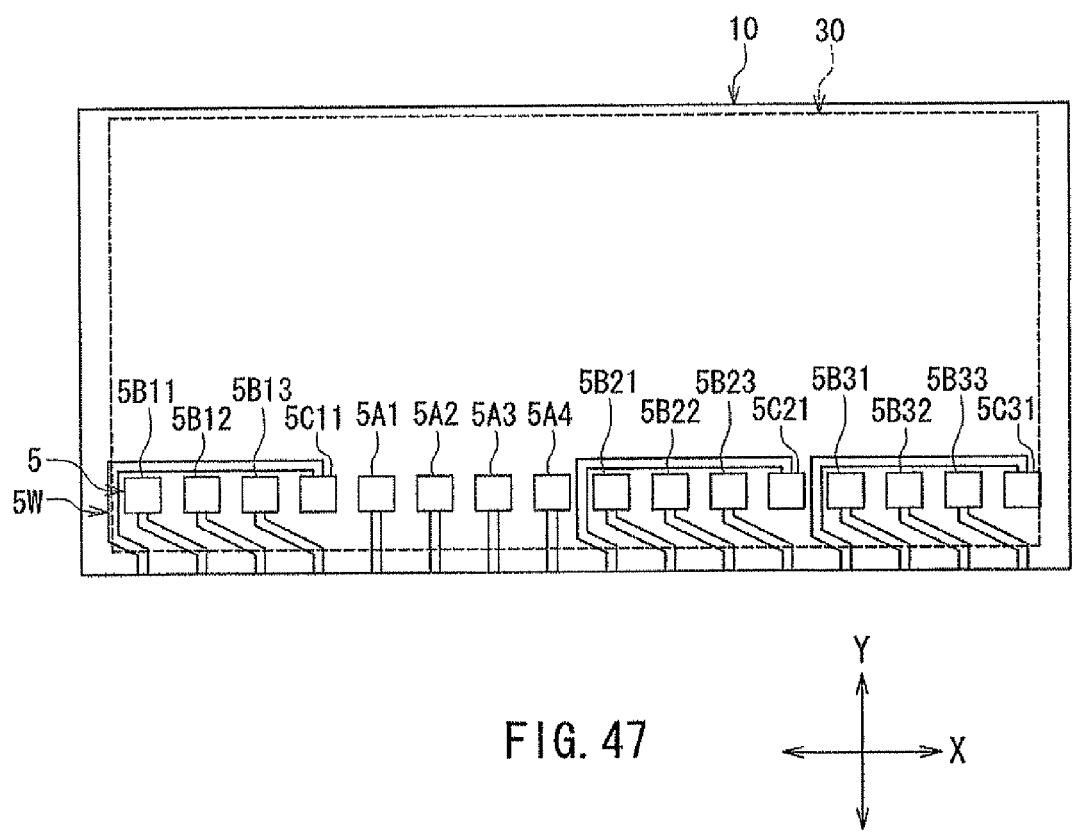
FIG. 47 is a plan view showing a plurality of bottom terminals and bottom wiring of the main package of FIG. 43 as viewed from above.

A second embodiment of the invention will now be described. First, reference is made to FIG. 42 to FIG. 47 to describe the configuration of the main package of the present embodiment. FIG. 42 is a perspective view of a module including four main packages of the present embodiment. FIG. 43 is a perspective view of a single main package of the present embodiment. FIG. 44 is a perspective view showing the main package of FIG. 43 as viewed from below. FIG. 45 is a plan view showing a layer portion included in the main package of FIG. 43. FIG. 46 is a perspective view of the layer portion shown in FIG. 45. FIG. 47 is a plan view showing a plurality of bottom terminals and bottom wiring of the main package of FIG. 43 as viewed from above.

The module MD shown in FIG. 42 includes four main packages 1C, 1D, 1E, and 1F that are stacked and electrically connected to each other. The main packages 1C, 1D, 1E, and 1F are arranged in this order from the top. In the following description, any main package will be represented by reference symbol 1M.

As shown in FIG. 43 and FIG. 44, the main package 1M includes a main body 2 that has a top surface 2a, a bottom surface 2b, and four side surfaces 2c, 2d, 2e and 2f, as in the first embodiment. The main package 1M further includes wiring 3 that includes a plurality of conductive paths W disposed on at least one of the four side surfaces of the main body 2. In the example shown in FIG. 43 and FIG. 44, the plurality of conductive paths W are disposed only on the side surface 2c. The main body 2 includes a main part 2M. The main part 2M has a top surface 2Ma and a bottom surface 2Mb and includes a plurality of layer portions 10 that are stacked.

As in the first embodiment, the main body 2 further includes a plurality of top terminals 4, a plurality of bottom terminals 5, top wiring 4W, bottom wiring 5W, and an insulating layer 8. In FIG. 43 and FIG. 44, the insulating layer 8 is shown by broken lines.

The plurality of bottom terminals 5 are positioned to overlap the plurality of top terminals 4 as viewed in the direction perpendicular to the top surface 2a of the main body 2 (the Z direction). Accordingly, when the four main packages 1M are vertically arranged, the plurality of bottom terminals 5 of the upper one of two vertically adjacent main packages 1M are opposed to the plurality of top terminals 4 of the lower one. In the present embodiment, when the four main packages 1M are stacked one on top of another, the plurality of bottom terminals 5 of the upper one of two vertically adjacent main packages 1M are joined to and electrically connected to the plurality of top terminals 4 of the lower one.

In the present embodiment, in particular, the number of the layer portions 10 included in the main part 2M is two. The two layer portions 10 are stacked between the top surface 2Ma and the bottom surface 2Mb of the main part 2M. The two layer portions 10 are joined to each other with an adhesive, for example. In the following description, when the two layer portions 10 included in the main package 1M shown in FIG. 43 and FIG. 44 are to be shown distinctively, the upper layer portion 10 will be designated by reference symbol 10S1 and the lower layer portion 10 by reference symbol 10S2.

As shown in FIG. 45 and FIG. 46, the configuration of the layer portions 10 in the present embodiment is the same as that in the first embodiment except for the configuration of the plurality of electrodes 32.

In at least one of the two layer portions 10 in a single main package 1M, the semiconductor chip 30 is electrically connected to two or more of the plurality of conductive paths W via two or more of the plurality of electrodes 32.

A detailed description will now be given of the plurality of terminals 4 and 5, the plurality of conductive paths W, and the plurality of electrodes 32 of the present embodiment. In the present embodiment, the plurality of bottom terminals 5 are electrically connected to corresponding ones of the plurality of top terminals 4 via the conductive paths W to constitute a plurality of pairs of top and bottom terminals 4 and 5. The top terminal 4 and the bottom terminal 5 in each of the plurality of pairs are electrically connected to each other. The plurality of pairs include a plurality of non-overlapping terminal pairs. Each of the non-overlapping terminal pairs consists of any one of the top terminals 4 and any one of the bottom terminals 5, the top and bottom terminals 4 and 5 in each of the non-overlapping terminal pairs being electrically connected to each other and being positioned not to overlap each other as viewed in the direction perpendicular to the top surface 2a of the main body 2 (the Z direction). The plurality of pairs further include a plurality of overlapping terminal pairs. Each of the overlapping terminal pairs consists of any one of the top terminals 4 and any one of the bottom terminals 5, the top and bottom terminals 4 and 5 in each of the overlapping terminal pairs being electrically connected to each other and being positioned to overlap each other as viewed in the direction perpendicular to the top surface 2a of the main body 2 (the Z direction).

In the example shown in FIG. 43 and FIG. 44, the plurality of top terminals 4 include first-type terminals 4A1, 4A2, 4A3, and 4A4, second-type terminals 4B11, 4B12, 4B13, 4B21, 4B22, 4B23, 4B31, 4B32, and 4B33, and third-type terminals 4C11, 4C21, and 4C31. Similarly, the plurality of bottom terminals 5 include first-type terminals 5A1, 5A2, 5A3, and 5A4, second-type terminals 5B11, 5B12, 5B13, 5B21, 5B22, 5B23, 5B31, 5B32, and 5B33, and third-type terminals 5C11, 5C21, and 5C31. The terminals 5A1 to 5A4, 5B11 to 5B13, 5B21 to 5B23, 5B31 to 5B33, 5C11, 5C21, and 5C31 are paired with the terminals 4A1 to 4A4, 4B11 to 4B13, 4B21 to 4B23, 4B31 to 4B33, 4C11, 4C21, and 4C31, respectively.

In each of the pairs of terminals (4A1, 5A1), (4A2, 5A2), (4A3, 5A3), and (4A4, 5A4), the top terminal 4 and the bottom terminal 5 are electrically connected to each other and are positioned to overlap each other as viewed in the direction perpendicular to the top surface 2a of the main body 2 (the Z direction). These pairs are thus the overlapping terminal pairs.

In each of the pairs of terminals (4B11, 5B11), (4B12, 5B12), (4B13, 5B13), (4B21, 5B21), (4B22, 5B22), (4B23, 5B23), (4B31, 5B31), (4B32, 5B32), (4B33, 5B33), (4C11, 5C11), (4C21, 5C21), and (4C31, 5C31), the top terminal 4 and the bottom terminal 5 are electrically connected to each other and are positioned not to overlap each other as viewed in the direction perpendicular to the top surface 2a of the main body 2 (the Z direction). These pairs are thus the non-overlapping terminal pairs.

The terminals 5B11, 5B12, 5B13, 5C11, 5B21, 5B22, 5B23, 5C21, 5B31, 5B32, 5B33, and 5C31 are positioned to overlap the terminals 4C11, 4B11, 4B12, 4B13, 4C21, 4B21, 4B22, 4B23, 4C31, 4B31, 4B32, and 4B33, respectively, as viewed in the direction perpendicular to the top surface 2a of the main body 2 (the Z direction).

The plurality of conductive paths W include first-type conductive paths WA1, WA2, WA3, and WA4, second-type conductive paths WB11, WB12, WB13, WB21, WB22, WB23, WB31, WB32, and WB33, and third-type conductive paths WC11, WC21, and WC31. The first-type conductive paths WA1, WA2, WA3, and WA4 electrically connect the top terminal 4 and the bottom terminal 5 in the overlapping terminal pairs (4A1, 5A1), (4A2, 5A2), (4A3, 5A3), and (4A4, 5A4), respectively. The plurality of first-type conductive paths WA1 to WA4 are used in common by all the layer portions 10 in the main part 2M.

The second-type conductive paths WB11, WB12, WB13, WB21, WB22, WB23, WB31, WB32, and WB33 electrically connect the top terminal 4 and the bottom terminal 5 in the non-overlapping terminal pairs (4B11, 5B11), (4B12, 5B12), (4B13, 5B13), (4B21, 5B21), (4B22, 5B22), (4B23, 5B23), (4B31, 5B31), (4B32, 5B32), and (4B33, 5B33), respectively. The second-type conductive paths are electrically connected to neither of two semiconductor chips 30 included in the two layer portions 10 in the main part 2M. The second-type conductive paths will also be referred to as bypass conductive paths.

The third-type conductive paths WC11, WC21, and WC31 electrically connect the top terminal 4 and the bottom terminal 5 in the non-overlapping terminal pairs (4C11, 5C11), (4C21, 5C21), and (4C31, 5C31), respectively. The third-type conductive paths are used for electrical connection to the semiconductor chip 30 of at least one of the two layer portions 10 in the main part 2M.

On the top surface 2Ma of the main part 2M, as shown in FIG. 43, the terminals 4A1 to 4A4, 4B11 to 4B13, 4B21 to 4B23, 4B31 to 4B33, 4C11, 4C21, and 4C31 are electrically connected to their respective closest conductive paths WA1 to WA4, WB11 to WB13, WB21 to WB23, WB31 to WB33, WC11, WC21, and WC31. On the bottom surface 2Mb of the main part 2M, as shown in FIG. 44, the terminals 5A1 to 5A4 are electrically connected to their respective closest conductive paths WA1 to WA4. Meanwhile, the terminals 5B11 to 5B13, 5B21 to 5B23, and 5B31 to 5B33 are respectively electrically connected to the conductive paths WB11 to WB13, WB21 to WB23, and WB31 to WB33 which are adjacent to their respective closest conductive paths. The terminals 5C11, 5C21, and 5C31 are respectively electrically connected to the conductive paths WC11, WC21, and WC31 which are closest to the terminals 5B11, 5B21, and 5B31, respectively.

As shown in FIG. 45 and FIG. 46, the plurality of electrodes 32 include the following first- to fourth-type electrodes. The first-type electrodes 32A1, 32A2, 32A3, and 32A4 are located at positions corresponding to those of the terminals 4A1, 4A2, 4A3, and 4A4, respectively, as viewed in the direction perpendicular to the top surface 2a of the main body 2 (the Z direction). The first-type electrodes 32A1, 32A2, 32A3, and 32A4 are electrically connected to the first-type conductive paths WA1, WA2, WA3, and WA4, respectively. In at least one of the two layer portions 10 in the main part 2M, the first-type electrodes 32A1 to 32A4 are in contact with and electrically connected to the semiconductor chip 30. In FIG. 45, the dashed squares in the electrodes 32A1 to 32A4 represent the areas where the electrodes 32A1 to 32A4 make contact with the semiconductor chip 30.

The second-type electrodes 32B11, 32B12, 32B13, 32B21, 32B22, 32B23, 32B31, 32B32, and 32B33 are located at positions corresponding to those of the terminals 4B11, 4B12, 4B13, 4B21, 4B22, 4B23, 4B31, 4B32, and 4B33, respectively, as viewed in the direction perpendicular to the top surface 2a of the main body 2 (the Z direction). The second-type electrodes 32B11, 32B12, 32B13, 32B21, 32B22, 32B23, 32B31, 32B32, and 32B33 are electrically connected to the second-type conductive paths WB11, WB12, WB13, WB21, WB22, WB23, WB31, WB32, and WB33, respectively.

The third-type electrodes 32C11, 32C21, and 32C31 are located at positions corresponding to those of the terminals 4C11, 4C21, and 4C31, respectively, as viewed in the direction perpendicular to the top surface 2a of the main body 2 (the Z direction). The third-type electrodes 32C11, 32C21, and 32C31 are electrically connected to the third-type conductive paths WC11, WC21, and WC31, respectively. None of the second-type and third-type electrodes are in contact with the semiconductor chip 30.

The fourth-type electrode 32D1 is electrically connected to the electrode 32C11. The other fourth-type electrode 32D2 is an electrode with which different signals are associated from one layer portion 10 to the other. The electrode 32D2 has two branched parts. The two branched parts have two end faces located in the side surface 2c of the main body 2. The two end faces are located near the end faces of the two electrodes 32C21 and 32C31, respectively. In at least one of the two layer portions 10 in the main part 2M, the fourth-type electrodes 32D1 and 32D2 are in contact with and electrically connected to the semiconductor chip 30. In FIG. 45, the dashed squares in the electrodes 32D1 and 32D2 represent the areas where the electrodes 32D1 and 32D2 make contact with the semiconductor chip 30.

The electrode 32D1 is electrically connected to the conductive path WC11 via the electrode 32C11. In the layer portion 10S1, the conductive path WC21 is broadened in part, so that the conductive path WC21 makes contact with the end face of one of the branched parts of the electrode 32D2. The electrode 32D2 of the layer portion 10S1 is thereby electrically connected to the conductive path WC21. In the layer portion 10S2, the conductive path WC31 is broadened in part, so that the conductive path WC31 makes contact with the end face of the other one of the branched parts of the electrode 32D2. The electrode 32D2 of the layer portion 10S2 is thereby electrically connected to the conductive path WC31.

In the layer portion 10S2, the insulating portion 31 also covers the first surface 30a of the semiconductor chip 30 and the plurality of electrodes 32. In the layer portion 10S1, the insulating portion 31 does not cover parts of the plurality of electrodes 32 except the electrodes 32D1 and 32D2, but covers the first surface 30a of the semiconductor chip 30 and the remaining parts of the electrodes 32. The parts of the electrodes 32 not covered by the insulating portion 31 constitute conductor pads. Conductor layers are formed on the conductor pads. The conductor pads and conductor layers constitute the top terminals 4. In the present embodiment, the plurality of top terminals 4 are thus formed by using the plurality of electrodes 32, except the electrodes 32D1 and 32D2, of the uppermost layer portion 10S1 of the main part 2M. The parts of the plurality of electrodes 32 of the layer portion 10S1 covered by the insulating portion 31 constitute the top wiring 4W. In FIG. 42 to FIG. 44, part of the insulating portion 31 of the layer portion 10S1 is shown by broken lines.

At least one of the two layer portions 10 in the main package 1M is a first-type layer portion 10A. The two layer portions 10 in the main package 1M may include a second-type layer portion 10B.

In the first-type layer portion 10A, the semiconductor chip 30 is electrically connected to two or more of the plurality of conductive paths W. More specifically, in the first-type layer portion 10A, the electrodes 32A1 to 32A4, 32D1, and 32D2 are in contact with and electrically connected to the semiconductor chip 30. Consequently, in the first-type layer portion 10A, the semiconductor chip 30 is electrically connected to the conductive paths WA1 to WA4, the conductive path WC11, and either one of the conductive paths WC21 and WC31. In the second-type layer portion 10B, none of the electrodes 32A1 to 32A4, 32D1, and 32D2 are in contact with the semiconductor chip 30. Consequently, in the second-type layer portion 10B, the semiconductor chip 30 is electrically connected to none of the conductive paths W.

Where the main package 1M includes one second-type layer portion 10B, an additional package to be described later is added to the main package 1M to construct a composite layered chip package 1.

As in the first embodiment, the main package 1M and the module MD will now be described in more detail with reference to the case where the module MD shown in FIG. 42 is used to construct the memory device shown in FIG. 19. In the present embodiment, the semiconductor chips 30 in the layer portions 10S1 and 10S2 in the main package 1C, the layer portions 10S1 and 10S2 in the main package 1D, the layer portions 10S1 and 10S2 in the main package 1E, and the layer portions 10S1 and 10S2 in the main package 1F are the memory chips MC1, MC2, MC3, MC4, MC5, MC6, MC7, and MC8 shown in FIG. 19, respectively.

In the main packages 1C to 1F, the terminals 4A1 and 5A1 are electrically connected to the conductive path WA1, the terminals 4A2 and 5A2 are electrically connected to the conductive path WA2, the terminals 4A3 and 5A3 are electrically connected to the conductive path WA3, and the terminals 4A4 and 5A4 are electrically connected to the conductive path WA4. As a result, there are formed a plurality of electrical paths from the terminals 4A1-4A4 of the main package 1C to the terminals 5A1-5A4 of the main package 1F. The plurality of electrical paths constitute parts of the data bus 91 and one or more common lines 92.

In the module MD shown in FIG. 42, an electrical path is formed through the terminal 4C11 of the main package 1C, the conductive path WC11 of the main package 1C, the terminal 5C11 of the main package 1C, the terminal 4B13 of the main package 1D, the conductive path WB13 of the main package 1D, the terminal 5B13 of the main package 1D, the terminal 4B12 of the main package 1E, the conductive path WB12 of the main package 1E, the terminal 5B12 of the main package 1E, the terminal 4B11 of the main package 1F, the conductive path WB11 of the main package 1F, and the terminal 5B11 of the main package 1F. This electrical path constitutes part of the signal line 93C1 shown in FIG. 19. The chip enable signal CE1 is supplied to the electrical path via the terminal 4C11 of the main package 1C or the terminal 5B11 of the main package 1F. Such an electrical path is electrically connected only to the memory chips MC1 and MC2, that is, the semiconductor chips 30 of the layer portions 10S1 and 10S2 in the main package 1C, among the semiconductor chips 30 of all of the layer portions 10 in the main packages 1C to 1F. The reason is that, in the main package 1C, the electrical path runs through the conductive path WC11 which is electrically connected to the semiconductor chips 30 of the layer portions 10S1 and 10S2, while in the main packages 1D to 1F, the electrical path runs through the bypass conductive paths WB13, WB12, and WB11. The electrical path can thus supply the chip enable signal CE1 to only the memory chips MC1 and MC2 among the memory chips MC1 to MC8.

Similarly, there are formed the following three electrical paths: one that can supply the chip enable signal CE2 to only the memory chips MC3 and MC4; one that can supply the chip enable signal CE3 to only the memory chips MC5 and MC6; and one that can supply the chip enable signal CE4 to only the memory chips MC7 and MC8.

In the module MD, an electrical path is also formed through the terminal 4C21 of the main package 1C, the conductive path WC21 of the main package 1C, the terminal 5C21 of the main package 1C, the terminal 4B23 of the main package 1D, the conductive path WB23 of the main package 1D, the terminal 5B23 of the main package 1D, the terminal 4B22 of the main package 1E, the conductive path WB22 of the main package 1E, the terminal 5B22 of the main package 1E, the terminal 4B21 of the main package 1F, the conductive path WB21 of the main package 1F, and the terminal 5B21 of the main package 1F. This electrical path constitutes part of the signal line 93R1 shown in FIG. 19. The electrical path is electrically connected only to the memory chip MC1, that is, the semiconductor chip 30 of the layer portion 10S1 in the main package 1C, among the semiconductor chips 30 of all of the layer portions 10 in the main packages 1C to 1F. The electrical path can thus transmit the ready/busy signal of only the memory chip MC1 among the memory chips MC1 to MC8, and output the ready/busy signal from the terminal 4C21 of the main package 1C or the terminal 5B21 of the main package 1F.

Similarly, there are formed seven electrical paths that are each electrically connected to only a corresponding one of the memory chips MC2 to MC8 and can transmit and output the ready/busy signal of that memory chip alone.

According to the example described so far, the chip enable signals or ready/busy signals associated with the semiconductor chips 30 (memory chips) that fall on the same layers in the respective main packages 1C to 1F of the same configuration can easily be made different among the main packages 1C to 1F.

The main package 1M of the present embodiment includes two stacked semiconductor chips 30. Among the plurality of top terminals 4 of the main package 1M, the terminals 4C21 and 4C31 are associated with different semiconductor chips 30. The terminal 4C21 is associated with the semiconductor chip 30 of the layer portion 10S1. The terminal 4C31 is associated with the semiconductor chip 30 of the layer portion 10S2. Hereinafter, the terminals 4C21 and 4C31 will also be referred to as the first terminals.

Now, a description will be given of a remedy according to the present embodiment for coping with the situation where the main package 1M includes one second-type layer portion 10B. In the second-type layer portion 10B, none of the plurality of electrodes 32 are electrically connected to the defective semiconductor chip 30. Consequently, the defective semiconductor chip 30 is electrically connected to none of the plurality of conductive paths W, and is thus disabled. In such a case, according to the present embodiment, an additional package is added to the main package 1M to construct a composite layered chip package 1.

Figure 48:
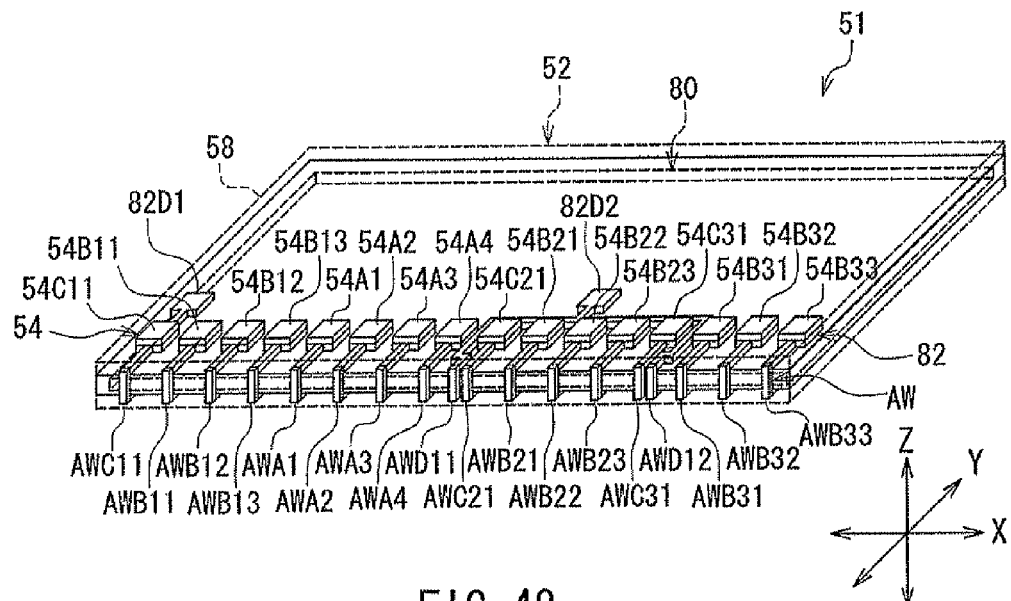
FIG. 48 is a perspective view of an additional package of the second embodiment of the invention.
Figure 49:
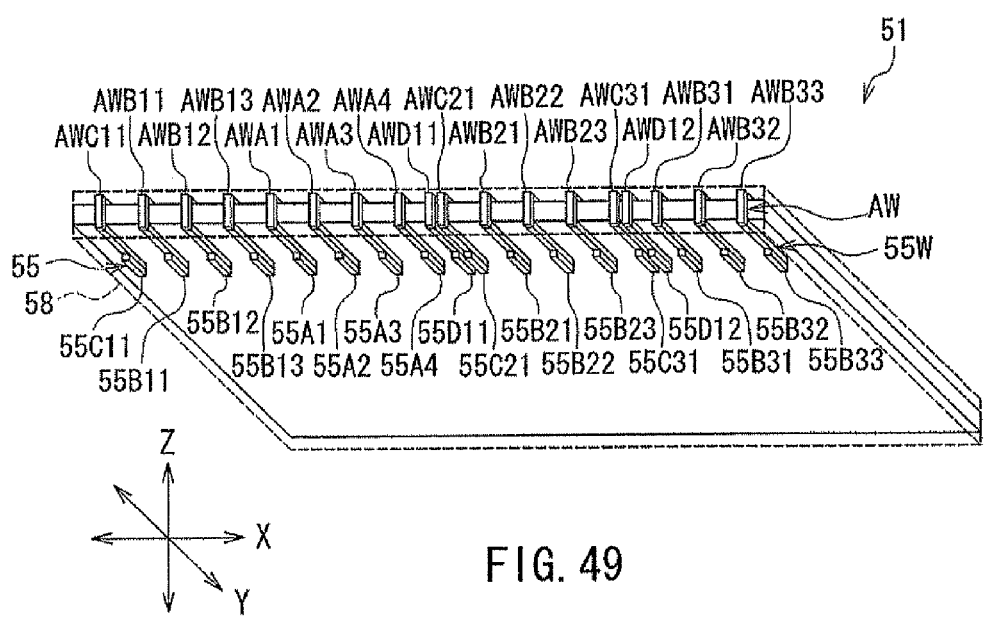
FIG. 49 is a perspective view showing the additional package of FIG. 48 as viewed from below.
Figure 50:
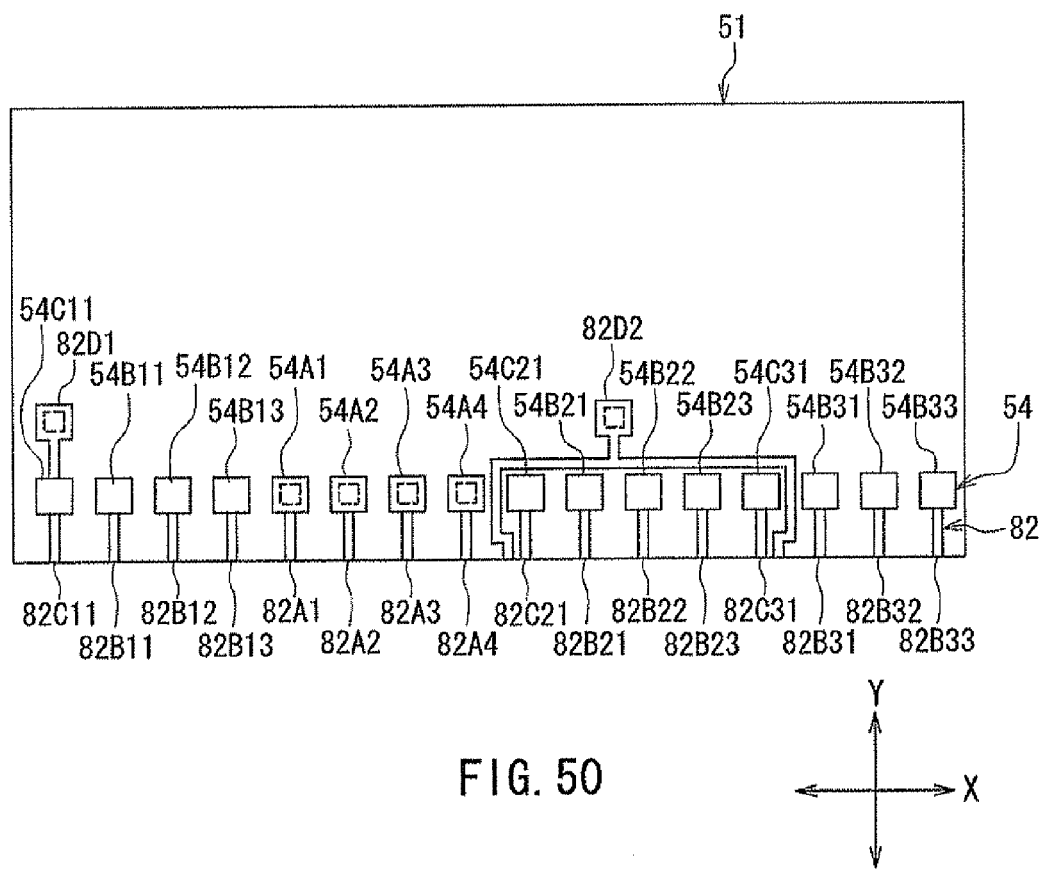
FIG. 50 is a plan view of the additional package of FIG. 48.
Figure 51:
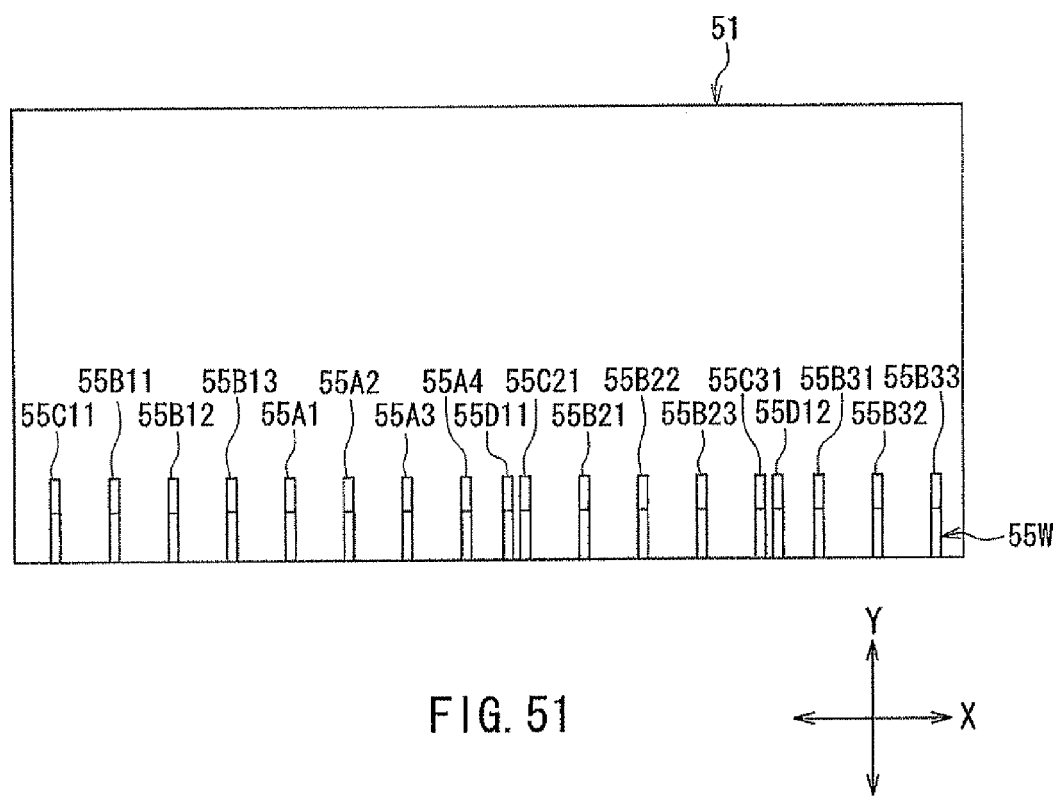
FIG. 51 is a plan view showing a plurality of bottom terminals and bottom wiring of the additional package of FIG. 48 as viewed from above.

The additional package will now be described with reference to FIG. 48 to FIG. 51. FIG. 48 is a perspective view of the additional package. FIG. 49 is a perspective view showing the additional package of FIG. 48 as viewed from below. FIG. 50 is a plan view of the additional package of FIG. 48. FIG. 51 is a plan view showing the plurality of bottom terminals and the bottom wiring of the additional package of FIG. 48 as viewed from above.

The configuration of the additional package 51 of the present embodiment is the same as that of the additional package 51 of the first embodiment except for the configuration of the plurality of top terminals 54, the plurality of bottom terminals 55, the plurality of conductive paths AW, and the plurality of electrodes 82. In FIG. 48 and FIG. 49, reference symbols 52a, 52b, 52c, 52d, 52e, 52f, 80a, 80b, 80c, 80d, 80e, and 80f are omitted.

The plurality of top terminals 54 include terminals 54A1 to 54A4, 54B11 to 54B13, 54B21 to 54B23, 54B31 to 54B33, 54C11, 54C21, and 54C31. The shape and layout of the terminals 54A1 to 54A4, 54B11 to 54B13, 54B21 to 54B23, 54B31 to 54B33, 54C11, 54C21, and 54C31 are the same as those of the terminals 4A1 to 4A4, 4B11 to 4B13, 4B21 to 4B23, 4B31 to 4B33, 4C11, 4C21, and 4C31 shown in FIG. 43.

The plurality of conductive paths AW include conductive paths AWA1 to AWA4, AWB11 to AWB13, AWB21 to AWB23, AWB31 to AWB33, AWC11, AWC21, and AWC31 that correspond to the conductive paths WA1 to WA4, WB11 to WB13, WB21 to WB23, WB31 to WB33, WC11, WC21, and WC31, respectively. The plurality of conductive paths AW further include conductive paths AWD11 and AWD12. The conductive path AWD11 is adjacent to the conductive path AWC21 and located on the left side thereof. The conductive path AWD12 is adjacent to the conductive path AWC31 and located on the right side thereof.

The plurality of electrodes 82 include electrodes 82A1 to 82A4, 82B11 to 82B13, 82B21 to 82B23, 82B31 to 82B33, 82C11, 82C21, 82C31, 82D1, and 82D2. The shape and layout of the electrodes 82A1 to 82A4, 82B11 to 82B13, 82B21 to 82B23, 82B31 to 82B33, 82C11, 82C21, 82C31, and 82D1 are the same as those of the electrodes 32A1 to 32A4, 32B11 to 32B13, 32B21 to 32B23, 32B31 to 32B33, 32C11, 32C21, 32C31, and 32D1, respectively. The electrodes 82A1 to 82A4, 82D1, and 82D2 are in contact with and electrically connected to the additional semiconductor chip 80. In FIG. 50, the dashed squares in the electrodes 82A1 to 82A4, 82D1, and 82D2 represent the areas where the electrodes 82A1 to 82A4, 82D1, and 82D2 make contact with the additional semiconductor chip 80. None of the electrodes 82B11 to 82B13, 82B21 to 82B23, 82B31 to 82B33, 82C11, 82C21, and 82C31 are in contact with the additional semiconductor chip 80. The electrode 82D2 has two branched parts that are electrically connected to the conductive paths AWD11 and AWD12, respectively.

The plurality of top terminals 54 are formed by using the plurality of electrodes 82 except the electrodes 82D1 and 82D2. More specifically, portions of the plurality of electrodes 82 except the electrodes 82D1 and 82D2 constitute conductor pads. Conductor layers are formed on the conductor pads. The conductor pads and conductor layers constitute the top terminals 54. The terminals 54A1 to 54A4, 54B11 to 54B13, 54B21 to 54B23, 54B31 to 54B33, 54C11, 54C21, and 54C31 are electrically connected to the conductive paths AWA1 to AW4, AWB11 to AWB13, AWB21 to AWB23, AWB31 to AWB33, AWC11, AWC21, and AWC31, respectively, via the electrodes 82A1 to 82A4, 82B11 to 82B13, 82B21 to 82B23, 82B31 to 82B33, 82C11, 82C21, and 82C31.

The plurality of bottom terminals 55 include terminals 55A1 to 55A4, 55B11 to 55B13, 55B21 to 55B23, 55B31 to 55B33, 55C11, 55C21, 55C31, 55D11, and 55D12. The bottom terminals 55A1 to 55A4, 55B11 to 55B13, 55B21 to 55B23, 55B31 to 55B33, 55C11, 55C21, and 55C31 are all shaped to be smaller in width in the X direction than the top terminals 54. The terminals 55A1 to 55A4, 55B11 to 55B13, 55B21 to 55B23, 55B31 to 55B33, 55C11, 55C21, and 55C31 are paired with the terminals 54A1 to 54A4, 54B11 to 54B13, 54B21 to 54B23, 54B31 to 54B33, 54C11, 54C21, and 54C31, respectively. Two terminals making up each pair are positioned to overlap each other as viewed in the direction perpendicular to the top surface 52a of the additional package main body 52 (the Z direction).

As shown in FIG. 51, when viewed in the direction perpendicular to the top surface 52a of the additional package main body 52 (the Z direction), the terminal 55D11 is adjacent to the terminal 55C21 and located on the left side thereof, and the terminal 55D12 is adjacent to the terminal 55C31 and located on the right side thereof.

The bottom wiring 55W electrically connects the terminals 55A1-55A4, 55B11-55B13, 55B21-55B23, 55B31-55B33, 55C11, 55C21, 55C31, 55D11, and 55D12 to the conductive paths AWA1-AW4, AWB11-AWB13, AWB21-AWB23, AWB31-AWB33, AWC11, AWC21, AWC31, AWD11, and AWD12, respectively.

The conductive paths AWA1 to AW4, AWB11 to AWB13, AWB21 to AWB23, AWB31 to AWB33, AWC11, AWC21, and AWC31 electrically connect the pairs of terminals (54A1, 55A1), (54A2, 55A2), (54A3, 55A3), (54A4, 55A4), (54B11, 55B11), (54B12, 55B12), (54B13, 55B13), (54B21, 55B21), (54B22, 55B22), (54B23, 55B23), (54B31, 55B31), (54B32, 55B32), (54B33, 55B33), (54C11, 55C11), (54C21, 55C21), and (54C31, 55C31), respectively.

The conductive paths AWD11 and AWD12 electrically connect the terminals 55D11 and 55D12 to the two branched parts of the electrode 82D2, respectively.

Hereinafter, the terminals 55D11 and 55D12 will also be referred to as the second terminals, the terminals 55C21 and 55C31 will also be referred to as the third terminals, and the terminals 54C21 and 54C31 will also be referred to as the fourth terminals.

Reference is now made to FIG. 52 to FIG. 55 to describe the composite layered chip package 1 including the main package 1M and the additional package 51 stacked on each other. In the present embodiment, the main package 1M and the additional package 51 can be positioned in either of the first and second relative positional relationships with each other.

The first terminals 4C21 and 4C31 of the main package 1M and the second terminals 55D11 and 55D12 of the additional package 51 are shaped and positioned such that at least one pair of first and second terminals in which the first and second terminals are in contact with each other is formed in each of the first and second relative positional relationships. The combination of the first and second terminals making up the at least one pair of first and second terminals is different between the first and second relative positional relationships.

The plurality of third terminals 55C21 and 55C31 of the additional package 51 are shaped and positioned such that a plurality of pairs of first and third terminals in each of which the first and third terminals are in contact with each other are formed in each of the first and second relative positional relationships, wherein combinations of the first and third terminals making up the plurality of pairs of first and third terminals are the same for the first and second relative positional relationships.

In the specific main body 2S which is the main body 2 of the main package 1M in the composite layered chip package 1, the main part 2M includes one first-type layer portion 10A and one second-type layer portion 10B. The semiconductor chip 30 of the first-type layer portion 10A, i.e., a conforming semiconductor chip 30, is electrically connected to the wiring 3. The semiconductor chip 30 of the second-type layer portion 10B, i.e., a defective semiconductor chip 30, is not electrically connected to the wiring 3.

The main package 1M and the additional package 51 are positioned with respect to each other in one of the first and second relative positional relationships that is selected in accordance with which position in the specific main body 2S the semiconductor chip 30 of the second-type layer portion 10B to be substituted with the additional semiconductor chip 80 is located at. In the selected one of the first and second relative positional relationships, the first and second terminals making up the at least one pair of first and second terminals are joined to each other. The first terminal in the at least one pair of first and second terminals in which the first and second terminals are joined to each other is a terminal associated with the defective semiconductor chip 30. The additional semiconductor chip 80 in the additional package 51 is electrically connected to the wiring 3 of the main package 1M through the at least one pair of first and second terminals in which the first and second terminals are joined to each other, and substitutes for the defective semiconductor chip 30.

The composite layered chip package 1 will be described in more detail below with reference to two specific examples of modules including the composite layered chip package 1.

Figure 52:
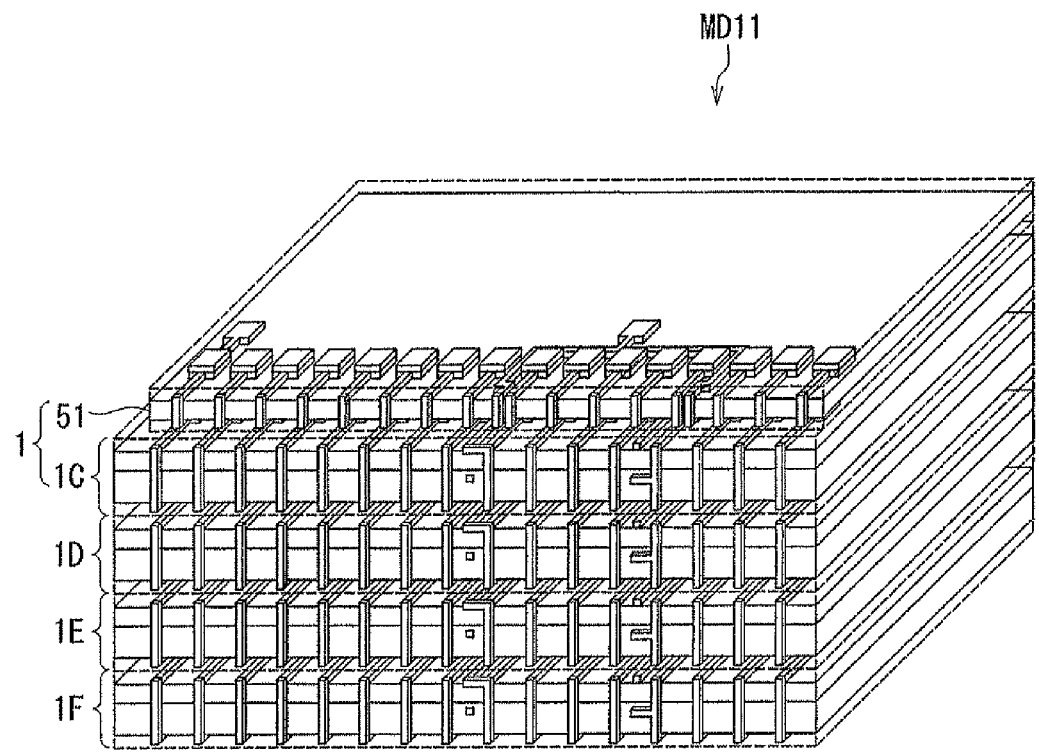
FIG. 52 is a perspective view showing a first example of a module including a composite layered chip package according to the second embodiment of the invention.
Figure 53:
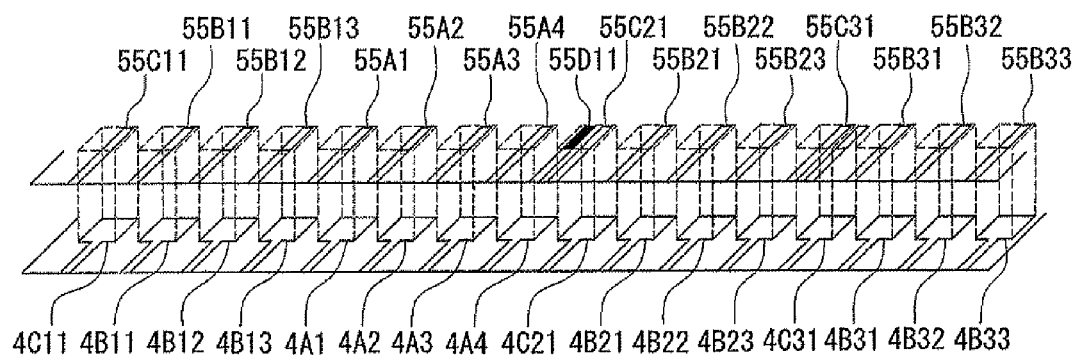
FIG. 53 is an explanatory diagram illustrating the connections between a plurality of terminals in FIG. 52.

FIG. 52 is a perspective view showing a first example of the module including the composite layered chip package 1 according to the present embodiment. FIG. 53 is an explanatory diagram illustrating the connections between a plurality of terminals in FIG. 52. The module MD11 of the first example includes the composite layered chip package 1 and the main packages 1D, 1E, and 1F. The composite layered chip package 1 includes the main package 1C and the additional package 51 that are positioned in the first relative positional relationship with each other. The main package 1C is placed on top of the main package 1D, and the additional package 51 is placed on top of the main package 1C. The positioning of the main packages 1C, 1D, 1E, and 1F and the electrical connections therebetween are the same as those in the module MD shown in FIG. 42.

The first relative positional relationship is selected when the layer portion 10S1 of the main package 1C is the second-type layer portion 10B and the additional semiconductor chip 80 is to substitute for the semiconductor chip 30 of this layer portion 10S1. In the first relative positional relationship, as shown in FIG. 52, the additional package 51 is displaced, relative to the positioning in which the additional package 51 lies right on the main package 1C, slightly in the direction from the side surface 2e to the side surface 2f of the main body 2 of the main package 1C. The positioning in which the additional package 51 lies right on the main package 1C is such that the terminals 54A1 to 54A4, 54B11 to 54B13, 54B21 to 54B23, 54B31 to 54B33, 54C11, 54C21, and 54C31 of the additional package 51 overlap the terminals 4A1 to 4A4, 4B11 to 4B13, 4B21 to 4B23, 4B31 to 4B33, 4C11, 4C21, and 4C31 of the main package 1C, respectively, when the composite layered chip package 1 is viewed in the Z direction.

In FIG. 53, a plurality of regions on the bottom surface 52b of the additional package main body 52 that are in contact with the terminals 4A1 to 4A4, 4B11 to 4B13, 4B21 to 4B23, 4B31 to 4B33, 4C11, 4C21, and 4C31 are shown by broken lines. As shown in FIG. 53, in the first relative positional relationship, the terminal 55D11 is in contact with the terminal 4C21, and the terminals 55A1 to 55A4, 55B11 to 55B13, 55B21 to 55B23, 55B31 to 55B33, 55C11, 55C21, and 55C31 are in contact with the terminals 4A1 to 4A4, 4B11 to 4B13, 4B21 to 4B23, 4B31 to 4B33, 4C11, 4C21, and 4C31, respectively. The terminal 55D12 is in contact with none of the plurality of terminals 4. Two terminals in contact with each other are joined to each other. The pair of terminals 55D11 and 4C21 is a pair of first and second terminals in contact with each other. In FIG. 53, the terminal 55D11 is filled in with black to emphasize it.

A signal associated with the semiconductor chip 30 of the layer portion 10S1 of the main package 1C (the ready/busy signal R/B1 in the example shown in FIG. 19) appears on the terminal 4C21 with which the terminal 55D11 is in contact. Signals to be used in common by the layer portions 10S1 and 10S2 of the main package 1C appear on the terminals 4C11 and 4A1 to 4A4 with which the terminals 55C11 and 55A1 to 55A4 are in contact. In this way, all of a plurality of signals associated with the semiconductor chip 30 of the layer portion 10S1 of the main package 1C are associated with the additional semiconductor chip 80. Therefore, the additional semiconductor chip 80 can substitute for the defective semiconductor chip 30 of the layer portion 10S1 of the main package 1C.

Figure 54:
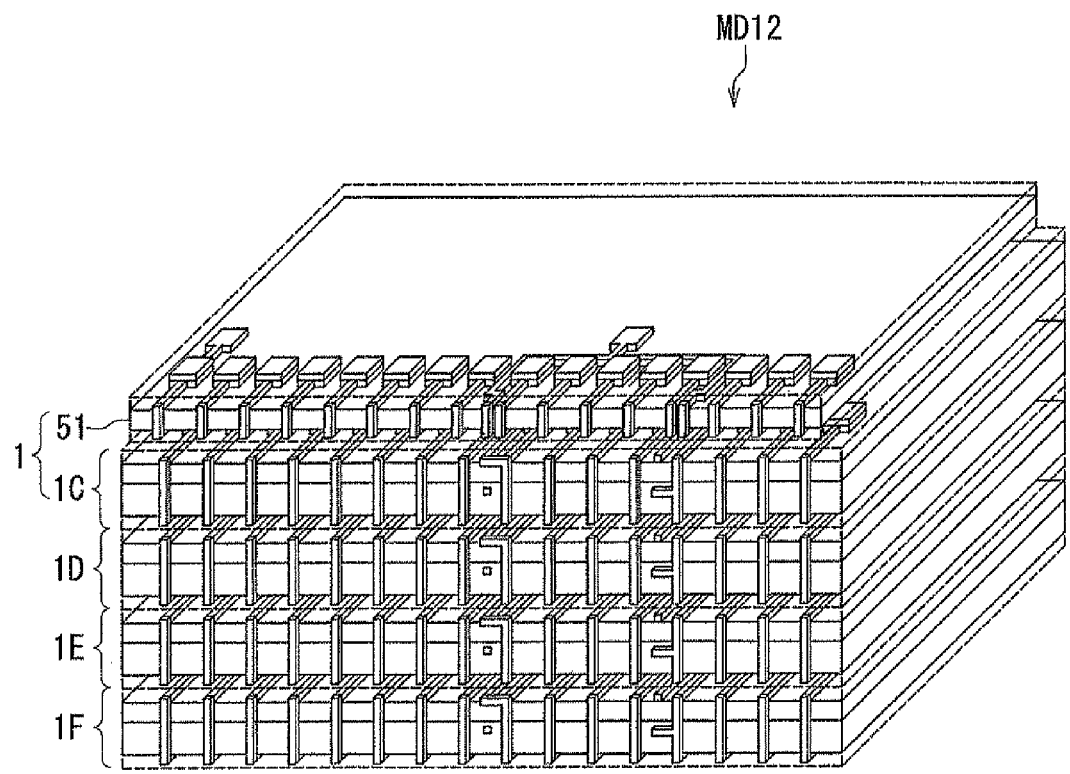
FIG. 54 is a perspective view showing a second example of the module including the composite layered chip package according to the second embodiment of the invention.
Figure 55:
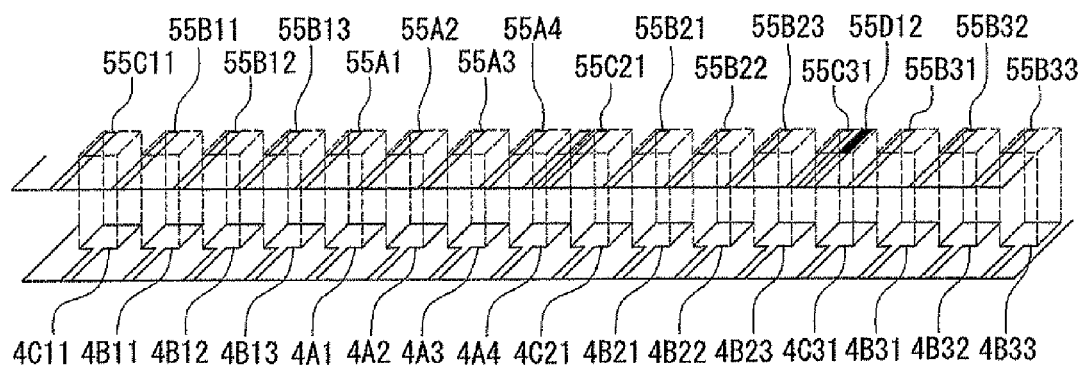
FIG. 55 is an explanatory diagram illustrating the connections between a plurality of terminals in FIG. 54.

FIG. 54 is a perspective view showing a second example of the module including the composite layered chip package 1 according to the present embodiment. FIG. 55 is an explanatory diagram illustrating the connections between a plurality of terminals in FIG. 54. The module MD12 of the second example includes the composite layered chip package 1 and the main packages 1D, 1E, and 1F. The composite layered chip package 1 includes the main package 1C and the additional package 51 that are positioned in the second relative positional relationship with each other. The main package 1C is placed on top of the main package 1D, and the additional package 51 is placed on top of the main package 1C. The positioning of the main packages 1C, 1D, 1E, and 1F and the electrical connections therebetween are the same as those in the module MD shown in FIG. 42.

The second relative positional relationship is selected when the layer portion 10S2 of the main package 1C is the second-type layer portion 10B and the additional semiconductor chip 80 is to substitute for the semiconductor chip 30 of this layer portion 10S2. In the second relative positional relationship, as shown in FIG. 54, the additional package 51 is displaced, relative to the positioning in which the additional package 51 lies right on the main package 1C, slightly in the direction from the side surface 2f to the side surface 2e of the main body 2 of the main package 1C.

In FIG. 55, a plurality of regions on the bottom surface 52b of the additional package main body 52 that are in contact with the terminals 4A1 to 4A4, 4B11 to 4B13, 4B21 to 4B23, 4B31 to 4B33, 4C11, 4C21, and 4C31 are shown by broken lines. As shown in FIG. 55, in the second relative positional relationship, the terminal 55D12 is in contact with the terminal 4C31, and the terminals 55A1 to 55A4, 55B11 to 55B13, 55B21 to 55B23, 55B31 to 55B33, 55C11, 55C21, and 55C31 are in contact with the terminals 4A1 to 4A4, 4B11 to 4B13, 4B21 to 4B23, 4B31 to 4B33, 4C11, 4C21, and 4C31, respectively. The terminal 55D11 is in contact with none of the plurality of terminals 4. Two terminals in contact with each other are joined to each other. The pair of terminals 55D12 and 4C31 is a pair of first and second terminals in contact with each other. In FIG. 55, the terminal 55D12 is filled in with black to emphasize it.

A signal associated with the semiconductor chip 30 of the layer portion 10S2 of the main package 1C (the ready/busy signal R/B2 in the example shown in FIG. 19) appears on the terminal 4C31 with which the terminal 55D12 is in contact. Signals to be used in common by the layer portions 10S1 and 10S2 of the main package 1C appear on the terminals 4C11 and 4A1 to 4A4 with which the terminals 55C11 and 55A1 to 55A4 are in contact. In this way, all of a plurality of signals associated with the semiconductor chip 30 of the layer portion 10S2 of the main package 1C are associated with the additional semiconductor chip 80. Therefore, the additional semiconductor chip 80 can substitute for the defective semiconductor chip 30 of the layer portion 10S2 of the main package 1C.

Although not illustrated, when the layer portion 10S1 of the main package 1D is the second-type layer portion 10B, the additional package 51 is placed on top of the main package 1D such that the main package 1D and the additional package 51 are in the first relative positional relationship with each other, and then the main package 1C is placed right on the additional package 51. Likewise, when the layer portion 10S2 of the main package 1D is the second-type layer portion 10B, the additional package 51 is placed on top of the main package 1D such that the main package 1D and the additional package 51 are in the second relative positional relationship with each other, and then the main package 1C is placed right on the additional package 51. A similar method is employed when the layer portion 10S1 or the layer portion 10S2 of one of the main packages 1E and 1F is the second-type layer portion 10B.

In the present embodiment, as with the modification examples in the first embodiment, the main package may be a modified main package in which the positions of the terminals 4 and 5 are vertically reversed from those in the main package 1M shown in FIG. 43 and FIG. 44, and the additional package may be a modified additional package in which the positions of the terminals 54 and 55 are vertically reversed from those in the additional package 51 shown in FIG. 48 and FIG. 49. In this case, a composite layered chip package can be constructed by placing the modified additional package below the modified main package and joining every two mutually contacting terminals to each other.

The manufacturing method for layered chip packages according to the present embodiment is the same as the method according to the first embodiment except the following two differences. In the present embodiment, the layered substructure 115 includes two substructures 110. Further, in the present embodiment, when joining the additional package 51 to the specific main body 2S included in the layered substructure 115, the additional package 51 is positioned with respect to the specific main body 2S in one of the first and second relative positional relationships that is selected in accordance with which position in the specific main body 2S the semiconductor chip 30 of the second-type layer portion 10B to be substituted with the additional semiconductor chip 80 is located at.

The remainder of configuration, function and effects of the present embodiment are similar to those of the first embodiment.

Third Embodiment

A third embodiment of the invention will now be described. The present embodiment differs from the second embodiment in the configuration of the additional package and the relative positional relationship between the main package and the additional package in the composite layered chip package 1.

Figure 56:
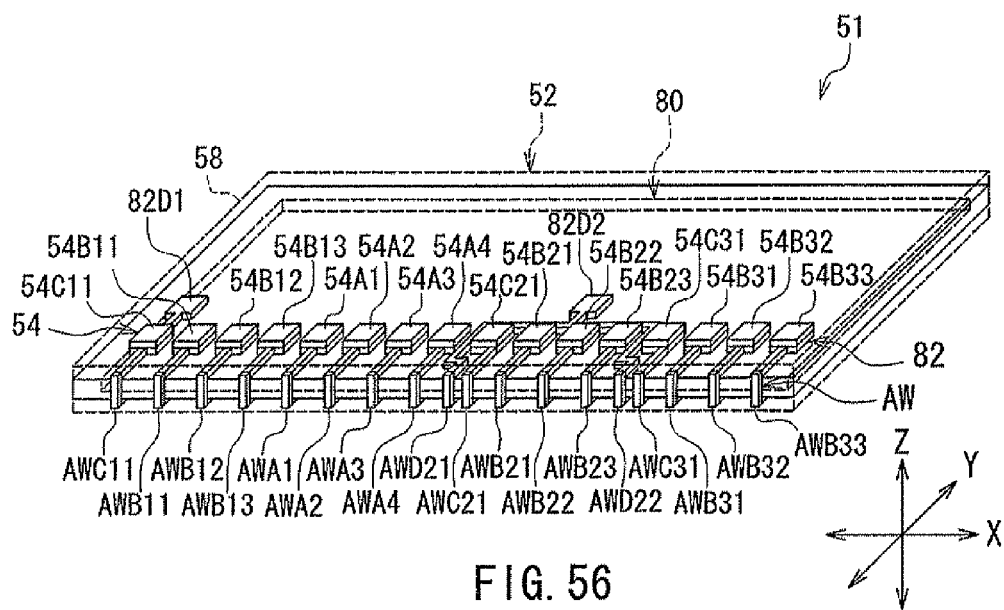
FIG. 56 is a perspective view of an additional package of a third embodiment of the invention.
Figure 57:
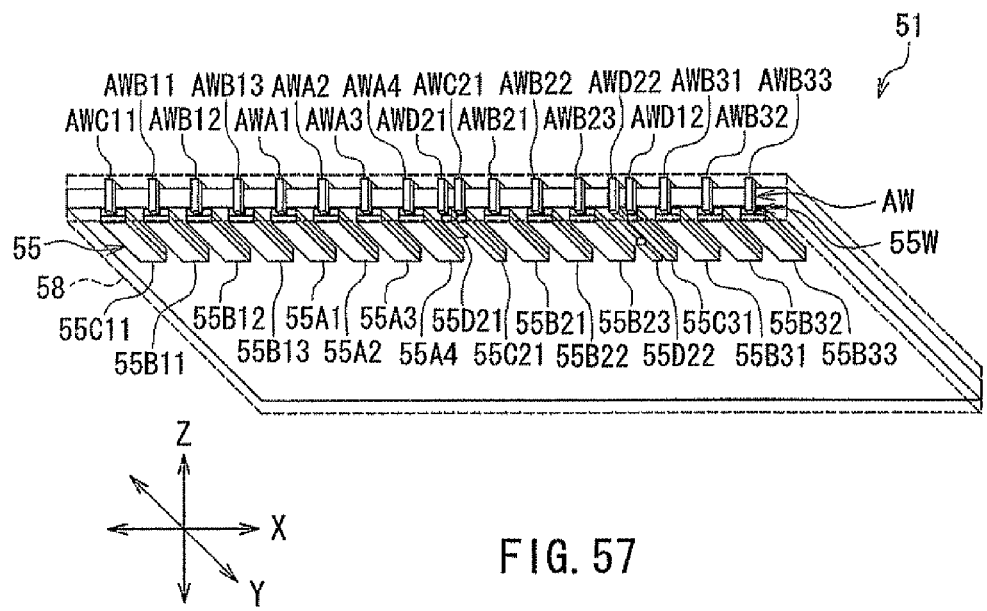
FIG. 57 is a perspective view showing the additional package of FIG. 56 as viewed from below.
Figure 58:
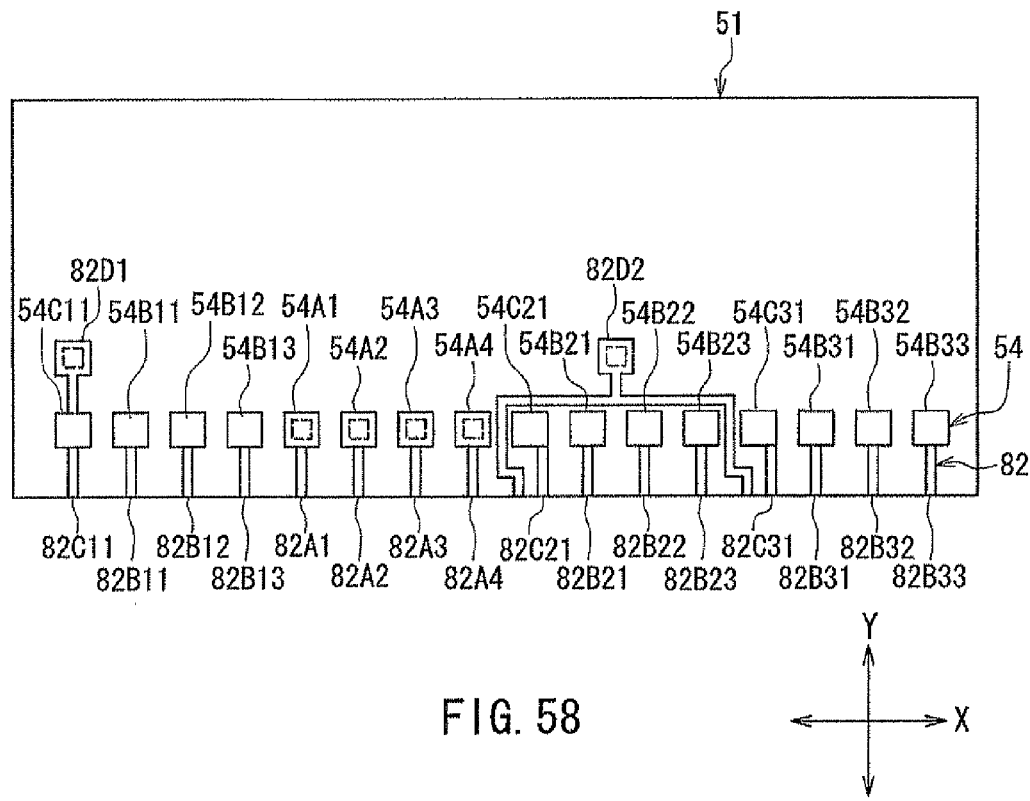
FIG. 58 is a plan view of the additional package of FIG. 56.
Figure 59:
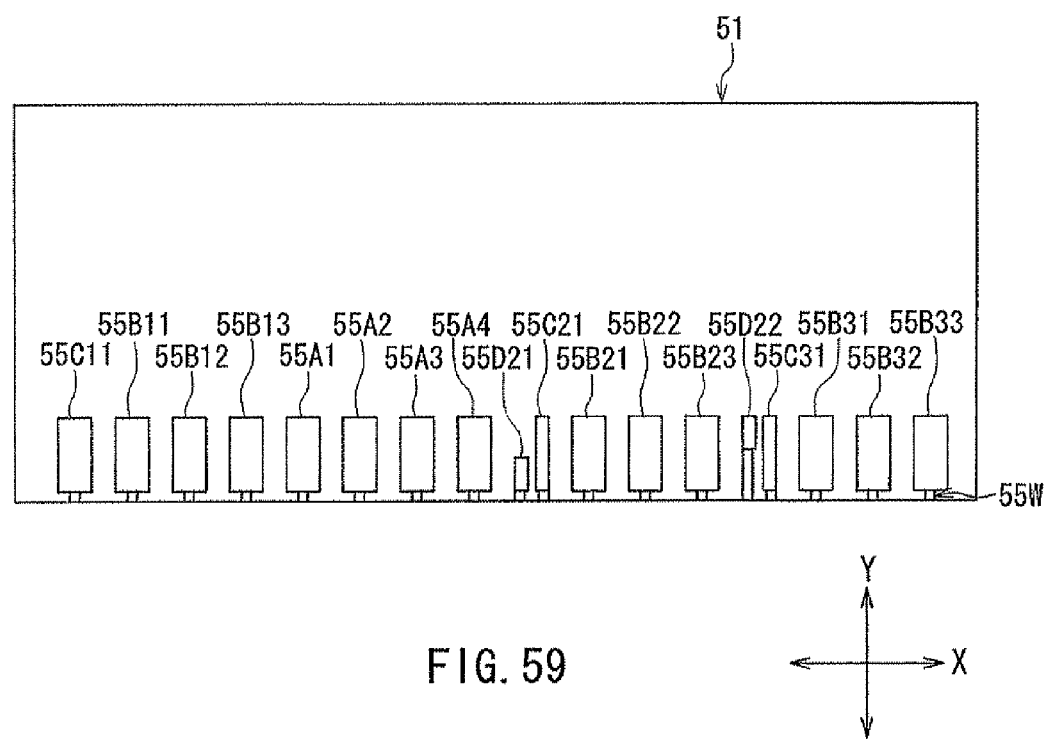
FIG. 59 is a plan view showing a plurality of bottom terminals and bottom wiring of the additional package of FIG. 56 as viewed from above.

The additional package will now be described with reference to FIG. 56 to FIG. 59. FIG. 56 is a perspective view of the additional package. FIG. 57 is a perspective view showing the additional package of FIG. 56 as viewed from below. FIG. 58 is a plan view of the additional package of FIG. 56. FIG. 59 is a plan view showing the plurality of bottom terminals and the bottom wiring of the additional package of FIG. 56 as viewed from above.

The configuration of the additional package 51 of the present embodiment is the same, as that of the additional package 51 of the second embodiment except for the configuration of the plurality of bottom terminals 55, the plurality of conductive paths AW, and the plurality of electrodes 82. In FIG. 56 and FIG. 57, reference symbols 52a, 52b, 52c, 52d, 52e, 52f, 80a, 80b, 80c, 80d, 80e, and 80f are omitted.

The plurality of conductive paths AW include conductive paths AWA1 to AWA4, AWB11 to AWB13, AWB21 to AWB23, AWB31 to AWB33, AWC11, AWC21, and AWC31 that correspond to the conductive paths WA1 to WA4, WB11 to WB13, WB21 to WB23, WB31 to WB33, WC11, WC21, and WC31, respectively. The plurality of conductive paths AW further include conductive paths AWD21 and AWD22. The positions of the conductive paths AWC21 and AWC31 in the present embodiment are slightly shifted toward the right relative to the positions of the conductive paths AWC21 and AWC31 in the second embodiment. The conductive path AWD21 is adjacent to the conductive path AWC21 and located on the left side thereof. The conductive path AWD22 is adjacent to the conductive path AWC31 and located on the left side thereof.

The electrode 82D2 of the present embodiment has two branched parts that are electrically connected to the conductive paths AWD21 and AWD22, respectively. The remainder of configuration of the plurality of electrodes 82 in the present embodiment is the same as that in the second embodiment.

The plurality of bottom terminals 55 include terminals 55A1 to 55A4, 55B11 to 55B13, 55B21 to 55B23, 55B31 to 55B33, 55C11, 55C21, 55C31, 55D21, and 55D22. The bottom terminals 55A1 to 55A4, 55B11 to 55B13, 55B21 to 55B23, 55B31 to 55B33 and 55C11 are all shaped to be longer in the Y direction than the top terminals 54. The terminals 55C21 and 55C31 are shaped to be smaller in width in the X direction and longer in the Y direction than the top terminals 54.

As shown in FIG. 59, when viewed in the direction perpendicular to the top surface 52a of the additional package main body 52 (the Z direction), the terminal 55D21 is adjacent to the terminal 55C21 and located on the left side thereof, while the terminal 55D22 is adjacent to the terminal 55C31 and located on the left side thereof. The terminal 55D21 is located closer to the side surface 52c of the additional package main body 52 than is the terminal 55D22.

The bottom wiring 55W electrically connects the terminals 55A1-55A4, 55B11-55B13, 55B21-55B23, 55B31-55B33, 55C11, 55C21, 55C31, 55D21, and 55D22 to the conductive paths AWA1-AW4, AWB11-AWB13, AWB21-AWB23, AWB31-AWB33, AWC11, AWC21, AWC31, AWD21, and AWD22, respectively.

The conductive paths AWA1 to AW4, AWB11 to AWB13, AWB21 to 15. AWB23, AWB31 to AWB33, AWC11, AWC21, and AWC31 electrically connect the pairs of terminals (54A1, 55A1), (54A2, 55A2), (54A3, 55A3), (54A4, 55A4), (54B11, 55B11), (54B12, 55B12), (54B13, 55B13), (54B21, 55B21), (54B22, 55B22), (54B23, 55B23), (54B31, 55B31), (54B32, 55B32), (54B33, 55B33), (54C11, 55C11), (54C21, 55C21), and (54C31, 55C31), respectively.

The conductive paths AWD21 and AWD22 electrically connect the terminals 55D21 and 55D22 to the two branched parts of the electrode 82D2, respectively.

Hereinafter, the terminals 55D21 and 55D22 will also be referred to as the second terminals, the terminals 55C21 and 55C31 will also be referred to as the third terminals, and the terminals 54C21 and 54C31 will also be referred to as the fourth terminals.

Reference is now made to FIG. 60 to FIG. 63 to describe the composite layered chip package 1 including the main package 1M and the additional package 51 stacked on each other. In the present embodiment, the main package 1M and the additional package 51 can be positioned in either of the first and second relative positional relationships with each other.

The first terminals 4C21 and 4C31 of the main package 1M and the second terminals 55D21 and 55D22 of the additional package 51 are shaped and positioned such that at least one pair of first and second terminals in which the first and second terminals are in contact with each other is formed in each of the first and second relative positional relationships. The combination of the first and second terminals making up the at least one pair of first and second terminals is different between the first and second relative positional relationships.

The plurality of third terminals 55C21 and 55C31 of the additional package 51 are shaped and positioned such that a plurality of pairs of first and third terminals in each of which the first and third terminals are in contact with each other are formed in each of the first and second relative positional relationships, wherein combinations of the first and third terminals making up the plurality of pairs of first and third terminals are the same for the first and second relative positional relationships.

In the specific main body 2S which is the main body 2 of the main package 1M in the composite layered chip package 1, the main part 2M includes one first-type layer portion 10A and one second-type layer portion 10B. The semiconductor chip 30 of the first-type layer portion 10A, i.e., a conforming semiconductor chip 30, is electrically connected to the wiring 3. The semiconductor chip 30 of the second-type layer portion 10B, i.e., a defective semiconductor chip 30, is not electrically connected to the wiring 3.

The main package 1M and the additional package 51 are positioned with respect to each other in one of the first and second relative positional relationships that is selected in accordance with which position in the specific main body 2S the semiconductor chip 30 of the second-type layer portion 10B to be substituted with the additional semiconductor chip 80 is located at. In the selected one of the first and second relative positional relationships, the first and second terminals making up the at least one pair of first and second terminals are joined to each other. The first terminal in the at least one pair of first and second terminals in which the first and second terminals are joined to each other is a terminal associated with the defective semiconductor chip 30. The additional semiconductor chip 80 in the additional package 51 is electrically connected to the wiring 3 of the main package 1M through the at least one pair of first and second terminals in which the first and second terminals are joined to each other, and substitutes for the defective semiconductor chip 30.

The composite layered chip package 1 will be described in more detail below with reference to two specific examples of modules including the composite layered chip package 1.

Figure 60:
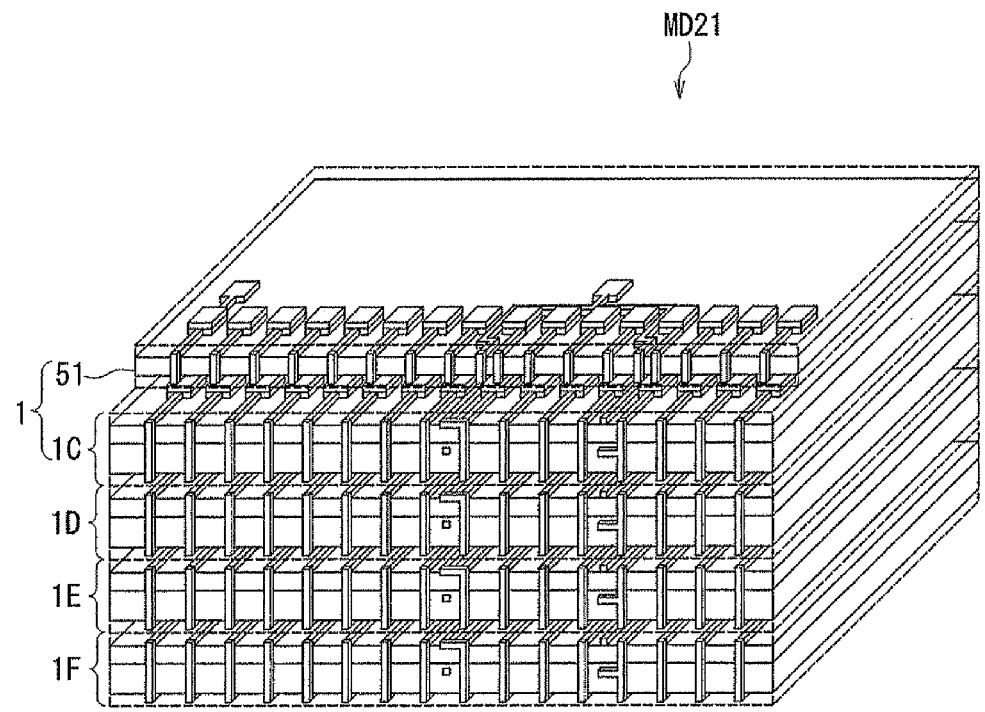
FIG. 60 is a perspective view showing a first example of a module including a composite layered chip package according to the third embodiment of the invention.
Figure 61:
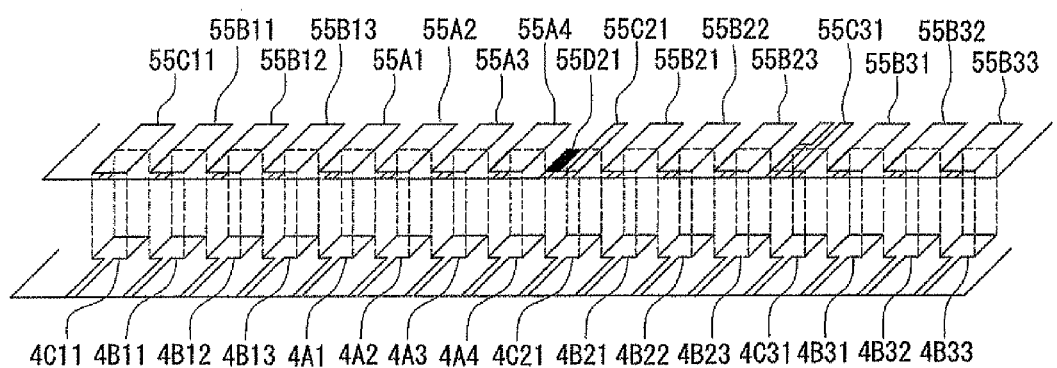
FIG. 61 is an explanatory diagram illustrating the connections between a plurality of terminals in FIG. 60.

FIG. 60 is a perspective view showing a first example of the module including the composite layered chip package 1 according to the present embodiment. FIG. 61 is an explanatory diagram illustrating the connections between a plurality of terminals in FIG. 60. The module MD21 of the first example includes the composite layered chip package 1 and the main packages 1D, 1E, and 1F. The composite layered chip package 1 includes the main package 1C and the additional package 51 that are positioned in the first relative positional relationship with each other. The main package 1C is placed on top of the main package 1D, and the additional package 51 is placed on top of the main package 1C. The positioning of the main packages 1C, 1D, 1E, and 1F and the electrical connections therebetween are the same as those in the module MD shown in FIG. 42.

The first relative positional relationship is selected when the layer portion 10S1 of the main package 1C is the second-type layer portion 10B and the additional semiconductor chip 80 is to substitute for the semiconductor chip 30 of this layer portion 10S1. In the first relative positional relationship, as shown in FIG. 60, the additional package 51 is displaced, relative to the positioning in which the additional package 51 lies right on the main package 10, greatly in the direction from the side surface 2c to the side surface 2d of the main body 2 of the main package 1C.

In FIG. 61, a plurality of regions on the bottom surface 52b of the additional package main body 52 that are in contact with the terminals 4A1 to 4A4, 4B11 to 4B13, 4B21 to 4B23, 4B31 to 4B33, 4C11, 4C21, and 4C31 are shown by broken lines. As shown in FIG. 61, in the first relative positional relationship, the terminal 55D21 is in contact with the terminal 4C21, and the terminals 55A1 to 55A4, 55B11 to 55B13, 55B21 to 55B23, 55B31 to 55B33, 55C11, 55C21, and 55C31 are in contact with the terminals 4A1 to 4A4, 4B11 to 4B13, 4B21 to 4B23, 4B31 to 4B33, 4C11, 4C21, and 4C31, respectively. The terminal 55D22 is in contact with none of the plurality of terminals 4. Two terminals in contact with each other are joined to each other. The pair of terminals 55D21 and 4C21 is a pair of first and second terminals in contact with each other. In FIG. 61, the terminal 55D21 is filled in with black to emphasize it.

A signal associated with the semiconductor chip 30 of the layer portion 10S1 of the main package 1C (the ready/busy signal R/B1 in the example shown in FIG. 19) appears on the terminal 4C21 with which the terminal 55D21 is in contact. Signals to be used in common by the layer portions 10S1 and 10S2 of the main package 1C appear on the terminals 4C11 and 4A1 to 4A4 with which the terminals 55C11 and 55A1 to 55A4 are in contact. In this way, all of a plurality of signals associated with the semiconductor chip 30 of the layer portion 10S1 of the main package 1C are associated with the additional semiconductor chip 80. Therefore, the additional semiconductor chip 80 can substitute for the defective semiconductor chip 30 of the layer portion 10S1 of the main package 1C.

Figure 62:
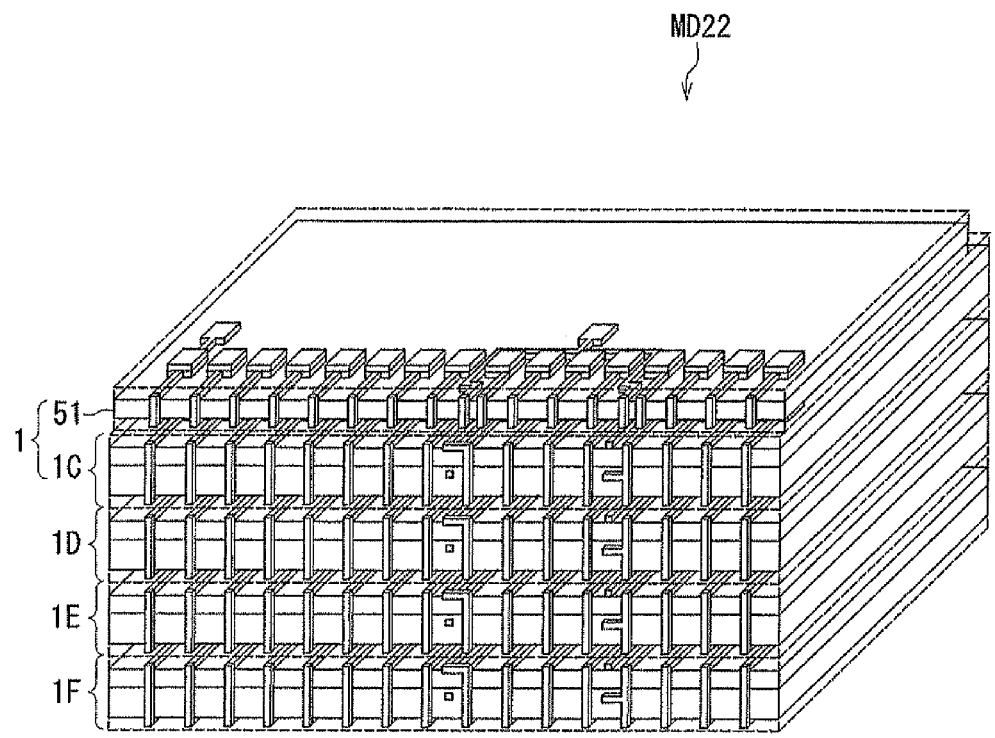
FIG. 62 is a perspective view showing a second example of the module including the composite layered chip package according to the third embodiment of the invention.
Figure 63:
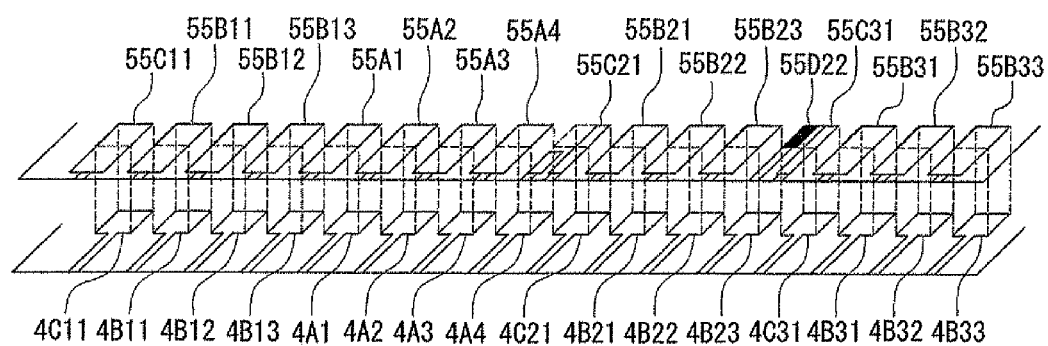
FIG. 63 is an explanatory diagram illustrating the connections between a plurality of terminals in FIG. 62.

FIG. 62 is a perspective view showing a second example of the module including the composite layered chip package 1 according to the present embodiment. FIG. 63 is an explanatory diagram illustrating the connections between a plurality of terminals in FIG. 62. The module MD22 of the second example includes the composite layered chip package 1 and the main packages 1D, 1E, and 1F. The composite layered chip package 1 includes the main package 1C and the additional package 51 that are positioned in the second relative positional relationship with each other. The main package 1C is placed on top of the main package 1D, and the additional package 51 is placed on top of the main package 1C. The positioning of the main packages 1C, 1D, 1E, and 1F and the electrical connections therebetween are the same as those in the module MD shown in FIG. 42.

The second relative positional relationship is selected when the layer portion 10S2 of the main package 1C is the second-type layer portion 10B and the additional semiconductor chip 80 is to substitute for the semiconductor chip 30 of this layer portion 10S2. In the second relative positional relationship, as shown in FIG. 62, the additional package 51 is placed right on the main package 1C.

In FIG. 63, a plurality of regions on the bottom surface 52b of the additional package main body 52 that are in contact with the terminals 4A1 to 4A4, 4B11 to 4B13, 4B21 to 4B23, 4B31 to 4B33, 4C11, 4C21, and 4C31 are shown by broken lines. As shown in FIG. 63, in the second relative positional relationship, the terminal 55D22 is in contact with the terminal 4C31, and the terminals 55A1 to 55A4, 55B11 to 55B13, 55B21 to 55B23, 55B31 to 55B33, 55C11, 55C21, and 55C31 are in contact with the terminals 4A1 to 4A4, 4B11 to 4B13, 4B21 to 4B23, 4B31 to 4B33, 4C11, 4C21, and 4C31, respectively. The terminal 55D21 is in contact with none of the plurality of terminals 4. Two terminals in contact with each other are joined to each other. The pair of terminals 55D22 and 4C31 is a pair of first and second terminals in contact with each other. In FIG. 63, the terminal 55D22 is filled in with black to emphasize it.

A signal associated with the semiconductor chip 30 of the layer portion 10S2 of the main package 1C (the ready/busy signal R/B2 in the example shown in FIG. 19) appears on the terminal 4C31 with which the terminal 55D22 is in contact. Signals to be used in common by the layer portions 10S1 and 10S2 of the main package 1C appear on the terminals 4C11 and 4A1 to 4A4 with which the terminals 55C11 and 55A1 to 55A4 are in contact. In this way, all of a plurality of signals associated with the semiconductor chip 30 of the layer portion 10S2 of the main package 1C are associated with the additional semiconductor chip 80. Therefore, the additional semiconductor chip 80 can substitute for the defective semiconductor chip 30 of the layer portion 10S2 of the main package 1C.

Although not illustrated, when the layer portion 10S1 of the main package 1D is the second-type layer portion 10B, the additional package 51 is placed on top of the main package 1D such that the main package 1D and the additional package 51 are in the first relative positional relationship with each other, and then the main package 1C is placed right on the additional package 51. Likewise, when the layer portion 10S2 of the main package 1D is the second-type layer portion 10B, the additional package 51 is placed on top of the main package 1D such that the main package 1D and the additional package 51 are in the second relative positional relationship with each other, and then the main package 1C is placed right on the additional package 51. A similar method is employed when the layer portion 10S1 or the layer portion 10S2 of one of the main packages 1E and 1F is the second-type layer portion 10B.

In the present embodiment, as with the modification examples in the second embodiment, the main package may be a modified main package in which the positions of the terminals 4 and 5 are vertically reversed from those in the main package 1M shown in FIG. 43 and FIG. 44, and the additional package may be a modified additional package in which the positions of the terminals 54 and 55 are vertically reversed from those in the additional package 51 shown in FIG. 56 and FIG. 57. In this case, a composite layered chip package can be constructed by placing the modified additional package below the modified main package and joining every two mutually contacting terminals to each other.

The remainder of configuration, function and effects of the present embodiment are similar to those of the second embodiment.

The present invention is not limited to the foregoing embodiments, and various modifications may be made thereto. For example, in the present invention, a plurality of types of additional packages may be prepared in which the layout of the plurality of bottom terminals 55 varies in accordance with the position of the second-type layer portion 10B in the specific main body 2S. In this case, one type of additional package is selected from the plurality of types of additional packages in accordance with which position in the specific main body 2S the semiconductor chip 30 of the second-type layer portion 10B to be substituted with the additional semiconductor chip 80 is located at, and the selected additional package is positioned in a predetermined relative positional relationship with the specific main body 2S. Further, in the present invention, the number of the layer portions 10 to be included in the main part 2M may be other than that illustrated in each of the foregoing embodiments.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A manufacturing method for a plurality of layered chip packages, each of the plurality of layered chip packages including a main package, at least one of the plurality of layered chip packages being a composite layered chip package, the composite layered chip package further including an additional package stacked on the main package, wherein:
the main package includes a main body and wiring;
the main body includes: a main part having a top surface and a bottom surface and including a plurality of layer portions stacked on each other; and a plurality of main terminals disposed on at least one of the top surface and the bottom surface of the main part;
the wiring is electrically connected to the plurality of main terminals;
each of the plurality of layer portions includes a semiconductor chip;
the plurality of layer portions of the main part include at least one first-type layer portion;
the main body of the main package in the composite layered chip package is a specific main body, and, in the specific main body, the plurality of layer portions of the main part further include at least one second-type layer portion;
the semiconductor chip of the first-type layer portion is non-malfunctioning and electrically connected to the wiring;
the semiconductor chip of the second-type layer portion is malfunctioning and not electrically connected to the wiring;
the additional package includes: an additional semiconductor chip to substitute for the semiconductor chip of the second-type layer portion; and a plurality of additional terminals; and
at least one of the plurality of additional terminals is electrically connected to the additional semiconductor chip and in contact with at least one of the plurality of main terminals,
the manufacturing method comprising the steps of:
fabricating a layered substructure by stacking a plurality of substructures each of which includes a plurality of preliminary layer portions that are arrayed, each of the plurality of preliminary layer portions being intended to become any one of the layer portions included in the main part, the plurality of substructures being intended to be cut later at positions of boundaries between every adjacent ones of the preliminary layer portions;
joining at least one additional package to the layered substructure; and
producing the plurality of layered chip packages from the layered substructure with the at least one additional package joined thereto, wherein:
the layered substructure includes a plurality of main bodies that are to be separated from each other later;
at least one of the plurality of main bodies included in the layered substructure is the specific main body;
in the step of joining the at least one additional package to the layered substructure, the at least one additional package is joined to the at least one specific main body included in the layered substructure; and
the step of producing the plurality of layered chip packages includes the step of separating the plurality of main bodies from each other by cutting the layered substructure with the at least one additional package joined thereto.

2. The manufacturing method according to claim 1, wherein the step of fabricating the layered substructure includes the step of identifying the position of the at least one specific main body included in the layered substructure.

3. The manufacturing method according to claim 2, wherein the step of fabricating the layered substructure includes, as a series of steps for fabricating each of the substructures, the steps of:
fabricating a pre-substructure wafer that is to become the substructure, the pre-substructure wafer including a plurality of pre-semiconductor-chip portions that are arrayed, the plurality of pre-semiconductor-chip portions being intended to become individual semiconductor chips; and
distinguishing the plurality of pre-semiconductor-chip portions included in the pre-substructure wafer into non-malfunctioning pre-semiconductor-chip portions and malfunctioning pre-semiconductor-chip portions, wherein
in the step of identifying, the position of the at least one specific main body is identified by using distinction results obtained in the step of distinguishing.

4. The manufacturing method according to claim 3, wherein:
each of the plurality of layer portions further includes a plurality of electrodes electrically connected to the wiring; and
the step of fabricating the layered substructure further includes, as the series of steps for fabricating each of the substructures, the step of forming the plurality of electrodes so that the plurality of electrodes are in contact with and electrically connected to the non-malfunctioning pre-semiconductor-chip portions and are not in contact with the malfunctioning pre-semiconductor-chip portions, by using the distinction results obtained in the step of distinguishing.

5. The manufacturing method according to claim 3, wherein, in the step of identifying, the position of the at least one second-type layer portion in the specific main body is identified by using the distinction results obtained in the step of distinguishing.

6. The manufacturing method according to claim 5, wherein:
the plurality of main terminals include a plurality of first terminals associated with semiconductor chips of different layer portions;
the additional package is positionable in any of a plurality of positional relationships with the specific main body;
the at least one of the plurality of additional terminals includes at least one second terminal electrically connected to the additional semiconductor chip;
the plurality of first terminals and the at least one second terminal are shaped and positioned such that at least one pair of first and second terminals in which the first and second terminals are in contact with each other is formed in each of the plurality of positional relationships;
a combination of the first and second terminals making up the at least one pair of first and second terminals is different among the plurality of positional relationships; and
the additional package is positioned in one of the plurality of positional relationships that is selected in accordance with which position in the specific main body the semiconductor chip of the second-type layer portion to be substituted with the additional semiconductor chip is located at.

7. The manufacturing method according to claim 1, wherein:
   the main body has a top surface, a bottom surface, and four side surfaces;
   the wiring includes a plurality of conductive paths disposed on at least one of the side surfaces of the main body; and
   the step of producing the plurality of layered chip packages includes the step of forming the wiring on each of the plurality of main bodies.

* * * * *